(12) United States Patent  
Arai et al.

(10) Patent No.: US 8,658,343 B2  
(45) Date of Patent: Feb. 25, 2014

(54) RESIST COMPOSITION, AND METHOD OF FORMING RESIST PATTERN

(75) Inventors: Masatoshi Arai, Kawasaki (JP); Junichi Tsuchiya, Kawasaki (JP); Daiju Shiono, Kawasaki (JP); Tomoyuki Hirano, Kawasaki (JP); Daichi Takaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 157 days.

(21) Appl. No.: 13/373,965

(22) Filed: Dec. 5, 2011

(65) Prior Publication Data  
US 2012/0148953 A1 Jun. 14, 2012

(30) Foreign Application Priority Data

Dec. 7, 2010 (JP) ............................... P2010-273004  
Oct. 4, 2011 (JP) ............................... P2011-220102

(51) Int. Cl.  
*G03F 7/004* (2006.01)  
*G03F 7/039* (2006.01)

(52) U.S. Cl.  
USPC ....................................... 430/270.1; 430/910

(58) Field of Classification Search  
USPC ................... 430/270.1, 326, 910, 921, 925  
See application file for complete search history.

(56) References Cited

U.S. PATENT DOCUMENTS

| 3,674,838 | A | * | 7/1972 | Nordstrom .................... 560/166 |
| 5,580,695 | A | | 12/1996 | Murata et al. |
| 5,945,517 | A | | 8/1999 | Nitta et al. |
| 5,968,712 | A | | 10/1999 | Thackeray et al. |
| 6,153,733 | A | | 11/2000 | Yukawa et al. |
| 7,074,543 | B2 | * | 7/2006 | Iwai et al. .................. 430/270.1 |
| 2004/0110085 | A1 | | 6/2004 | Iwai et al. |
| 2008/0187860 | A1 | | 8/2008 | Tsubaki et al. |

FOREIGN PATENT DOCUMENTS

| JP | A-05-232706 | 9/1993 |
| JP | A-05-249662 | 9/1993 |
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2003-241385 | 8/2003 |
| JP | A-2008-292975 | 12/2008 |
| KR | 2007-0015665 | * 2/2007 |
| WO | WO 2004/074242 A2 | 9/2004 |
| WO | WO 2012/035950 | * 3/2012 |

OTHER PUBLICATIONS

Machine translation of KR 2007-0015665, published on Feb. 6, 2007.*

* cited by examiner

*Primary Examiner* — Anca Eoff  
(74) *Attorney, Agent, or Firm* — Knobbe Martens Olson & Bear LLP

(57) ABSTRACT

A resist composition including a base component (A) which exhibits changed solubility in a developing solution under the action of acid, and an acid generator component (B) which generates acid upon exposure, wherein the base component (A) contains a polymeric compound (A1) having a structural unit (a5) represented by general formula (a5-1). In formula (a5-1), R represents a hydrogen atom, an alkyl group or a halogenated alkyl group, X represents single bond or divalent linking group, W represents a cyclic alkylene group which may include an oxygen atom at arbitrary position, each of $R^a$ and $R^b$ independently represents a hydrogen atom or an alkyl group which may include an oxygen atom at arbitrary position, or alternatively, $R^a$ and $R^b$ may be bonded to each other to form a ring together with the nitrogen atom in the formula, and p represents integer of 1 to 3.

[Chemical Formula 1]

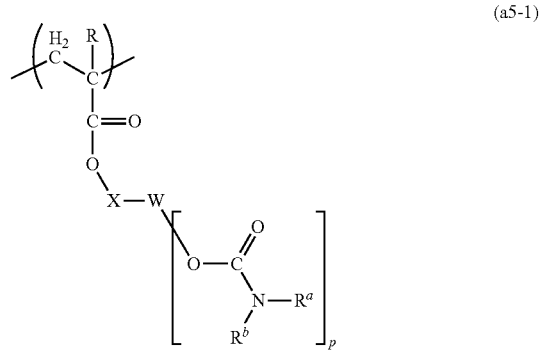

(a5-1)

6 Claims, No Drawings ced during formation of a resist pattern, then within the exposed portions, acid is generated from the acid generator component, and the action of this acid causes an increase in the solubility of the resin component in an alkali developing solution, making the exposed portions soluble in the alkali developing solution. The unexposed portions remain as a pattern, resulting in the formation of a positive-type pattern.

RESIST COMPOSITION, AND METHOD OF FORMING RESIST PATTERN

TECHNICAL FIELD

The present invention relates to a resist composition and a method of forming a resist pattern.

Priority is claimed on Japanese Patent Application No. 2010-273004, filed Dec. 7, 2010, and Japanese Patent Application No. 2011-220102, filed Oct. 4, 2011, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization. Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as electron beam (EB), extreme ultraviolet radiation (EUV), and X-ray.

As the wavelength of exposure light sources is shortened, the resist materials for use with these types of exposure light sources require lithography properties such as a high resolution capable of reproducing patterns of minute dimensions, and a high level of sensitivity to these types of exposure light sources. A known type of resist material that satisfies these conditions is a chemically amplified resist composition.

For example, in the case where the developing solution is an alkali developing solution (namely, an alkali developing process), a chemically amplified resist composition containing a resin component (base resin) which exhibits increased solubility in an alkali developing solution under the action of acid, and an acid generator is typically used. If the resist film formed using the chemically amplified resist composition is selectively exposed during formation of a resist pattern, then within the exposed portions, acid is generated from the acid generator component, and the action of this acid causes an increase in the solubility of the resin component in an alkali developing solution, making the exposed portions soluble in the alkali developing solution. The unexposed portions remain as a pattern, resulting in the formation of a positive-type pattern.

The aforementioned base resin uses a resin for which the polarity increases under the action of acid, resulting in an increase in the solubility of the resin in an alkali developing solution, but a decrease in the solubility of the resin within organic solvents. Accordingly, if a process that uses a developing solution containing an organic solvent (an organic developing solution) is employed (hereinafter also referred to as a solvent developing process or negative-type developing process) instead of the alkali developing process, then within the exposed portions of the resist film, the solubility in the organic developing solution decreases relatively, meaning the unexposed portions are dissolved in the organic developing solution and removed, whereas the exposed portions remain as a pattern, resulting in the formation of a negative-type pattern. Patent Document 1 proposes a negative-type developing process.

Currently, resins that contain structural units derived from (meth)acrylate esters within the main chain (acrylic resins) are now widely used as base resins for chemically amplified resist compositions that use ArF excimer laser lithography or the like, as they exhibit excellent transparency in the vicinity of 193 nm (for example, see Patent Document 2).

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, besides the base resin and the acid generator, conventional chemically amplified resists also frequently include a nitrogen-containing organic compound such as an alkylamine or alkyl alcohol amine (for example, see Patent Documents 3 and 4). These nitrogen-containing organic compounds act as quenchers that trap the acid generated by the acid generator, thereby contributing to an improvement in the lithography properties such as the resist pattern shape.

PRIOR ART DOCUMENTS

Patent Documents

[Patent Document 1]
Japanese Unexamined Patent Application, First Publication No. 2008-292975
[Patent Document 2]
Japanese Unexamined Patent Application, First Publication No. 2003-241385
[Patent Document 3]
Japanese Unexamined Patent Application, First Publication No. Hei 5-249662
[Patent Document 4]
Japanese Unexamined Patent Application, First Publication No. Hei 5-232706

DISCLOSURE OF INVENTION

Problems to be Solved by the Invention

As further progress is expected to be made in lithography techniques and the application field for lithography techniques is expected to expand, the development of novel materials for use in lithography applications is desirable. For example, as the miniaturization of resist patterns progresses, improvements will be demanded for resist materials with respect to not only resolution, but also various other lithography properties such as exposure latitude (EL) and line width roughness (LWR). Roughness refers to surface unevenness of the resist pattern, which tends to cause shape defects in the resist pattern. For example, line width roughness (LWR) causes shape defects typified by non-uniform line width in a line and space pattern. These types of shape defects tend to have an adverse effect on the formation of very fine semiconductor elements, and improvement of such shape defects becomes more critical as the pattern becomes finer.

The present invention takes the above circumstances into consideration, with an object of providing a resist composition and a method of forming a resist pattern which exhibit excellent lithography properties and enable formation of a resist pattern having excellent shape.

Means to Solve the Problems

In order to achieve the above object, the present invention adopts the aspects described below.

Namely, a first aspect of the present invention is a resist composition including a base component (A) which exhibits changed solubility in a developing solution under the action of acid, and an acid generator component (B) which generates acid upon exposure, wherein the base component (A) contains a polymeric compound (A1) having a structural unit (a5) represented by general formula (a5-1) shown below.

[Chemical Formula 1]

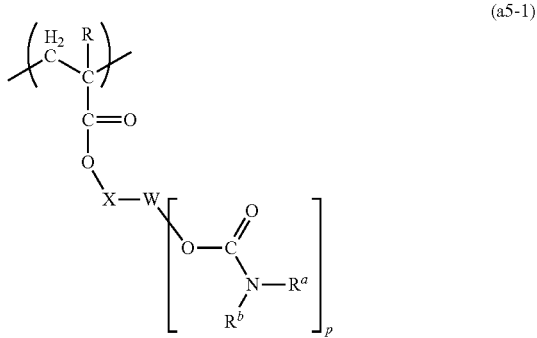

(a5-1)

In the formula, R represents a hydrogen atom, an alkyl group of 1 to 5 carbon atoms or a halogenated alkyl group of 1 to 5 carbon atoms, X represents a single bond or a divalent linking group, W represents a cyclic alkylene group which may include an oxygen atom at an arbitrary position, each of $R^a$ and $R^b$ independently represents a hydrogen atom or an alkyl group which may include an oxygen atom at an arbitrary position, or alternatively, $R^a$ and $R^b$ may be bonded to each other to form a ring together with the nitrogen atom in the formula, and p represents an integer of 1 to 3.

A second aspect of the present invention is a method of forming a resist pattern, the method including: using a resist composition of the first aspect to form a resist film on a substrate, conducting exposure of the resist film, and developing the resist film to form a resist pattern.

In the present description and claims, unless specified otherwise, the term "alkyl group" includes linear, branched and cyclic monovalent saturated hydrocarbon groups.

The term "alkylene group" includes linear, branched and cyclic divalent saturated hydrocarbon groups, unless specified otherwise.

A "fluorinated alkyl group" or a "fluorinated alkylene group" is a group in which some or all of the hydrogen atoms of an alkyl group or an alkylene group have each been substituted with a fluorine atom.

A "lower alkyl group" is an alkyl group of 1 to 5 carbon atoms.

A "halogenated alkyl group" is a group in which some or all of the hydrogen atoms of an alkyl group have each been substituted with a halogen atom. Examples of the halogen atom include a fluorine atom, chlorine atom, bromine atom or iodine atom.

A "hydroxyalkyl group" is a group in which some or all of the hydrogen atoms of an alkyl group have each been substituted with a hydroxyl group.

The term "aliphatic" is a relative concept used in relation to the term "aromatic", and defines a group or compound or the like that has no aromaticity.

The term "structural unit" refers to a monomer unit that contributes to the formation of a polymeric compound (a polymer or copolymer).

The term "exposure" is used as a general concept that includes irradiation with any form of radiation.

Effect of the Invention

The present invention is able to provide a resist composition and a method of forming a resist pattern that are capable of forming a pattern having excellent lithography properties and a superior shape.

MODE FOR CARRYING OUT THE INVENTION

<<Resist Composition>>

The resist composition of the present invention includes a base component (A) (hereinafter referred to as "component (A)") which exhibits changed solubility in a developing solution under the action of acid, and an acid generator component (B) (hereinafter referred to as "component (B)") which generates acid upon exposure.

When the resist film that is formed using the resist composition is subjected to selective exposure, acid is generated from the component (B) in the exposed portions, and the solubility of the component (A) in a developing solution changes under the action of the generated acid, whereas in the unexposed portions, the solubility of the component (A) in the developing solution does not change, meaning a difference in solubility in the developing solution develops between the exposed portions and the unexposed portions. As a result, subsequent developing of the resist film can be used to form a resist pattern, by dissolving and removing either the exposed portions in the case of a positive-type resist pattern, or the unexposed portions in the case of a negative-type resist pattern.

In this description, a resist composition used in forming a positive-type resist pattern is referred to as a "positive-type resist composition", whereas a resist composition used in forming a negative-type resist pattern is referred to as a "negative-type resist composition".

The resist composition of the present invention may be used for either an alkali developing process in which an alkali developing solution is used for the developing treatment during formation of the resist pattern, or a solvent developing process (hereinafter also referred to as a "negative-type developing process") in which a developing solution containing an organic solvent (an organic developing solution) is used for the developing treatment.

<Component (A)>

The component (A) is a base component which exhibits changed solubility in a developing solution under the action of acid.

In the present description and claims, the term "base component" refers to an organic compound capable of forming a film, and is preferably an organic compound having a molecular weight of 500 or more. Ensuring that the organic compound has a molecular weight of 500 or more ensures a satisfactory film-forming ability, and facilitates the formation of nano level resist patterns.

The "organic compounds having a molecular weight of 500 or more" may be broadly classified into non-polymers and polymers.

In general, compounds which have a molecular weight of at least 500 but less than 4,000 may be used as non-polymers. Hereinafter, the term "low molecular weight compound" is used to describe a non-polymer having a molecular weight of at least 500 but less than 4,000.

In terms of the polymers, compounds which have a molecular weight of 1,000 or more may be used. In the present description and claims, the terms "polymeric compound" and "resin" are used to describe a polymer having a molecular weight of 1,000 or more.

In the case of a polymeric compound, the "molecular weight" refers to the weight-average molecular weight in terms of the polystyrene-equivalent value determined by gel permeation chromatography (GPC).

In the present invention, the component (A) contains a polymeric compound (A1) (hereinafter referred to as "component (A1)") having a structural unit (a5) represented by general formula (a5-1) shown above.

In those cases where the resist composition of the present invention is a "negative-type resist composition for an alkali developing process" which forms a negative-type pattern in an alkali developing process, a base component that is soluble in the alkali developing solution is used as the component (A), and a cross-linking agent is also added to the composition.

In this negative-type resist composition for an alkali developing process, when acid is generated from the component (B) upon exposure, the action of the acid causes cross-linking between the base component and the cross-linking agent, and the cross-linked portions become insoluble in an alkali developing solution. Accordingly, during resist pattern formation, by conducting selective exposure of a resist film formed by applying the negative-type resist composition to a substrate, the exposed portions change to a state that is insoluble in an alkali developing solution, while the unexposed portions remain soluble in an alkali developing solution, meaning alkali developing can be used to form a resist pattern.

Generally, a resin that is soluble in an alkali developing solution (hereinafter, referred to as an "alkali-soluble resin") is used as the component (A1) of the component (A) within the negative-type resist composition for an alkali developing process.

As the cross-linking agent, at least one compound selected from the group consisting of melamine-based cross-linking agents, urea-based cross-linking agents, alkylene urea-based cross-linking agents, glycoluril-based cross-linking agents and epoxy-based cross-linking agents is preferred. For example, usually, a glycoluril-based cross-linking agent having a methylol group or alkoxymethyl group, or a melamine-based cross-linking agent is preferable, as it enables formation of a resist pattern with minimal swelling. The amount added of the cross-linking agent is preferably within a range from 1 to 50 parts by weight, relative to 100 parts by weight of the alkali-soluble resin.

In those cases where the resist composition of the present invention is a resist composition which forms a positive-type pattern in an alkali developing process, but forms a negative-type pattern in a solvent developing process, a base component (A1) which exhibits increased polarity under the action of acid is preferably used as the component (A). By using a base component which exhibits increased polarity under the action of acid, the polarity of the base component changes upon exposure, and therefore favorable developing contrast can be achieved, not only in an alkali developing process, but also in a solvent developing process.

In those cases where an alkali developing process is used, the component (A1) is substantially insoluble in an alkali developing solution prior to exposure, but when acid is generated from the component (B) upon exposure, the action of the acid causes an increase in the polarity of the component (A1) that increases the solubility in the alkali developing solution. Accordingly, during resist pattern formation, by conducting selective exposure of a resist film formed by applying the resist composition to a substrate, the exposed portions change from being substantially insoluble in the alkali developing solution to being soluble, while the unexposed portions remain substantially insoluble in the alkali developing solution, meaning alkali developing can be used to form a positive-type resist pattern.

Further, in those cases where a solvent developing process is used, the component (A1) exhibits good solubility in an organic developing solution prior to exposure, but when acid is generated from the component (B) upon exposure, the action of the acid causes an increase in the polarity of the component (A1) that reduces the solubility in the organic developing solution. Accordingly, during resist pattern formation, by conducting selective exposure of a resist film formed by applying the resist composition to a substrate, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, enabling formation of a negative-type pattern.

In the present invention, the component (A1) preferably includes, in addition to the structural unit (a5), a structural unit (a1), which is derived from an acrylate ester in which the hydrogen atom bonded to the carbon atom on the α-position may be substituted with a substituent, and contains an acid-degradable group that exhibits increased polarity under the action of acid. In other words, the resist composition of the present invention is preferably a chemically amplified resist composition that functions as a positive-type resist composition in an alkali developing process, and functions as a negative-type resist composition in a solvent developing process.

Further, the component (A1) preferably also includes, in addition to the structural unit (a5) and the structural unit (a1), at least one structural unit selected from the group consisting of a structural unit (a0), which is derived from an acrylate ester in which the hydrogen atom bonded to the carbon atom on the α-position may be substituted with a substituent, and contains an $—SO_2—$-containing cyclic group, and a structural unit (a2), which is derived from an acrylate ester in which the hydrogen atom bonded to the carbon atom on the α-position may be substituted with a substituent, and contains a lactone-containing cyclic group.

In the present description and claims, a "structural unit derived from an acrylate ester" refers to a structural unit that is formed by the cleavage of the ethylenic double bond of an acrylate ester.

The term "acrylate ester" describes a compound in which the hydrogen atom at the carboxyl group terminal of acrylic acid ($CH_2$=CH—COOH) has been substituted with an organic group.

In the acrylate ester, the hydrogen atom bonded to the carbon atom on the α-position may be substituted with a substituent. Examples of the substituent that may be used to substitute the hydrogen atom bonded to the carbon atom on the α-position include atoms other than a hydrogen atom and groups, and specific examples include alkyl groups of 1 to 5 carbon atoms, halogenated alkyl groups of 1 to 5 carbon atoms and hydroxyalkyl groups of 1 to 5 carbon atoms. The "carbon atom on the α-position of an acrylate ester" refers to the carbon atom bonded to the carbonyl group, unless specified otherwise.

In the following description, an acrylate ester in which the hydrogen atom bonded to the carbon atom on the α-position is substituted with a substituent may also be termed an "α-substituted acrylate ester". Further, the generic term "(α-substituted) acrylate ester" may be used to describe either or both of the acrylate ester and the α-substituted acrylate ester.

In an α-substituted acrylate ester, an alkyl group for the α-position substituent is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Further, specific examples of the halogenated alkyl group for the α-position substituent include groups in which some or all of the hydrogen atoms of an above-mentioned "alkyl group for the α-position substituent" have each been substituted with a halogen atom. Examples of the halogen atom include a fluorine atom, chlorine atom, bromine atom or iodine atom, and a fluorine atom is particularly desirable.

A hydrogen atom, an alkyl group of 1 to 5 carbon atoms or a halogenated alkyl group of 1 to 5 carbon atoms is preferably bonded to the carbon atom on the α-position of an α-substituted acrylate ester, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

[Structural Unit (a5)]

The structural unit (a5) is a structural unit represented by general formula (a5-1) shown below.

[Chemical Formula 2]

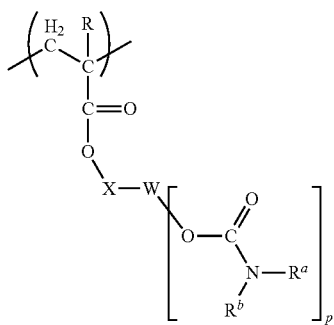

(a5-1)

In the formula, R represents a hydrogen atom, an alkyl group of 1 to 5 carbon atoms or a halogenated alkyl group of 1 to 5 carbon atoms, X represents a single bond or a divalent linking group, W represents a cyclic alkylene group which may include an oxygen atom at an arbitrary position, each of $R^a$ and $R^b$ independently represents a hydrogen atom or an alkyl group which may include an oxygen atom at an arbitrary position, or alternatively, $R^a$ and $R^b$ may be bonded to each other to form a ring together with the nitrogen atom in the formula, and p represents an integer of 1 to 3.

In formula (a5-1), R represents a hydrogen atom, an alkyl group of 1 to 5 carbon atoms or a halogenated alkyl group of 1 to 5 carbon atoms.

The alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which some or all of the hydrogen atoms of an alkyl group of 1 to 5 carbon atoms have each been substituted with a halogen atom. Specific examples of the alkyl group include the same groups as those listed above for the alkyl group for R. Examples of the halogen atom that substitutes the hydrogen atom of the alkyl group include a fluorine atom, chlorine atom, bromine atom or iodine atom, and of these, a fluorine atom is particularly preferred.

R is preferably a hydrogen atom, an alkyl group of 1 to 5 carbon atoms, or a fluorinated alkyl group of 1 to 5 carbon atoms, and in terms of industrial availability, is most preferably a hydrogen atom or a methyl group.

In formula (a5-1), X represents a single bond or a divalent linking group.

There are no particular limitations on the divalent linking group for X, although preferred examples include a divalent hydrocarbon group which may have a substituent, and divalent linking groups containing a hetero atom.

The expression that the hydrocarbon group "may have a substituent" means that some or all of the hydrogen atoms within the hydrocarbon group may each be substituted with a substituent (an atom other than a hydrogen atom or a group).

The hydrocarbon group may be an aliphatic hydrocarbon group or an aromatic hydrocarbon group.

An "aliphatic hydrocarbon group" refers to a hydrocarbon group that has no aromaticity.

The aliphatic hydrocarbon group for the divalent hydrocarbon group for X may be either saturated or unsaturated, but in most cases, is preferably saturated.

More specific examples of the aliphatic hydrocarbon group include linear or branched aliphatic hydrocarbon groups and aliphatic hydrocarbon groups that include a ring within the structure.

The linear or branched aliphatic hydrocarbon group preferably contains 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those described above.

The alicyclic hydrocarbon group preferably contains 3 to 20 carbon atoms, and more preferably 3 to 12 carbon atoms.

The alicyclic hydrocarbon group may be either a polycyclic group or a monocyclic group. As the monocyclic alicyclic group, a group in which two hydrogen atoms have been removed from a monocycloalkane is preferred. The monocycloalkane preferably contains 3 to 6 carbon atoms, and specific examples include cyclopentane and cyclohexane. As the polycyclic alicyclic hydrocarbon group, a group in which two hydrogen atoms have been removed from a polycycloalkane is preferred. The polycycloalkane preferably contains 7 to 12 carbon atoms, and specific examples include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group that contains an aromatic ring.

The aromatic hydrocarbon group for the divalent hydrocarbon group of X preferably contains 3 to 30 carbon atoms, more preferably 5 to 30 carbon atoms, still more preferably 5 to 20 carbon atoms, still more preferably 6 to 15 carbon atoms, and most preferably 6 to 10 carbon atoms. This number of carbon atoms does not include any carbon atoms within any substituents.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which some of the carbon atoms that constitute one of the above aromatic hydrocarbon rings have been substituted with a hetero atom. Examples of the hetero atom in the aromatic heterocyclic rings include an oxygen atom, a sulfur atom or a nitrogen atom.

Specific examples of the aromatic hydrocarbon group include groups in which two hydrogen atoms have been removed from an above-mentioned aromatic hydrocarbon ring (namely, arylene groups), and groups in which one hydrogen atom from a group having one hydrogen atom removed from an above-mentioned aromatic hydrocarbon ring (namely, an aryl group) is substituted with an alkylene group (for example, groups in which one hydrogen atom is removed from the aryl group of an arylalkyl group such as a benzyl group, phenethyl group, 1-naphthylmethyl group, 2-naphthylmethyl group, 1-naphthylethyl group or 2-naphthylethyl group). The alkylene group (namely, the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an above-mentioned aromatic hydrocarbon group may be substituted with a substituent. Examples of the substituent include an alkyl group, alkoxy group, halogen atom, halogenated alkyl group, hydroxyl group, or oxygen atom (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent of the aromatic hydrocarbon group include a fluorine atom, chlorine atom, bromine atom or iodine atom, and a fluorine atom is preferred.

Examples of the halogenated alkyl group for the substituent include groups in which some or all of the hydrogen atoms of an above-mentioned alkyl group have each been substituted with a halogen atom.

Examples of the hetero atom in the "divalent linking group containing a hetero atom" include atoms other than a carbon atom or hydrogen atom, and specific examples include an oxygen atom, nitrogen atom, sulfur atom or halogen atom.

Specific examples of the divalent linking group containing a hetero atom include non-hydrocarbon linking groups such as —O—, —C(=O)—, —C(=O)—O—, a carbonate linkage (—O—C(=O)—O—), —S—, —S(=O)$_2$—, —S(=O)$_2$—O—, —NH—, —NR$^{04}$— (wherein R$^{04}$ represents a substituent such as an alkyl group or an acyl group), —NH—C(=O)— and =N—, and combinations of at least one of these non-hydrocarbon linking groups with a divalent hydrocarbon group. Examples of the divalent hydrocarbon group include the same groups as those described above for the divalent hydrocarbon group which may have a substituent, although a linear or branched aliphatic hydrocarbon group is preferable.

The divalent linking group for X may or may not include an acid-degradable region within the structure of the group. An "acid-degradable region" describes a region which includes a bond that can be cleaved under the action of acid generated from the component (B) upon exposure. An example of the acid-degradable region is a region that includes a carbonyloxy group and a tertiary carbon atom that is bonded to the oxygen atom (—O—) at the terminal of the carbonyloxy group. When an acid acts upon this type of acid-degradable region, the bond between the oxygen atom and the tertiary carbon atom is cleaved.

Among the above possibilities, X is preferably an alkylene group, an ester linkage [—C(=O)—O—], an ether linkage (—O—), a combination thereof, or a single bond.

The alkylene group is preferably a linear or branched alkylene group, is more preferably a linear alkylene group of 1 to 5 carbon atoms, and is most preferably a methylene group or an ethylene group.

Examples of preferred forms of the above-mentioned combination include groups represented by —X$^{11}$—C(=O)—O—X$^{12}$— and —X$^{11}$—O—X$^{12}$—. In these formulas, X$^{11}$ represents an alkylene group, and X$^{12}$ represents a single bond or an alkylene group. The alkylene group for X$^{11}$ or X$^{12}$ is preferably a linear or branched alkylene group, more preferably a linear alkylene group of 1 to 5 carbon atoms, and most preferably a methylene group or an ethylene group.

In formula (a5-1), W represents a cyclic alkylene group which may include an oxygen atom at an arbitrary position.

The cyclic alkylene group preferably contains 3 to 20 carbon atoms, and more preferably 5 to 12 carbon atoms.

Cyclic alkylene groups exhibit a variety of excellent lithography properties, and both monocyclic groups and polycyclic groups are desirable. In terms of offering improved lithography properties as a result of having a higher Tg value, and superior etching resistance, a polycyclic group is preferred, and a bicyclic to tetracyclic group is particularly desirable.

Specific examples of the cyclic alkylene group include a cyclopropanediyl group, cyclobuta-1,2-diyl group, cyclobuta-1,3-diyl group, cyclopenta-1,2-diyl group, cyclopenta-1,3-diyl group, cyclohexa-1,2-diyl group, cyclohexa-1,3-diyl group, cyclohexa-1,4-diyl group, bicyclo[2.2.1]hepta-2,3-diyl group, bicyclo[2.2.1]hepta-2,5-diyl group, 7-oxabicyclo[2.2.1]hepta-2,5-diyl group, bicyclo[2.2.1]hepta-2,6-diyl group, 7-oxabicyclo[2.2.1]hepta-2,6-diyl group, adamanta-1,3-diyl group, and adamanta-1,2-diyl group.

In formula (a5-1), each of $R^a$ and $R^b$ independently represents a hydrogen atom or an alkyl group which may include an oxygen atom or another hetero atom at an arbitrary position.

The alkyl group for $R^a$ and $R^b$ may be a linear, branched or cyclic group.

The linear or branched alkyl group is preferably an alkyl group of 1 to 5 carbon atoms, and specific examples include a methyl group, ethyl group, n-propyl group, i-propyl group, n-butyl group, i-butyl group, t-butyl group, 2-methyl-2-butyl group, 3-methyl-2-butyl group, 1-pentyl group, 2-pentyl group and 3-pentyl group.

The cyclic alkyl group preferably contains 3 to 20 carbon atoms, and specific examples include a cyclopropyl group, cyclobutyl group, cyclopentyl group, 1-methyl-1-cyclopentyl group, 1-ethyl-1-cyclopentyl group, cyclohexyl group, 1-methyl-1-cyclohexyl group, 1-ethyl-1-cyclohexyl group, 1-methyl-1-cycloheptyl group, 1-ethyl-1-cycloheptyl group, 1-methyl-1-cyclooctyl group, 1-ethyl-1-cyclooctyl group, bicyclo[2.2.1]heptan-2-yl group, 1-adamantyl group, 2-adamantyl group, 2-methyl-2-adamantyl group and 2-ethyl-2-adamantyl group.

The alkyl groups for $R^a$ and $R^b$ may each include an oxygen atom at an arbitrary position. The expression that the alkyl group may "include an oxygen atom" means that an oxygen atom (—O—) is introduced into the carbon chain of the alkyl group.

The alkyl groups for $R^a$ and $R^b$ may have a substituent (an atom other than a hydrogen atom or a group) that substitutes a hydrogen atom of the alkyl group. Examples of this substituent include a fluorine atom, a fluorinated alkyl group of 1 to 5 carbon atoms, and an oxygen atom (=O). Further, when the alkyl group is a linear or branched group, the alkyl group may contain a cyclic alkyl group as a substituent. Further, when the alkyl group is a cyclic group, the alkyl group may contain a linear or branched alkyl group as a substituent.

In formula (a5-1), $R^a$ and $R^b$ may be bonded to each other to form a ring together with the nitrogen atom in the formula.

The ring may be either monocyclic or polycyclic, but is preferably monocyclic.

Including the nitrogen atom, the thus formed ring is preferably a 3- to 10-membered ring, and is more preferably a 5- to 7-membered ring.

Specific examples of the formed ring include rings in which a —CH$_2$— moiety that constitutes part of the ring structure of a saturated hydrocarbon ring is substituted with an —NH— moiety, and the hydrogen atom is then removed from the —NH— moiety. The saturated hydrocarbon ring preferably contains 3 to 20 carbon atoms, and more preferably 3 to 12 carbon atoms. Specific examples of the saturated hydrocarbon ring include monocycloalkanes such as cyclopropane, cyclobutane, cyclopentane and cyclohexane, and polycycloalkanes such as adamantane, norbornane, isobornane, tricyclodecane and tetracyclododecane.

The ring may also include another hetero atom as part of the ring structure, in addition to the nitrogen atom to which $R^a$ and $R^b$ are bonded. Examples of this other hetero atom include a sulfur atom, an oxygen atom or a nitrogen atom.

In the present invention, it is preferable that at least one of $R^a$ and $R^b$ is a hydrogen atom, more preferable that either $R^a$ and $R^b$ are both hydrogen atoms, or one of $R^a$ and $R^b$ is a hydrogen atom and the other is an alkyl group which may include an oxygen atom at an arbitrary position, and most preferable that $R^a$ and $R^b$ are both hydrogen atoms.

In formula (a5-1), p represents an integer of 1 to 3, is preferably either 1 or 2, and is most preferably 1.

Specific examples of preferred forms of the structural unit (a5) include the structural units represented by formulas (a5-1-1) to (a5-1-51) shown below.

In each of the following formulas, $R^\alpha$ represents a hydrogen atom, a methyl group or a trifluoromethyl group.

[Chemical Formula 3]

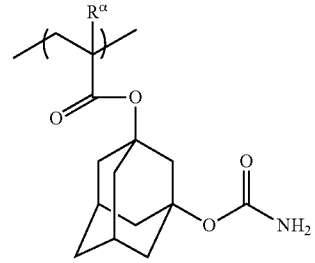

(a5-1-1)

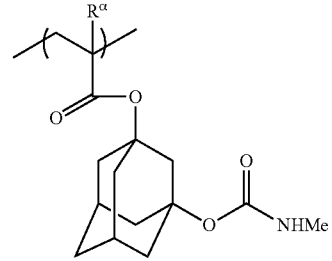

(a5-1-2)

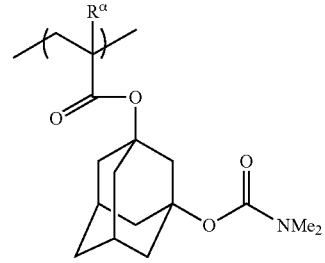

(a5-1-3)

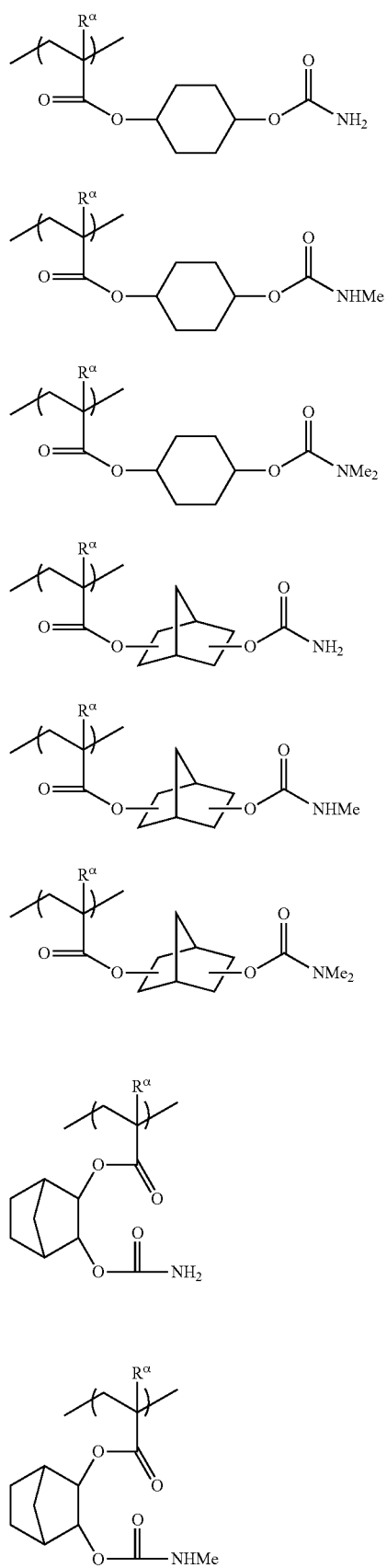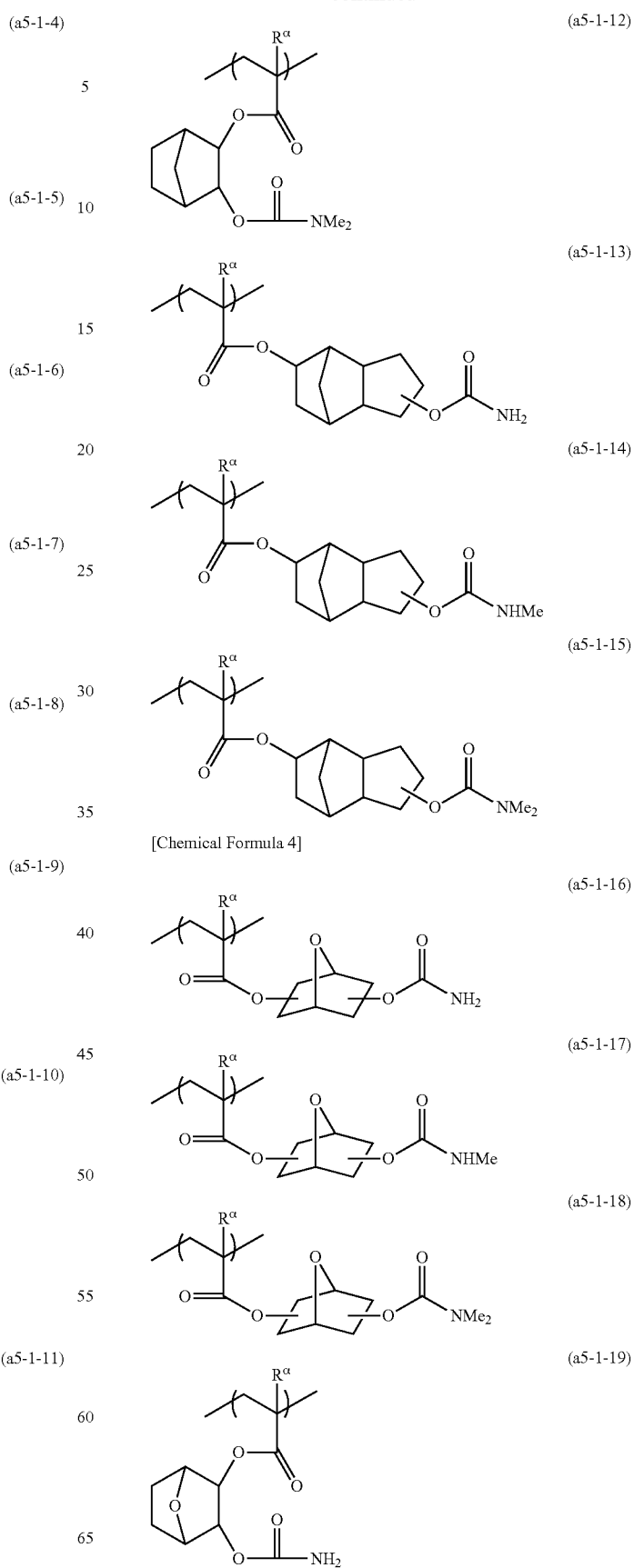
[Chemical Formula 4]

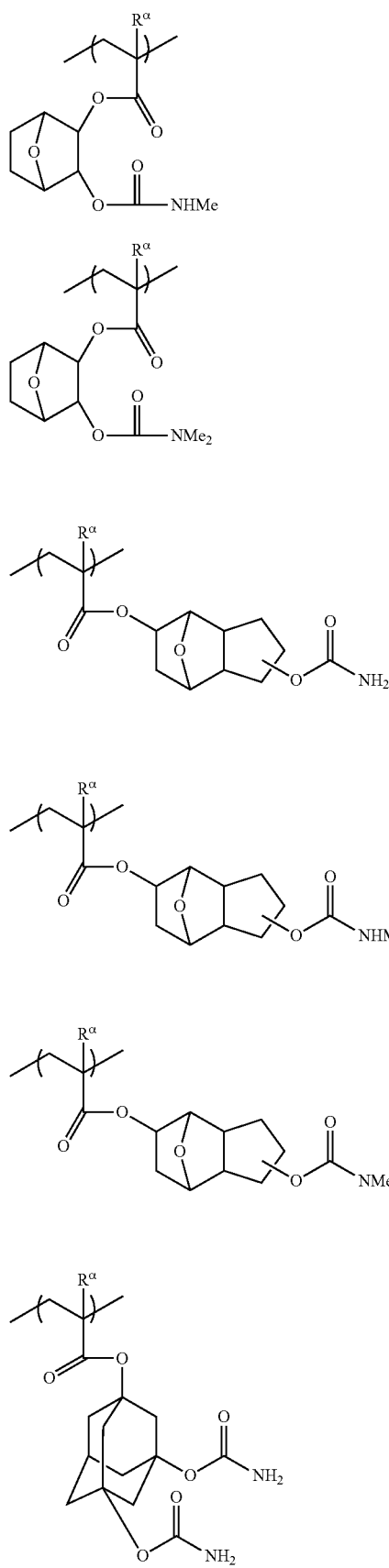
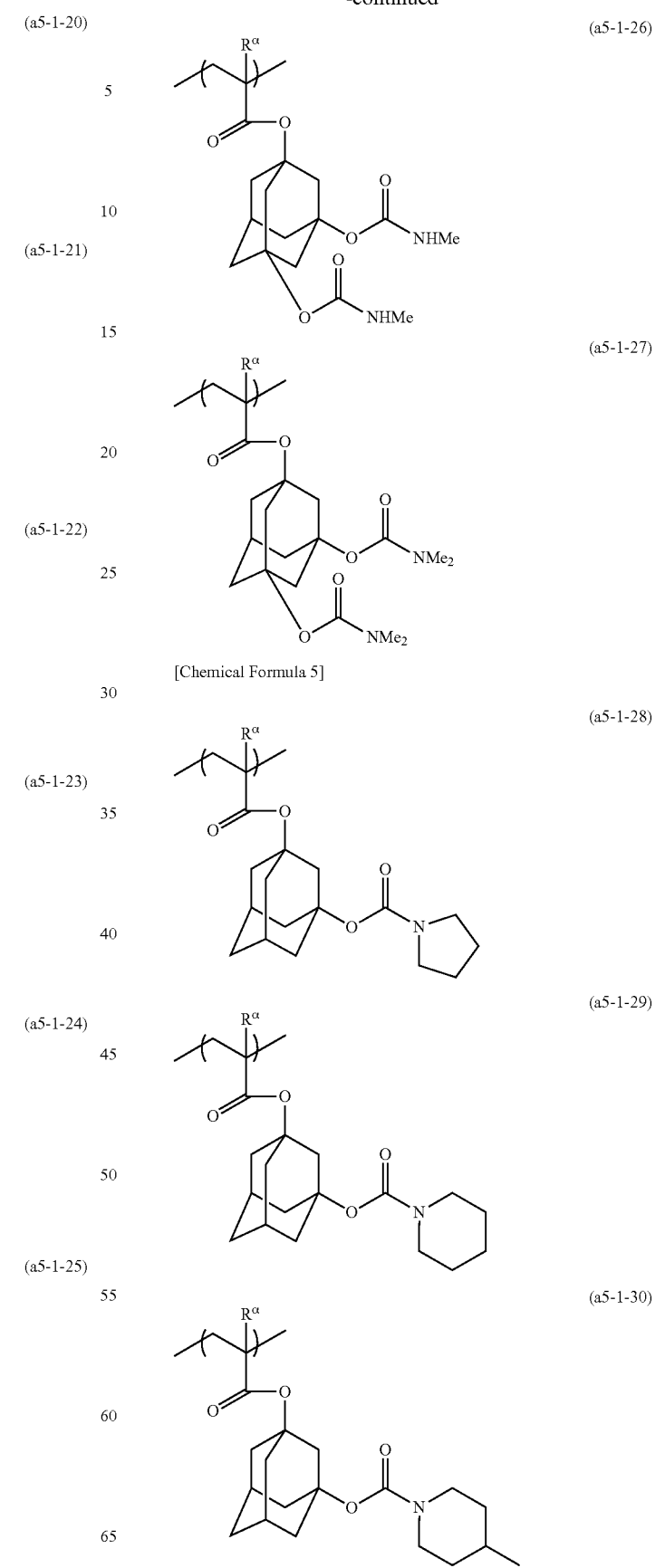
[Chemical Formula 5]

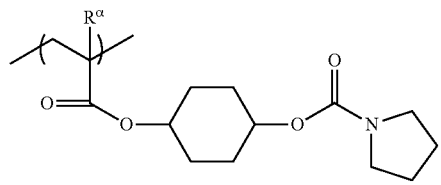
(a5-1-31)
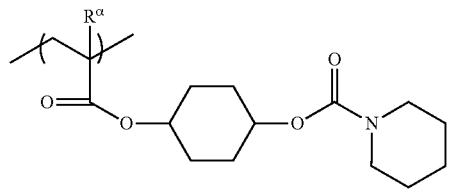
(a5-1-32)
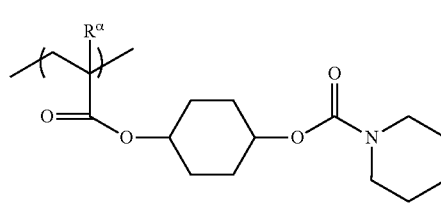
(a5-1-33)
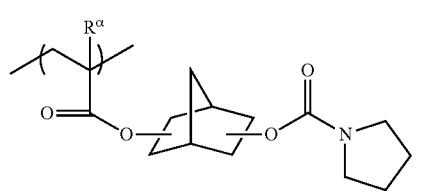
(a5-1-34)
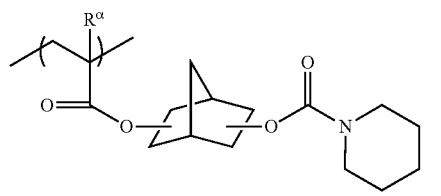
(a5-1-35)
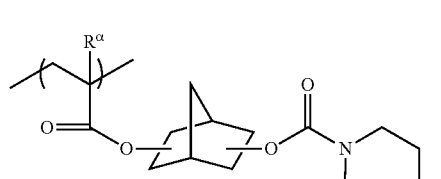
(a5-1-36)
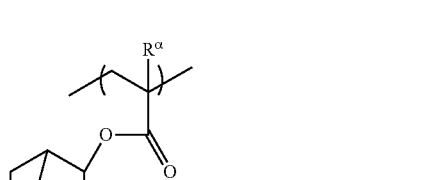
(a5-1-37)
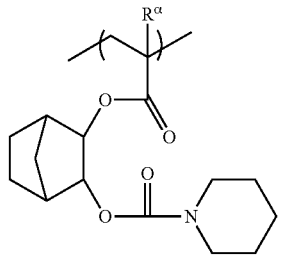
(a5-1-38)
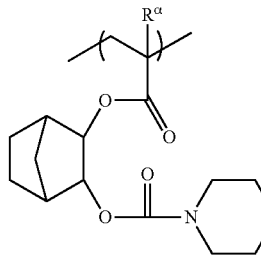
(a5-1-39)
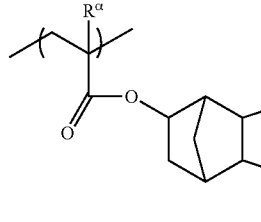
(a5-1-40)
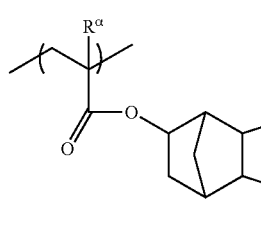
(a5-1-41)
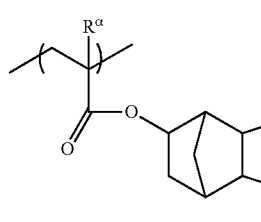
(a5-1-42)
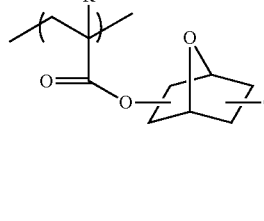
(a5-1-43)

-continued

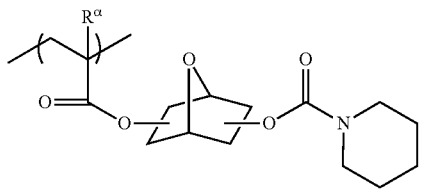
(a5-1-44)

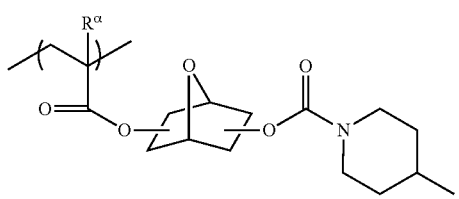
(a5-1-45)

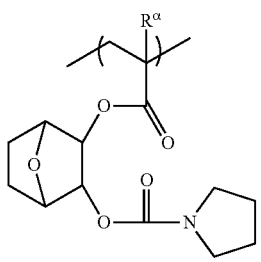
(a5-1-46)

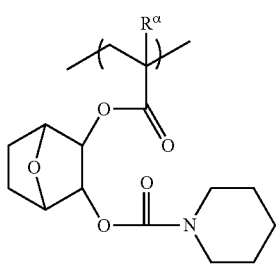
(a5-1-47)

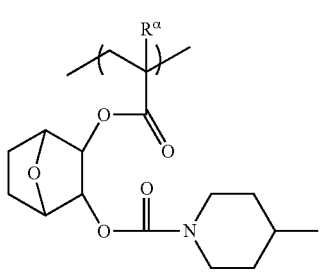
(a5-1-48)

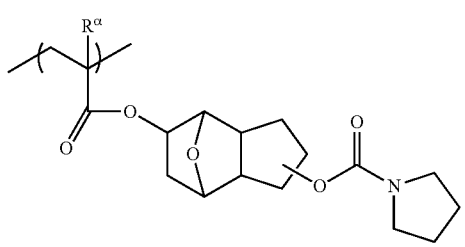
(a5-1-49)

-continued

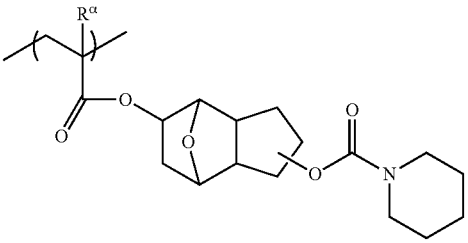
(a5-1-50)

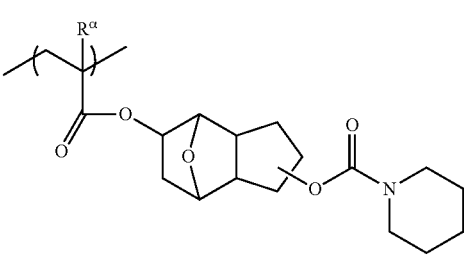
(a5-1-51)

The structural unit (a5) within the component (A1) may be a single type of structural unit, or may be two or more types of structural units.

The amount of the structural unit (a5) within the component (A1), based on the combined total of all the structural units that constitute the component (A1), is preferably within a range from 1 to 50 mol %, more preferably from 3 to 30 mol %, and most preferably from 5 to 25 mol %.

By ensuring that the amount of the structural unit (a5) is at least as large as the lower limit of the above range, the diffusion control effect on the acid generated upon exposure can be obtained more readily when the component (A1) is used within a resist composition, resulting in superior improvement in the lithography properties such as EL and LWR. On the other hand, by ensuring that the amount is not more than the upper limit of the above range, a good balance can be achieved with the other structural units, and the compatibility between the component (A1) and an organic solvent (also referred to as the "component (S)") tends to improve.

[Structural Unit (a1)]

The structural unit (a1) is a structural unit which is derived from an acrylate ester in which the hydrogen atom bonded to the carbon atom on the α-position may be substituted with a substituent, and contains an acid-degradable group that exhibits increased polarity under the action of acid.

The term "acid-degradable group" describes a group having acid degradability which, under the action of the acid generated from the component (B) upon exposure, undergoes cleavage of at least some of the bonds within the structure of the acid-degradable group.

Examples of the acid-degradable group that exhibits increased polarity under the action of acid include groups which dissociate under the action of acid to form a polar group.

Examples of this polar group include a carboxyl group, hydroxyl group, amino group and sulfo group (—SO$_3$H). Among these groups, polar groups that contain an —OH within the structure (hereinafter also referred to as "OH-containing polar groups") are preferred, a carboxyl group or a hydroxyl group is more preferred, and a carboxyl group is particularly desirable.

More specific examples of the acid-degradable group include groups in which an aforementioned polar group is protected with an acid-dissociable group (such as a group in which the hydrogen atom of an OH-containing polar group is protected with an acid-dissociable group).

An "acid-dissociable group" describes a group having acid dissociability which, under the action of the acid generated from the component (B) upon exposure, undergoes cleavage of at least the bond between the acid-dissociable group and the atom adjacent to the acid-dissociable group. An acid-dissociable group that constitutes an acid-degradable group must be a group of lower polarity than the polar group generated by dissociation of the acid-dissociable group, so that when the acid-dissociable group dissociates under the action of acid, a polar group having a higher polarity than the acid-dissociable group is generated, resulting in an increase in the polarity. This results in an increase in the polarity of the overall component (A1). In the present invention, increasing the polarity causes a change in the solubility within developing solutions, resulting in a relative increase in the solubility when the developing solution is an alkali developing solution, and a relative decrease in the solubility when the developing solution is a developing solution that contains an organic solvent (namely, an organic developing solution).

There are no particular limitations on the acid-dissociable group, and any of the groups that have been proposed as acid-dissociable groups for the base resins of chemically amplified resists can be used. Generally, groups that form either a cyclic or chain-like tertiary alkyl ester with the carboxyl group of the (meth)acrylic acid, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereinafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched acid-dissociable groups and aliphatic cyclic group-containing acid-dissociable groups.

Here, the term "aliphatic branched" refers to a branched structure having no aromaticity. The structure of the "aliphatic branched acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but in most cases, is preferably saturated.

Examples of the aliphatic branched, acid-dissociable group include groups represented by the formula —C($R^{71}$)($R^{72}$)($R^{73}$). In this formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, 2-methyl-2-butyl group, 2-methyl-2-pentyl group and 3-methyl-3-pentyl group. Among these, a tert-butyl group is particularly desirable.

The term "aliphatic cyclic group" refers to a monocyclic group or polycyclic group that has no aromaticity.

The aliphatic cyclic group within the "aliphatic cyclic group-containing acid-dissociable group" may or may not have a substituent. Examples of the substituent include alkyl groups of 1 to 5 carbon atoms, alkoxy groups of 1 to 5 carbon atoms, a fluorine atom, fluorinated alkyl groups of 1 to 5 carbon atoms, and an oxygen atom (=O).

The basic ring structure of the "aliphatic cyclic group" excluding substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either monocyclic or polycyclic.

Examples of the aliphatic cyclic group include groups in which one or more hydrogen atoms have been removed from a monocycloalkane which may or may not be substituted with an alkyl group of 1 to 5 carbon atoms, a fluorine atom or a fluorinated alkyl group, and groups in which one or more hydrogen atoms have been removed from a polycycloalkane such as a bicycloalkane, tricycloalkane or tetracycloalkane. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, a portion of the carbon atoms that constitute the ring structure of any of these alicyclic hydrocarbon groups may be substituted with an ether linkage (—O—).

Examples of acid-dissociable groups containing an aliphatic cyclic group include:

(i) groups in which a substituent (an atom other than a hydrogen atom or a group) is bonded to a carbon atom within the ring structure of a monovalent aliphatic cyclic group that is bonded to the atom adjacent to the acid-dissociable group (for example, the —O— of —C(=O)—O—), thereby forming a tertiary carbon atom on the ring structure of the monovalent aliphatic cyclic group, and (ii) groups which have a monovalent aliphatic cyclic group, and a branched alkylene group containing a tertiary carbon atom that is bonded to the monovalent aliphatic cyclic group.

In a group of type (i) described above, examples of the substituent bonded to the carbon atom within the ring structure of the monovalent aliphatic cyclic group that is bonded to the atom adjacent to the acid-dissociable group include alkyl groups. Examples of these alkyl groups include the same groups as those described below for $R^{14}$ in formulas (1-1) to (1-9) shown below.

Specific examples of groups of type (i) include groups represented by general formulas (1-1) to (1-9) shown below.

Specific examples of groups of type (ii) include groups represented by general formulas (2-1) to (2-6) shown below.

[Chemical Formula 6]

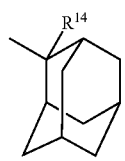

(1-1)

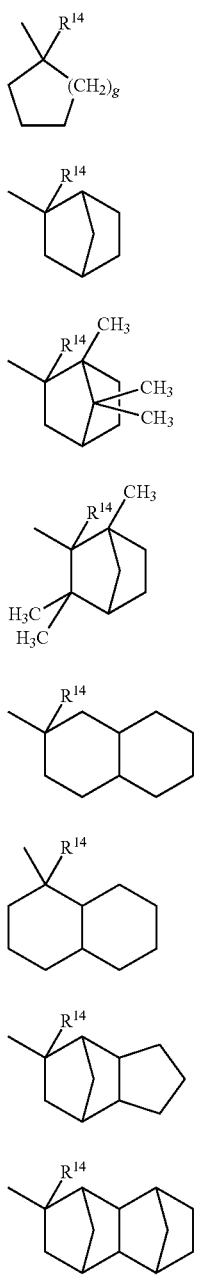

(1-2)
(1-3)
(1-4)
(1-5)
(1-6)
(1-7)
(1-8)
(1-9)

In the formulas above, $R^{14}$ represents an alkyl group, and g represents an integer of 0 to 8.

[Chemical Formula 7]

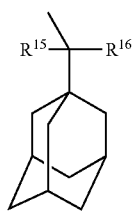

(2-1)

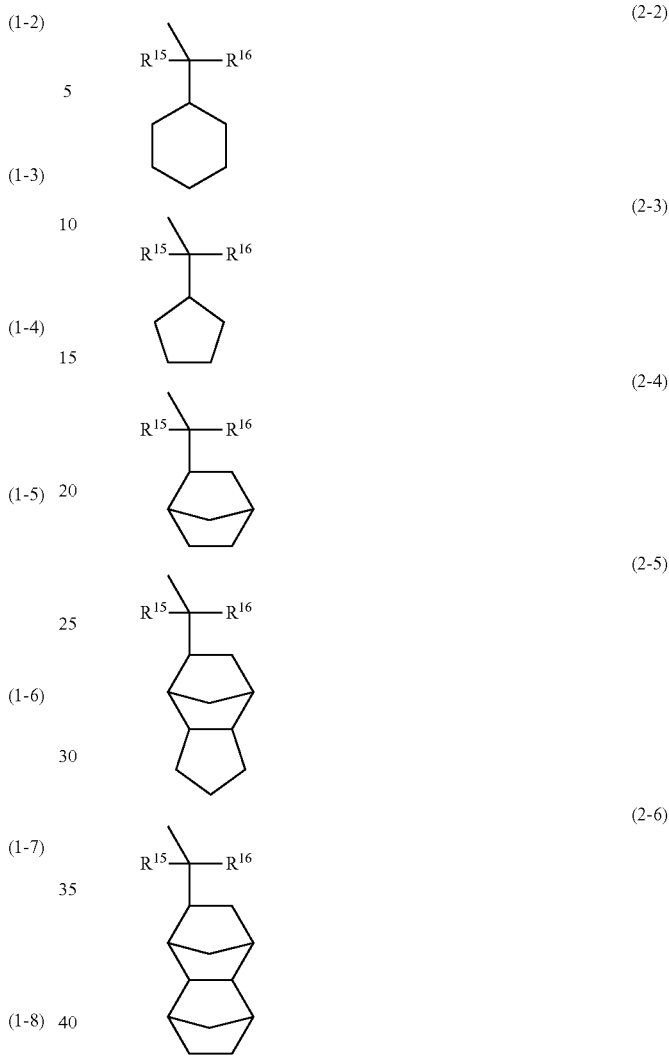

(2-2)
(2-3)
(2-4)
(2-5)
(2-6)

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is the most desirable.

g is preferably an integer of 0 to 3, more preferably an integer of 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and formulas (2-1) to (2-6), some of the carbon atoms that constitute the ring may be replaced with an ethereal oxygen atom (—O—).

Further, in formulas (1-1) to (1-9) and formulas (2-1) to (2-6), one or more of the hydrogen atoms bonded to the carbon atoms that constitute the ring may be substituted with a substituent. Examples of the substituent include an alkyl group of 1 to 5 carbon atoms, a fluorine atom, or a fluorinated alkyl group of 1 to 5 carbon atoms.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group.

Examples of acetal-type acid-dissociable groups include groups represented by general formula (p1) shown below.

[Chemical Formula 8]

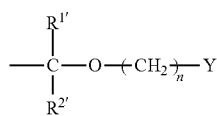

(p1)

In the formula, each of $R^{1\prime}$ and $R^{2\prime}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p1), n is preferably an integer of 0 to 2, more preferably 0 or 1, and most preferably 0.

Examples of the alkyl group for $R^{1\prime}$ and $R^{2\prime}$ include the same alkyl groups as those described above, within the description relating to the α-substituted acrylate ester, for the substituent which may be bonded to the carbon atom on the α-position. Among these, a methyl group or ethyl group is preferable, and a methyl group is the most desirable.

In the present invention, it is preferable that at least one of $R^{1\prime}$ and $R^{2\prime}$ is a hydrogen atom. That is, it is preferable that the acid-dissociable group (p1) is a group represented by general formula (p1-1) shown below.

[Chemical Formula 9]

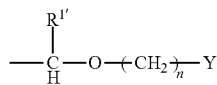

(p1-1)

In the formula, $R^{1\prime}$, n and Y are the same as defined above.

Examples of the alkyl group for Y include the same alkyl groups as those described above, within the description relating to the α-substituted acrylate ester, for the substituent which may be bonded to the carbon atom on the α-position.

As the aliphatic cyclic group for Y, any of the monocyclic or polycyclic aliphatic cyclic groups which have been proposed for conventional ArF resists and the like can be appropriately selected for use. For example, the same groups as those described above for the aliphatic cyclic group of the "aliphatic cyclic group-containing acid-dissociable group" can be used.

Further, as the acetal-type acid-dissociable group, groups represented by general formula (p2) shown below can also be used.

[Chemical Formula 10]

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (preferably an alkylene group of 1 to 5 carbon atoms), wherein $R^{19}$ and $R^{17}$ are bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

Specific examples of the structural unit (a1) include structural units represented by general formula (a1-0-1) shown below and structural units represented by general formula (a1-0-2) shown below.

[Chemical Formula 11]

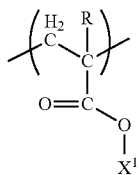

(a1-0-1)

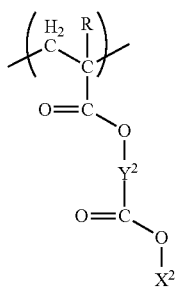

(a1-0-2)

In the formulas, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In general formula (a1-0-1), examples of the alkyl group and the halogenated alkyl group for R include the same alkyl groups and halogenated alkyl groups as those described above, within the description relating to the α-substituted acrylate ester, for the substituent which may be bonded to the carbon atom on the α-position. R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, tertiary alkyl ester-type acid-dissociable groups are preferable.

In general formula (a1-0-2), R is the same as defined above. $X^2$ is the same as defined for $X^1$ in formula (a1-0-1).

Although there are no particular limitations on the divalent linking group for $Y^2$, preferred examples include divalent hydrocarbon groups which may have a substituent, and divalent linking groups containing a hetero atom.

The expression that the hydrocarbon group "may have a substituent" means that some or all of the hydrogen atoms within the hydrocarbon group may each be substituted with a substituent (an atom other than a hydrogen atom or a group).

The hydrocarbon group may be an aliphatic hydrocarbon group or an aromatic hydrocarbon group.

An "aliphatic hydrocarbon group" describes a hydrocarbon group having no aromaticity.

The aliphatic hydrocarbon group that functions as the divalent hydrocarbon group for $Y^2$ may be saturated or unsaturated, but in most cases, is preferably saturated.

More specific examples of the aliphatic hydrocarbon group include linear or branched aliphatic hydrocarbon groups, and aliphatic hydrocarbon groups that include a ring within the structure.

The linear or branched aliphatic hydrocarbon group preferably contains 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable, and specific examples include a methylene group [$CH_2-$], an ethylene group [$-(CH_2)_2-$], a trimethylene group [$-(CH_2)_3-$], a tetramethylene group [$-(CH_2)_4-$] and a pentamethylene group [$-(CH_2)_5-$].

As the branched aliphatic hydrocarbon group, a branched alkylene group is preferable, and specific examples include alkylalkylene groups, including alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$, alkylethylene groups such as $-CH(CH_3)CH_2-$, $-CH(CH_3)CH(CH_3)-$, $-C(CH_3)_2CH_2-$, $-CH(CH_2CH_3)CH_2-$ and $-C(CH_2CH_3)_2-CH_2-$, alkyltrimethylene groups such as $-CH(CH_3)CH_2CH_2-$ and $-CH_2CH(CH_3)CH_2-$, and alkyltetramethylene groups such as $-CH(CH_3)CH_2CH_2CH_2-$ and $-CH_2CH(CH_3)CH_2CH_2-$. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those described above.

The alicyclic hydrocarbon group preferably contains 3 to 20 carbon atoms, and more preferably 3 to 12 carbon atoms.

The alicyclic hydrocarbon group may be either a polycyclic group or a monocyclic group. As the monocyclic alicyclic group, a group in which two hydrogen atoms have been removed from a monocycloalkane is preferred. The monocycloalkane preferably contains 3 to 6 carbon atoms, and specific examples include cyclopentane and cyclohexane. As the polycyclic alicyclic hydrocarbon group, a group in which two hydrogen atoms have been removed from a polycycloalkane is preferred. The polycycloalkane preferably contains 7 to 12 carbon atoms, and specific examples include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group that contains an aromatic ring.

The aromatic hydrocarbon group that functions as the divalent hydrocarbon group for $Y^2$ preferably contains 3 to 30 carbon atoms, more preferably 5 to 30 carbon atoms, still more preferably 5 to 20 carbon atoms, still more preferably 6 to 15 carbon atoms, and most preferably 6 to 10 carbon atoms. This number of carbon atoms does not include any carbon atoms within any substituents.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which some of the carbon atoms that constitute one of the above aromatic hydrocarbon rings have been substituted with a hetero atom. Examples of the hetero atom in the aromatic heterocyclic rings include an oxygen atom, a sulfur atom or a nitrogen atom.

Specific examples of the aromatic hydrocarbon group include groups in which two hydrogen atoms have been removed from an above-mentioned aromatic hydrocarbon ring (namely, arylene groups), and groups in which one hydrogen atom from a group having one hydrogen atom removed from an above-mentioned aromatic hydrocarbon ring (namely, an aryl group) is substituted with an alkylene group (for example, groups in which one hydrogen atom is removed from the aryl group of an arylalkyl group such as a benzyl group, phenethyl group, 1-naphthylmethyl group, 2-naphthylmethyl group, 1-naphthylethyl group or 2-naphthylethyl group). The alkylene group (namely, the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an above-mentioned aromatic hydrocarbon group may be substituted with a substituent. Examples of the substituent include an alkyl group, alkoxy group, halogen atom, halogenated alkyl group, hydroxyl group, or oxygen atom (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent of the aromatic hydrocarbon group include a fluorine atom, chlorine atom, bromine atom or iodine atom, and a fluorine atom is preferred.

Examples of the halogenated alkyl group for the substituent include groups in which some or all of the hydrogen atoms of an above-mentioned alkyl group have each been substituted with a halogen atom.

Examples of the hetero atom in the "divalent linking group containing a hetero atom" include atoms other than a carbon atom or hydrogen atom, and specific examples include an oxygen atom, nitrogen atom, sulfur atom or halogen atom.

Specific examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group, acyl group or aryl group), —S—, —S(=O)$_2$—, —S(=O)$_2$—O—, —NH—C(=O)—, =N—, and groups represented by general formulas —Y$^{21}$—O—Y$^{22}$—, —[Y$^{21}$—C(=O)—O]$_{m'}$—Y$^{22}$— or —Y$^{21}$—O—C(=O)—Y$^{22}$— [wherein each of Y$^{21}$ and Y$^{22}$ independently represents a divalent hydrocarbon group which may have a substituent, O represents an oxygen atom, and m' represents an integer of 0 to 3].

When Y$^2$ represents —NH—, the H may be substituted with a substituent such as an alkyl group, acyl group or aryl group (aromatic group). The substituent (the alkyl group, acyl group or aryl group or the like) preferably contains 1 to 10 carbon atoms, more preferably 1 to 8 carbon atoms, and most preferably 1 to 5 carbon atoms.

In the formulas Y$^{21}$—O—Y$^{22}$—, —[Y$^{21}$—C(=O)—O]$_{m'}$—Y$^{22}$— and —Y$^{21}$—O—C(=O)—Y$^{22}$—, each of Y$^{21}$ and Y$^{22}$ independently represents a divalent hydrocarbon group which may have a substituent. Examples of this divalent hydrocarbon group include the same groups as those described above for the "divalent hydrocarbon group which may have a substituent" for Y$^2$.

Y$^{21}$ is preferably a linear aliphatic hydrocarbon group, more preferably a linear alkylene group, still more preferably a linear alkylene group of 1 to 5 carbon atoms, and most preferably a methylene group or ethylene group.

Y$^{22}$ is preferably a linear or branched aliphatic hydrocarbon group, and is more preferably a methylene group, ethylene group or alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[Y$^{21}$—C(=O)—O]$_{m'}$—Y$^{22}$—, m' represents an integer of 0 to 3, and is preferably an integer of 0 to 2, more preferably 0 or 1, and most preferably 1. In other words, the group represented by formula —[Y$^{21}$—C(=O)—O]$_{m'}$—Y$^{22}$— is most preferably a group represented by a formula —Y$^{21}$—C(=O)—O—Y$^{22}$—. Among such groups, groups represented by —(CH$_2$)$_{a'}$—C(=O)—O—(CH$_2$)$_{b'}$— are particularly preferred. In this formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

The divalent linking group containing a hetero atom is preferably a linear group containing an oxygen atom as the hetero atom, such as a group containing an ether linkage or an ester linkage, and a group represented by one of the above formulas —Y$^{21}$—O—Y$^{22}$—, —[Y$^{21}$—C(=O)—O]$_{m'}$—Y$^{22}$— or Y$^{21}$—O—C(=O)—Y$^{22}$— is particularly desirable.

Among the above possibilities, the divalent linking group for Y$^2$ is preferably a linear or branched alkylene group, a divalent alicyclic hydrocarbon group, or a divalent linking group containing a hetero atom. Among these, a linear or branched alkylene group or a divalent linking group containing a hetero atom is particularly desirable.

Specific examples of the structural unit (a1) include structural units represented by general formulas (a1-1) to (a1-4) shown below.

[Chemical Formula 12]

(a1-1)

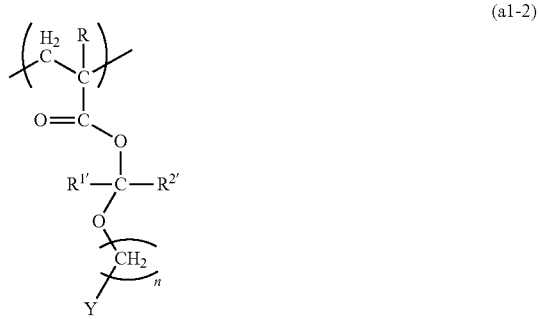

(a1-2)

-continued (a1-3)

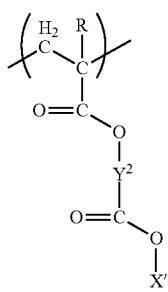

(a1-4)

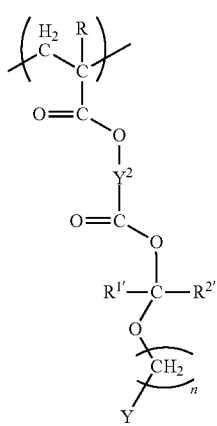

In the formulas, R, $R^{1'}$, $R^{2'}$, n, Y and $Y^2$ are each the same as defined above, and X' represents a tertiary alkyl ester-type acid-dissociable group.

In the above formulas, examples of X' include the same tertiary alkyl ester-type acid-dissociable groups as those described above.

$R^{1'}$, $R^{2'}$, n and Y are respectively the same as defined above for $R^{1'}$, $R^{2'}$, n and Y in general formula (p1) described above in connection with the "acetal-type acid-dissociable group".

Examples of $Y^2$ include the same groups as those described above for $Y^2$ in general formula (a1-0-2).

Specific examples of the structural units represented by general formulas (a1-1) to (a1-4) are shown below.

In the formulas shown below, $R^\alpha$ represents a hydrogen atom, a methyl group or a trifluoromethyl group.

[Chemical Formula 13]

(a1-1-1)

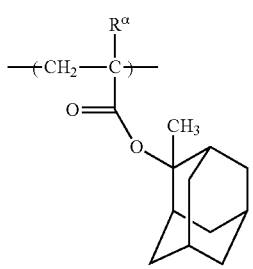

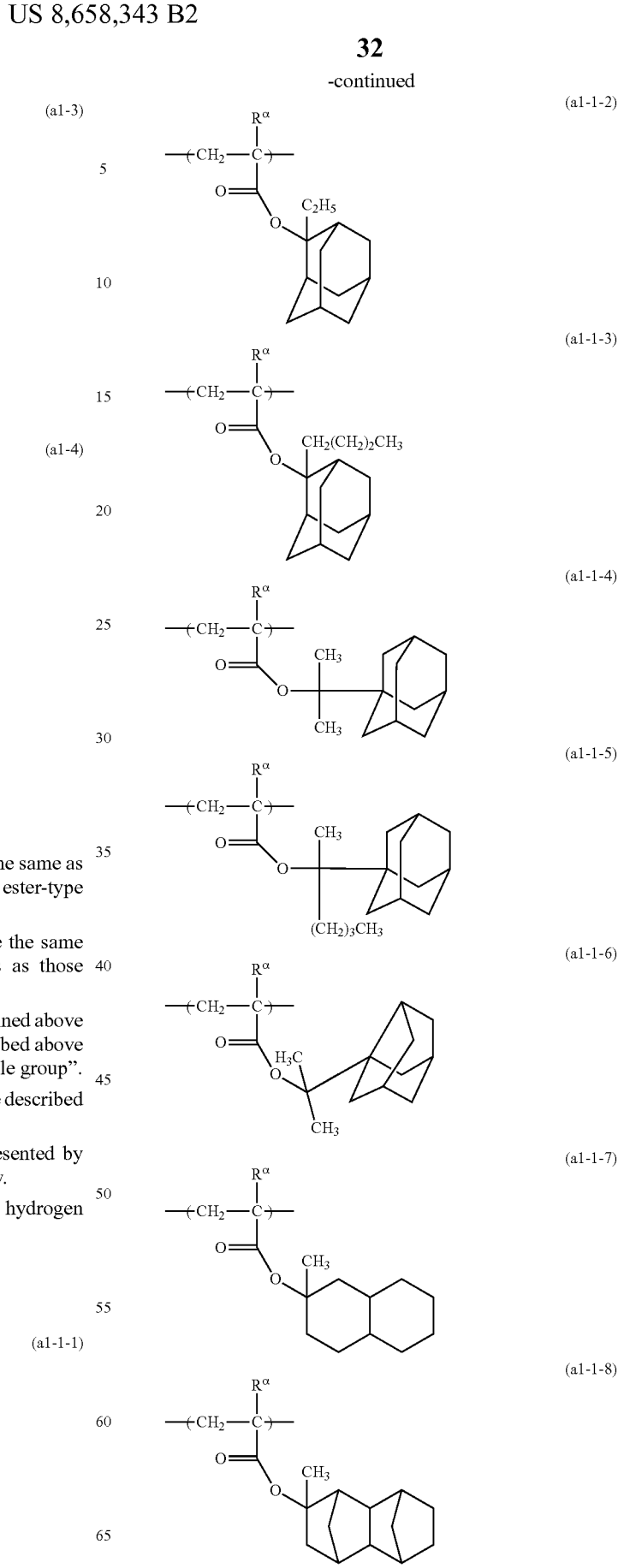

(a1-1-9) 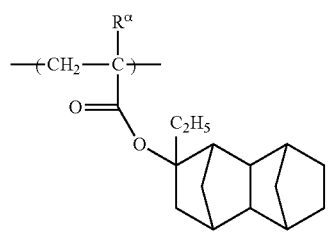
[Chemical Formula 14]
(a1-1-10) 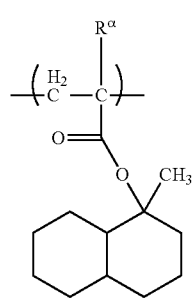
(a1-1-11) 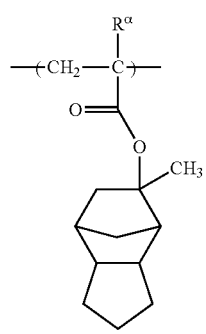
(a1-1-12) 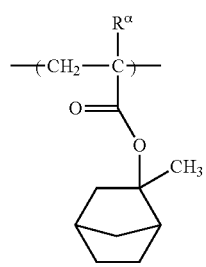
(a1-1-13) 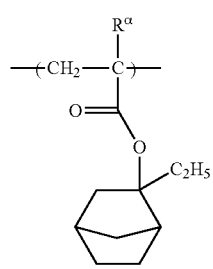
(a1-1-14) 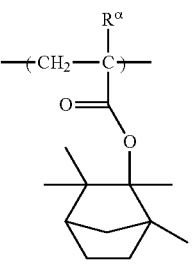
(a1-1-15) 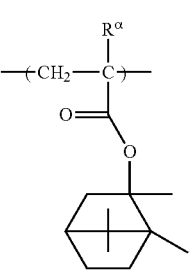
(a1-1-16) 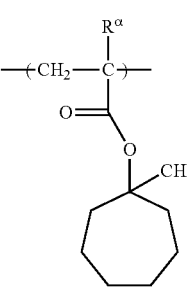
(a1-1-17) 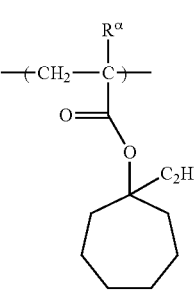
(a1-1-18) 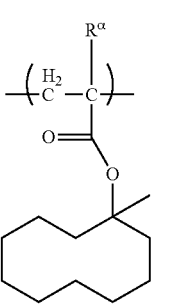

(a1-1-19) 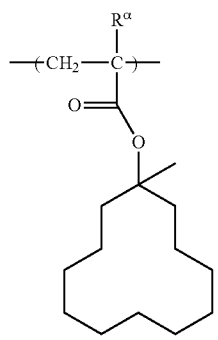
(a1-1-20) 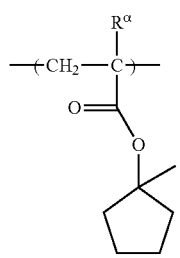
(a1-1-21) 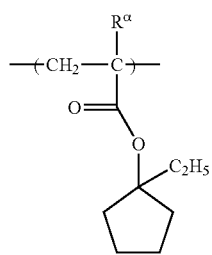
[Chemical Formula 15]
(a1-1-22) 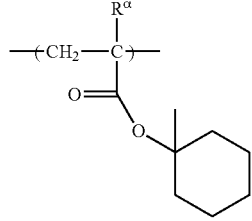
(a1-1-23) 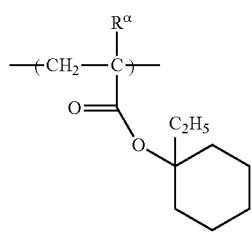
(a1-1-24) 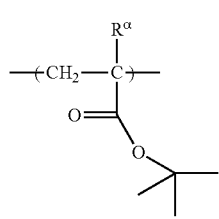
(a1-1-25) 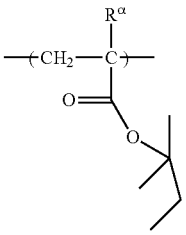
(a1-1-26) 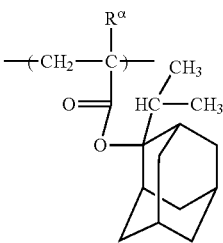
(a1-1-27) 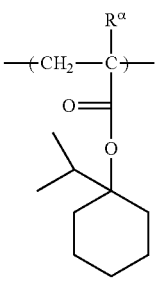
(a1-1-28) 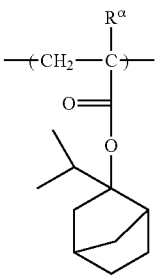
(a1-1-29) 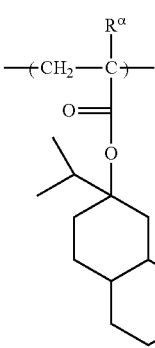

-continued
(a1-1-30)
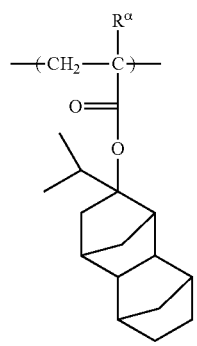
(a1-1-31)
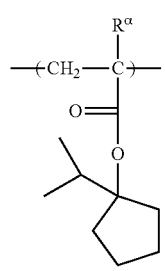
(a1-1-32)
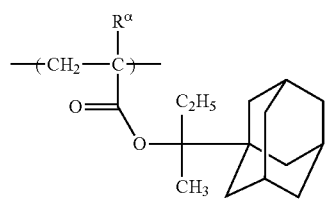
(a1-1-33)
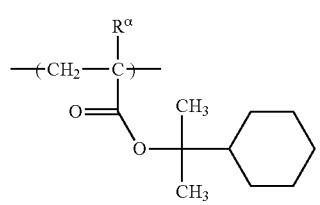
(a1-1-34)
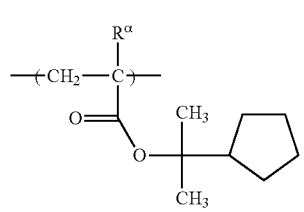
[Chemical Formula 16]
(a1-2-1)
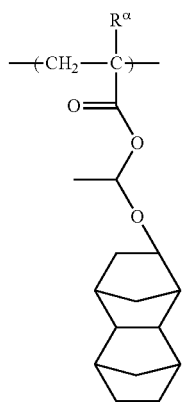
(a1-2-2)
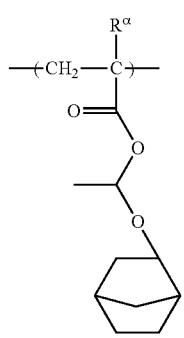
(a1-2-3)
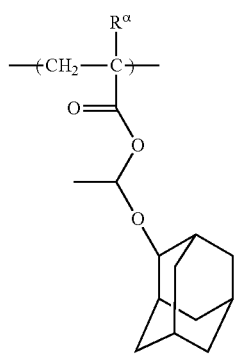
(a1-2-4)
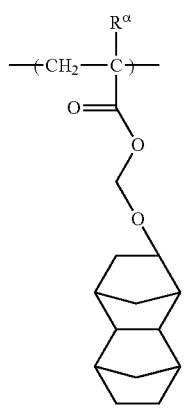

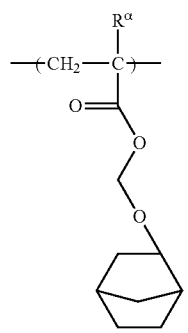
(a1-2-5)
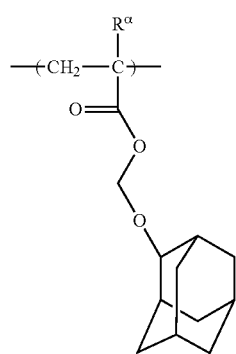
(a1-2-6)
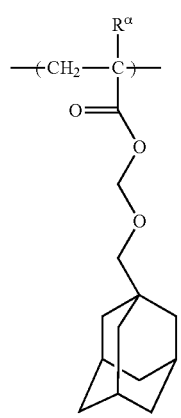
(a1-2-7)
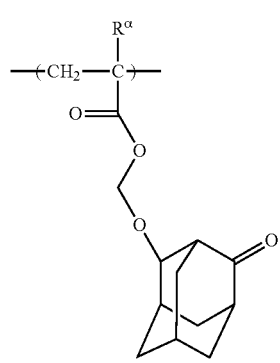
(a1-2-8)
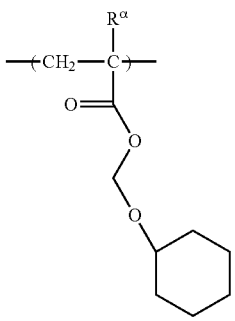
(a1-2-9)
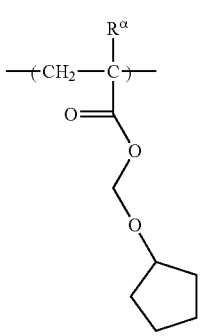
(a1-2-10)
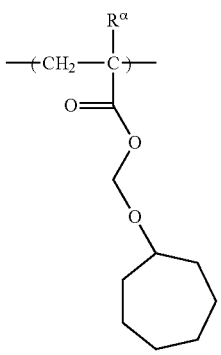
(a1-2-11)
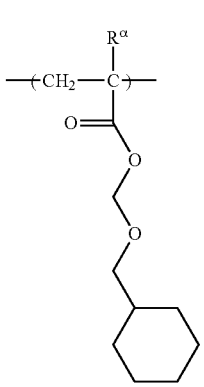
(a1-2-12)

-continued
(a1-2-13)
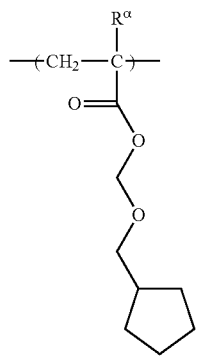
(a1-2-14)
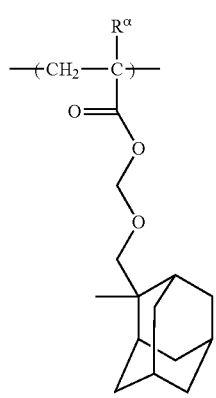
(a1-2-15)
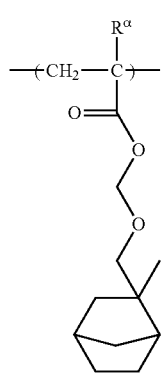
(a1-2-16)
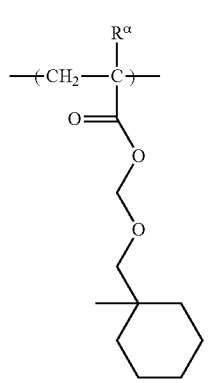
-continued
(a1-2-17)
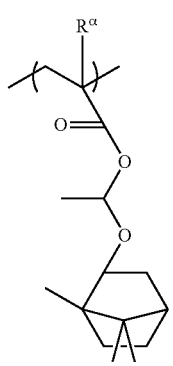
(a1-2-18)
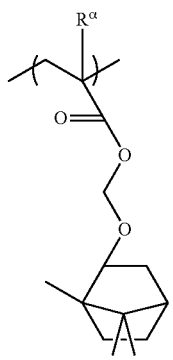
(a1-2-19)
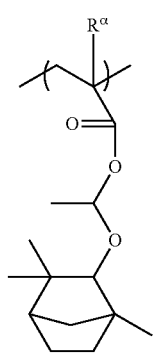
(a1-2-20)
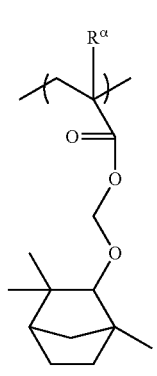

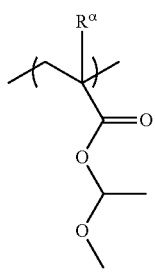
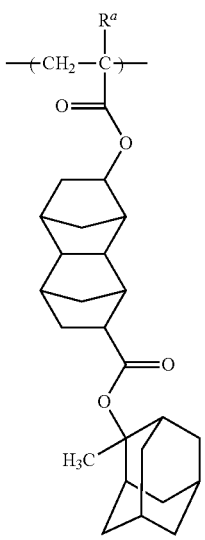
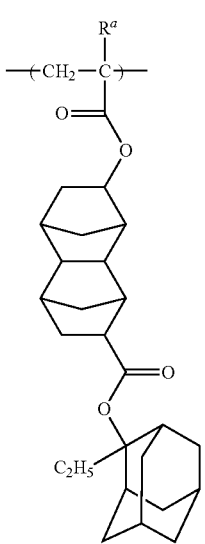
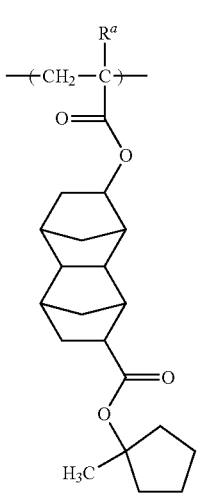

(a1-3-4)
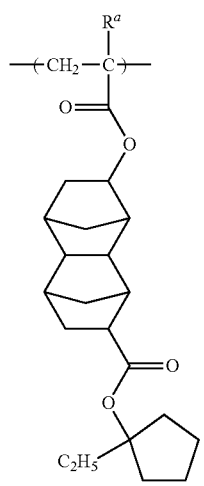
(a1-3-5)
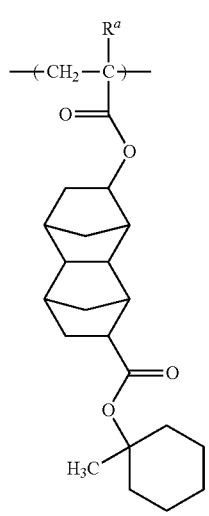
(a1-3-6)
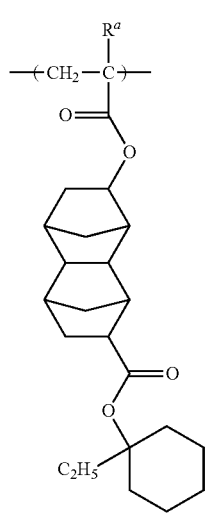
(a1-3-7)
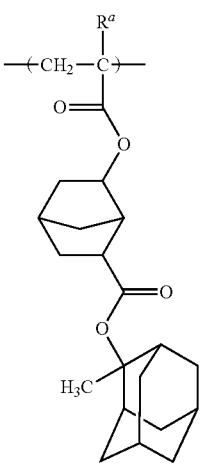
(a1-3-8)
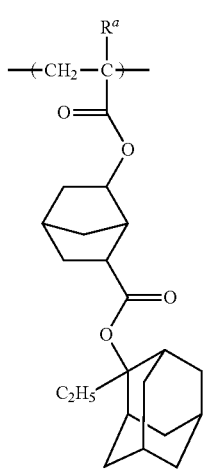
(a-1-3-9)
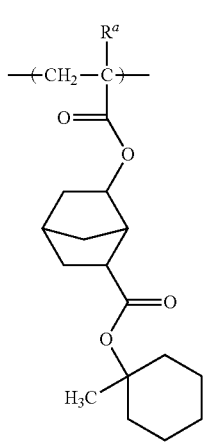

(a1-3-10)
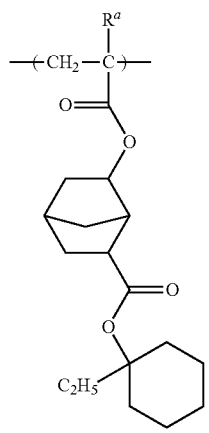
(a1-3-11)
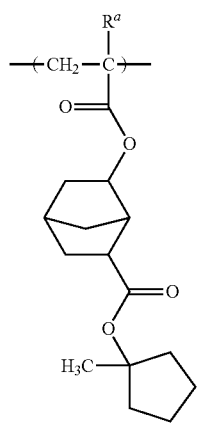
(a1-3-12)
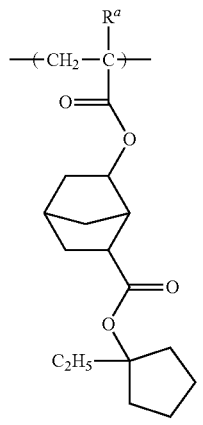
(a1-3-13)
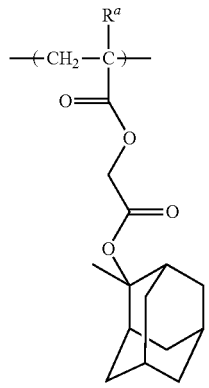
(a1-3-14)
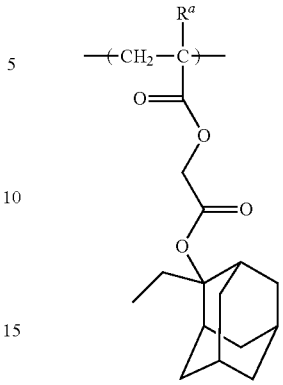
(a3-1-15)
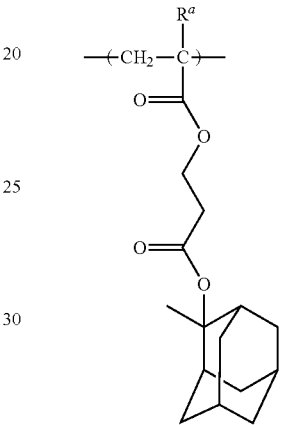
(a1-3-16)
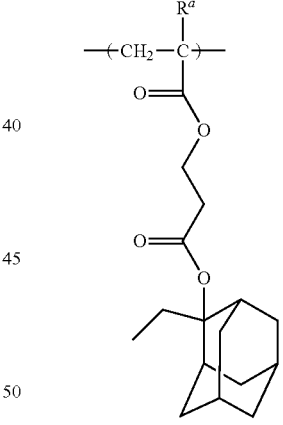
(a1-3-17)
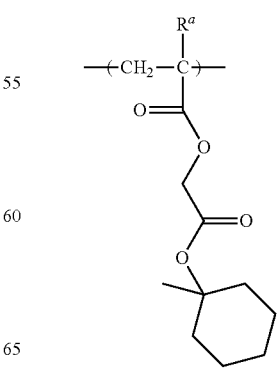

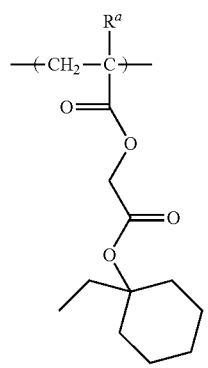
(a1-3-18)
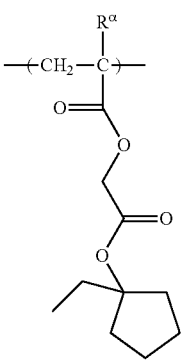
(a1-3-22)
[Chemical Formula 18]
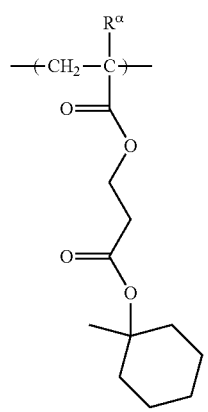
(a1-3-19)
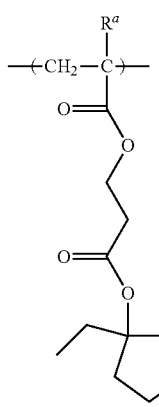
(a1-3-23)
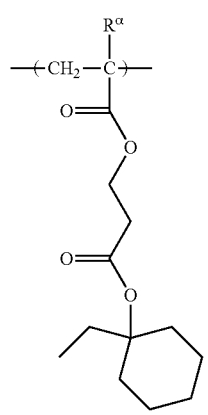
(a1-3-20)
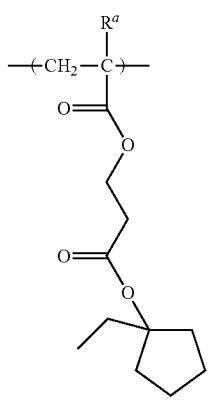
(a1-3-24)
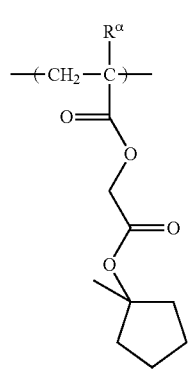
(a1-3-21)

[Chemical Formula 19]
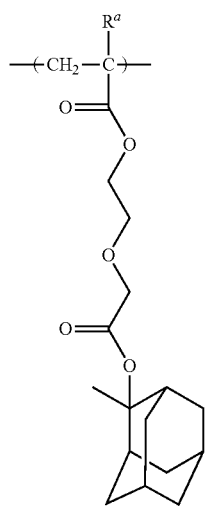
(a1-3-25)
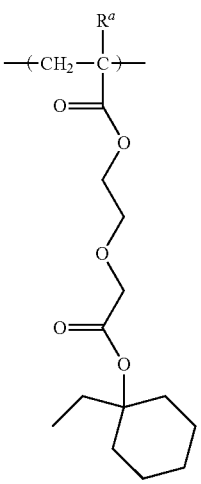
(a1-3-26)
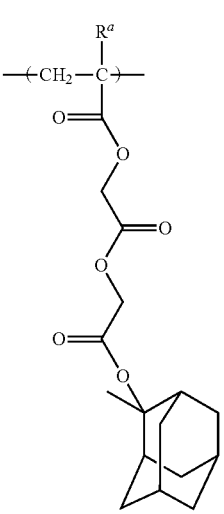
(a1-3-27)
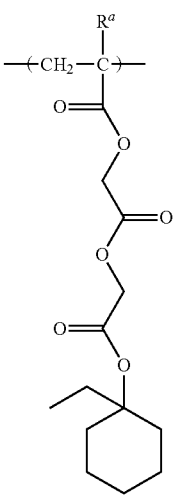
(a1-3-28)
(a1-3-29)
(a1-3-30)

(a1-3-31)
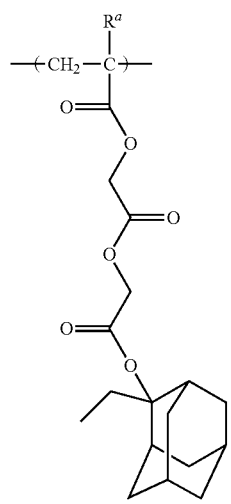
(a1-3-32)
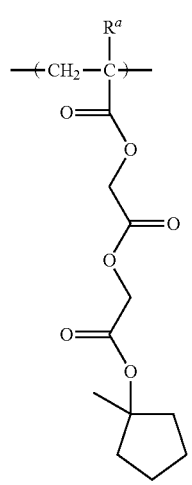
[Chemical Formula 20]
(a1-4-1)
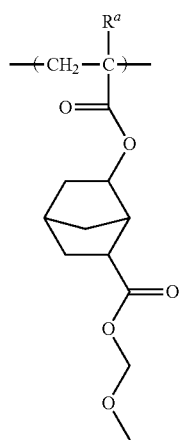
(a1-4-2)
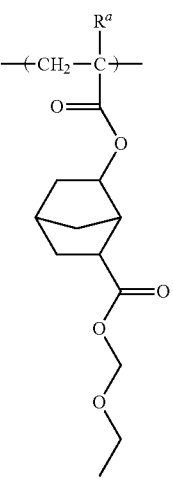
(a1-4-3)
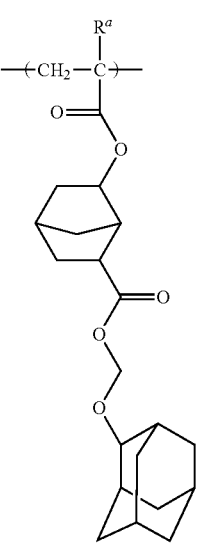
(a1-4-4)
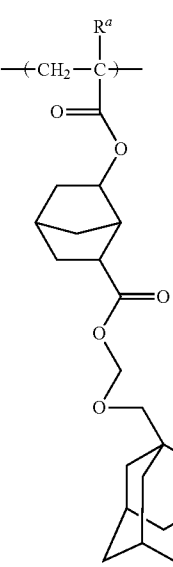

(a1-4-5)
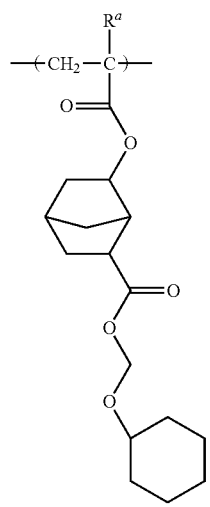
(a1-4-6)
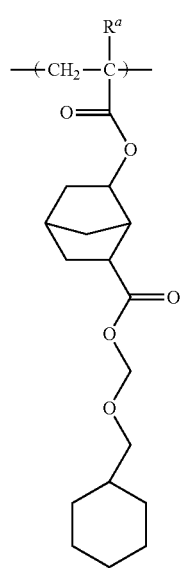
(a-4-7)
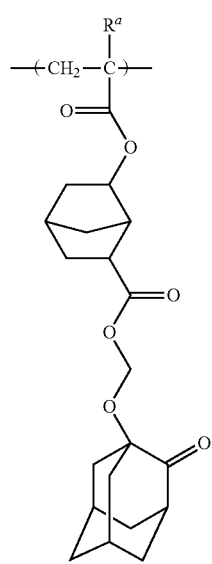
(a1-4-8)
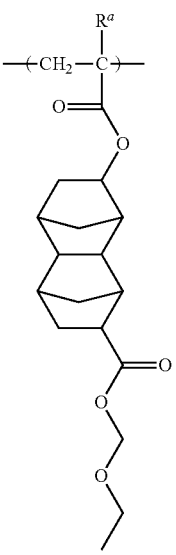
(a1-4-9)
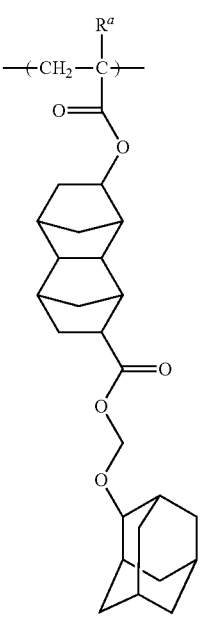

(a1-4-10)
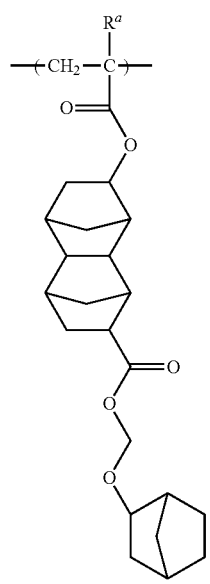
(a1-4-12)
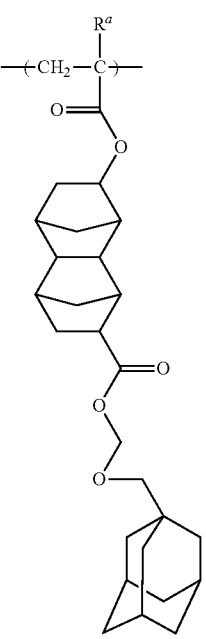
(a1-4-11)
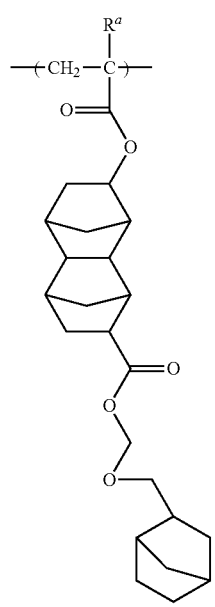
(a1-4-13)
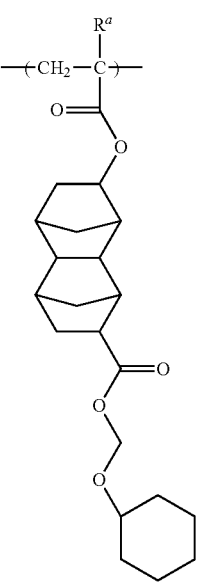

(a1-4-14)

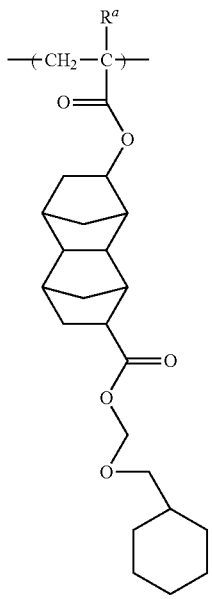

(a1-4-15)

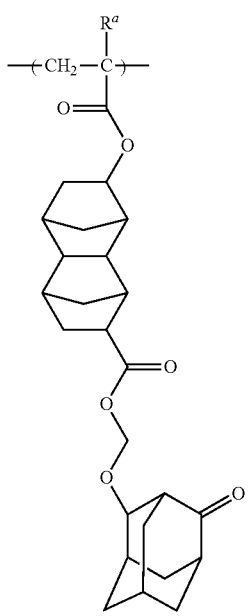

[Chemical Formula 21]

(a1-0-11)

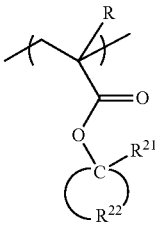

(a1-0-12)

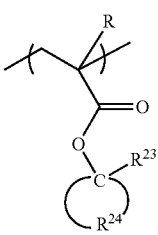

(a1-0-13)

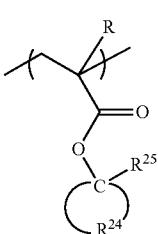

(a1-0-14)

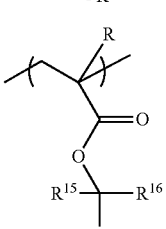

(a1-0-15)

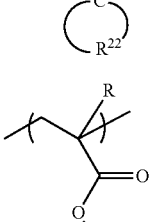

(a1-0-2)

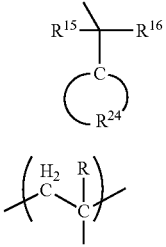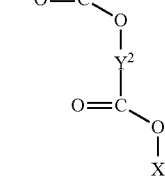

In the present invention, the structural unit (a1) is preferably at least one structural unit selected from the group consisting of structural units represented by general formula (a1-0-11) shown below, structural units represented by general formula (a1-0-12) shown below, structural units represented by general formula (a1-0-13) shown below, structural units represented by general formula (a1-0-14) shown below, structural units represented by general formula (a1-0-15) shown below, and structural units represented by general formula (a1-0-2) shown below.

Among these, at least one structural unit selected from the group consisting of structural units represented by general formula (a1-0-11) shown below, structural units represented by general formula (a1-0-12) shown below, structural units represented by general formula (a1-0-13) shown below, structural units represented by general formula (a1-0-14) shown below, and structural units represented by general formula (a1-0-15) shown below is particularly desirable.

In the above formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group that forms an aliphatic monocyclic group together with the carbon atom to which $R^{22}$ is bonded, $R^{23}$ represents a branched alkyl group, $R^{24}$ represents a group that forms an aliphatic polycyclic group together with the carbon atom to which $R^{24}$ is bonded, $R^{25}$ represents a linear alkyl group of 1 to 5 carbon atoms, each of $R^{15}$ and $R^{16}$ independently represents an alkyl group, $Y^2$ represents a divalent linking group, and $X^2$ represents an acid-dissociable group.

In each of the above formulas, R, $Y^2$ and $X^2$ are the same as defined above.

In formula (a1-0-11), examples of the alkyl group for $R^{21}$ include the same alkyl groups as those described above for $R^{14}$ in formulas (1-1) to (1-9), and a methyl group, ethyl group or isopropyl group is preferred.

In terms of $R^{22}$, examples of the aliphatic monocyclic group that is formed together with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

Some of the carbon atoms that constitute the ring of the monocycloalkane may or may not be substituted with an ether group (—O—).

Further, the monocycloalkane may include an alkyl group of 1 to 5 carbon atoms, a fluorine atom, or a fluorinated alkyl group of 1 to 5 carbon atoms as a substituent.

Examples of the $R^{22}$ group that constitutes the aliphatic monocyclic group include linear alkylene groups which may have an ether group (—O—) interposed between the carbon atoms of the alkylene chain.

Specific examples of the structural units represented by formula (a1-0-11) include structural units represented by the above formulas (a1-1-16) to (a1-1-23), (a1-1-27) and (a1-1-31). Among these, structural units represented by general formula (a1-1-02) shown below, which includes the structural units represented by formulas (a1-1-16) and (a1-1-17), formulas (a1-1-20) to (a1-1-23), and formulas (a1-1-27) and (a1-1-31) are preferred. Furthermore, structural units represented by general formula (a1-1-02') shown below are also preferred.

In each of the formulas below, h is preferably 1 or 2.

[Chemical Formula 22]

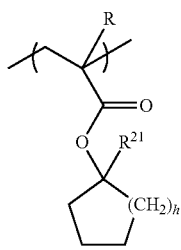

(a1-1-02)

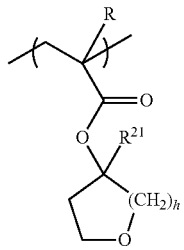

(a1-1-02')

In the formulas, R and $R^{21}$ are each the same as defined above, and h represents an integer of 1 to 3.

In formula (a1-0-12), examples of the branched alkyl group for $R^{23}$ include the same branched alkyl groups as those described above for the alkyl group for $R^{14}$ in formulas (1-1) to (1-9), and an isopropyl group is particularly desirable.

Examples of the aliphatic polycyclic group formed by $R^{24}$ together with the carbon atom to which $R^{24}$ is bonded include the polycyclic groups among the aliphatic cyclic groups described above in connection with the tertiary alkyl ester-type acid-dissociable groups.

Specific examples of structural units represented by general formula (a1-0-12) include the structural units represented by the above formula (a1-1-26) and formulas (a1-1-28) to (a1-1-30).

The structural unit represented by formula (a1-0-12) is preferably a structural unit in which the aliphatic polycyclic group formed by $R^{24}$ together with the carbon atom to which $R^{24}$ is bonded is a 2-adamantyl group, and a structural unit represented by the above formula (a1-1-26) is particularly desirable.

In formula (a1-0-13), R and $R^{24}$ are each the same as defined above.

Examples of the linear alkyl group for $R^{25}$ include the same linear alkyl groups as those described above for the alkyl group for $R^{14}$ in formulas (1-1) to (1-9), and a methyl group or ethyl group is the most desirable.

Specific examples of the structural units represented by formula (a1-0-13) include the structural units represented by formulas (a1-1-1) to (a1-1-2) and formulas (a1-1-7) to (a1-1-15), which were listed above as specific examples of general formula (a1-1).

The structural unit represented by formula (a1-0-13) is preferably a structural unit in which the aliphatic polycyclic group formed by $R^{24}$ together with the carbon atom to which $R^{24}$ is bonded is a 2-adamantyl group, and a structural unit represented by the above formula (a1-1-1) or (a1-1-2) is particularly desirable.

In formula (a1-0-14), R and $R^{22}$ are each the same as defined above. $R^{15}$ and $R^{16}$ are the same as $R^{15}$ and $R^{16}$ in general formulas (2-1) to (2-6).

Specific examples of the structural units represented by formula (a1-0-14) include the structural units represented by formulas (a1-1-33) and (a1-1-34), which were listed above as specific examples of general formula (a1-1).

In formula (a1-0-15), R and $R^{24}$ are each the same as defined above. $R^{15}$ and $R^{16}$ are the same as $R^{15}$ and $R^{16}$ in general formulas (2-1) to (2-6).

Specific examples of the structural units represented by formula (a1-0-15) include the structural units represented by formulas (a1-1-4) to (a1-1-6) and formula (a1-1-32), which were listed above as specific examples of general formula (a1-1).

Examples of the structural units represented by formula (a1-O-2) include structural units represented by the above formulas (a1-3) and (a1-4), and of these, a structural unit represented by formula (a1-3) is particularly desirable.

The structural unit represented by general formula (a1-O-2) is preferably a structural unit in which $Y^2$ in the formula is a group represented by one of the above-mentioned formulas —$Y^{21}$—O—$Y^{22}$— or —$Y^{21}$—C(=O)—O—$Y^{22}$—.

Preferred examples of such structural units include structural units represented by general formula (a1-3-01) shown below, structural units represented by general formula (a1-3-02) shown below, and structural units represented by general formula (a1-3-03) shown below.

[Chemical Formula 23]

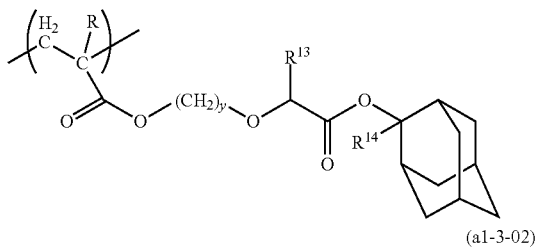

(a1-3-01)

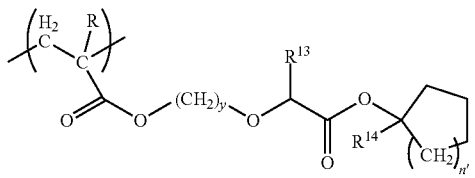

(a1-3-02)

In the formulas, R is the same as defined above, $R^{13}$ represents a hydrogen atom or a methyl group, $R^{14}$ represents an alkyl group, y represents an integer of 1 to 10, and n' represents an integer of 0 to 3.

[Chemical Formula 24]

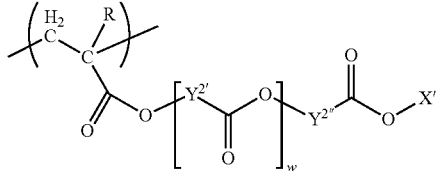

(a1-3-03)

In the formula, R is the same as defined above, each of $Y^{2\prime}$ and $Y^{2\prime\prime}$ independently represents a divalent linking group, X' represents an acid-dissociable group, and w represents an integer of 0 to 3.

In formulas (a1-3-01) to (a1-3-02), $R^{13}$ is preferably a hydrogen atom.

$R^{14}$ is the same as defined above for $R^{14}$ in formulas (1-1) to (1-9).

y is preferably an integer of 1 to 8, more preferably an integer of 1 to 5, and most preferably 1 or 2.

n' is preferably 1 or 2, and is most preferably 2.

Specific examples of the structural units represented by formula (a1-3-01) include the structural units represented by the above formulas (a1-3-25) and (a1-3-26).

Specific examples of the structural units represented by formula (a1-3-02) include the structural units represented by the above formulas (a1-3-27) and (a1-3-28).

Examples of the divalent linking groups for $Y^{2\prime}$ and $Y^{2\prime\prime}$ in formula (a1-3-03) include the same groups as those described above for $Y^2$ in general formula (a1-3).

$Y^{2\prime}$ is preferably a divalent hydrocarbon group which may have a substituent, is more preferably a linear aliphatic hydrocarbon group, and is still more preferably a linear alkylene group. Among such groups, a linear alkylene group of 1 to 5 carbon atoms is preferred, and a methylene group or ethylene group is the most desirable.

$Y^{2\prime\prime}$ is preferably a divalent hydrocarbon group which may have a substituent, is more preferably a linear aliphatic hydrocarbon group, and is still more preferably a linear alkylene group. Among such groups, a linear alkylene group of 1 to 5 carbon atoms is preferred, and a methylene group or ethylene group is the most desirable.

The acid-dissociable group for X' is the same as defined above, is preferably a tertiary alkyl ester-type acid-dissociable group, is more preferably a group of type (i) described above, in which a substituent is bonded to a carbon atom within the ring structure of a monovalent aliphatic cyclic group that is bonded to the atom adjacent to the acid-dissociable group, thereby forming a tertiary carbon atom on the ring structure of the monovalent aliphatic cyclic group, and is most preferably a group represented by the above general formula (1-1).

w represents an integer of 0 to 3, and is preferably an integer of 0 to 2, more preferably 0 or 1, and most preferably 1.

The structural unit represented by general formula (a1-3-03) is preferably a structural unit represented by general formula (a1-3-03-1) or (a1-3-03-2) shown below, and among these, is most preferably a structural unit represented by formula (a1-3-03-1).

[Chemical Formula 25]

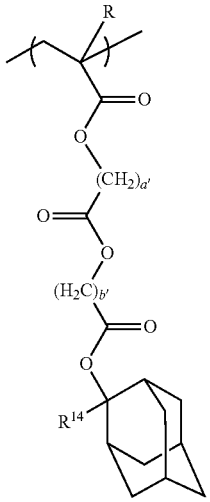

(a1-3-03-1)

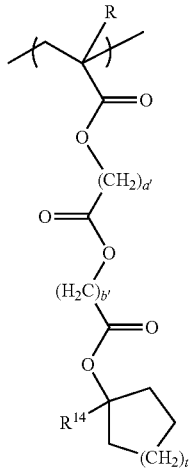

(a1-3-03-2)

In the formulas, R and $R^{14}$ are the same as defined above, a' represents an integer of 1 to 10, b' represents an integer of 1 to 10, and t represents an integer of 0 to 3.

In formulas (a1-3-03-1) and (a1-3-03-2), a' is preferably an integer of 1 to 8, more preferably an integer of 1 to 5, and most preferably 1 or 2.

b' is preferably an integer of 1 to 8, more preferably an integer of 1 to 5, and most preferably 1 or 2.

t is preferably an integer of 1 to 3, and most preferably 1 or 2.

Specific examples of the structural units represented by formulas (a1-3-03-1) and (a1-3-03-2) include the structural units represented by the above formulas (a1-3-29) to (a1-3-32).

The structural unit (a1) within the component (A1) may be a single type of structural unit, or may be two or more types of structural units.

In terms of achieving a favorable reduction in roughness in combination with the structural unit (a5), the structural unit (a1) is preferably a structural unit having an acid-dissociable group containing a monocyclic aliphatic cyclic group. Specifically, structural units represented by formula (a1-0-11) are preferred, and it is particularly desirable that a single structural unit represented by formula (a1-0-11) is used as the structural unit (a1) in combination with the structural unit (a5).

Further, in terms of achieving favorable EL in combination with the structural unit (a5), the structural unit (a1) is preferably a combination of a structural unit having both an acid-dissociable group containing a monocyclic aliphatic cyclic group, and a structural unit having an acid-dissociable group containing a polycyclic aliphatic cyclic group.

In those cases where the component (A1) includes two or more types of the structural unit (a1), a combination of structural units of formula (a1-0-11) and formula (a1-0-12), a combination of structural units of formula (a1-0-12) and formula (a1-0-13), or a combination of structural units of formula (a1-0-11) and formula (a1-0-13) is preferred. In terms of achieving superior levels of both EL and LWR in combination with the structural unit (a5), a combination of structural units of formula (a1-0-11) and formula (a1-0-12) is particularly desirable.

The amount of the structural unit (a1) within the component (A1), based on the combined total of all the structural units that constitute the component (A1), is preferably within a range from 15 to 70 mol %, more preferably from 15 to 60 mol %, and most preferably from 20 to 55 mol %. By ensuring that the amount of the structural unit (a1) is at least as large as the lower limit of the above range, a pattern can be formed easily using a resist composition prepared from the component (A1), and the lithography properties such as the sensitivity, resolution and LWR can be improved. On the other hand, by ensuring that the amount is not more than the upper limit of the above range, a good balance can be achieved with the other structural units.

[Structural Unit (a0)]

The structural unit (a0) is a structural unit which is derived from an acrylate ester in which the hydrogen atom bonded to the carbon atom on the α-position may be substituted with a substituent, and contains an —$SO_2$-containing cyclic group.

By incorporating an —$SO_2$-containing cyclic group, the structural unit (a0) enhances the adhesion between the substrate and a resist film formed using a resist composition containing the component (A1). Further, the structural unit (a0) also contributes to improvements in lithography properties such as the sensitivity, resolution, exposure latitude (EL), line width roughness (LWR), line edge roughness (LER) and mask reproducibility.

In this description, the term "—$SO_2$-containing cyclic group" refers to a cyclic group which includes a ring containing an —$SO_2$— moiety within the ring structure, and specifically refers to cyclic groups in which the sulfur atom (S) of the —$SO_2$— forms a part of the ring structure of the cyclic group.

In the —$SO_2$-containing cyclic group, the ring containing the —$SO_2$— moiety within the ring structure is counted as the first ring, so that groups containing only that ring are referred to as monocyclic groups, and groups containing other ring structures are described as polycyclic groups regardless of the structure of the other rings.

The —$SO_2$-containing cyclic group may be either monocyclic or polycyclic. The —$SO_2$-containing cyclic group is preferably a cyclic group containing an —O—$SO_2$-moiety within the ring structure, namely a cyclic group containing a sultone ring in which the —O—S— within the —O—$SO_2$— forms a part of the ring structure of the cyclic group.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which some of the carbon atoms that constitute the ring structure have been substituted with either —$SO_2$— or —O—$SO_2$—. More specific examples include groups in which at least one hydrogen atom has been removed from an aliphatic hydrocarbon ring in which a —$CH_2$-moiety that constitutes part of the ring structure has been substituted with an —$SO_2$-moiety, and groups in which at least one hydrogen atom has been removed from an aliphatic hydrocarbon ring in which a —$CH_2$—$CH_2$— moiety that constitutes part of the ring structure has been substituted with an —O—$SO_2$— moiety.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, groups in which two hydrogen atoms have been removed from a monocycloalkane of 3 to 6 carbon atoms are preferable, and specific examples of such monocycloalkanes include cyclopentane and cyclohexane. As the polycyclic alicyclic hydrocarbon group, groups in which two hydrogen atoms have been removed from a polycycloalkane of 7 to 12 carbon atoms are preferable, and specific examples of such polycycloalkanes include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (=O), —COOR", —OC(=O)R" (wherein R" represents a hydrogen atom or an alkyl group), hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the substituent alkyl groups described above.

Examples of the halogen atom for the substituent include a fluorine atom, chlorine atom, bromine atom or iodine atom, and a fluorine atom is preferable.

Examples of the halogenated alkyl group for the substituent include groups in which some or all of the hydrogen atoms of an aforementioned alkyl group substituent have each been substituted with an above-mentioned halogen atom. A fluorinated alkyl group is preferred as the halogenated alkyl group, and a perfluoroalkyl group is particularly desirable.

In the above-mentioned —COOR" group and —O(C=O)R" group, R" is preferably a hydrogen atom, or a linear, branched or cyclic alkyl group of 1 to 15 carbon atoms.

In those cases where R" represents a linear or branched alkyl group, the alkyl group preferably contains 1 to 10 carbon atoms, and more preferably 1 to 5 carbon atoms, and is most preferably a methyl group or ethyl group.

In those cases where R" is a cyclic alkyl group, the alkyl group preferably contains 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably contains 1 to 6 carbon atoms, and specific examples thereof include groups in which at least one hydrogen atom within an aforementioned alkyl group substituent has been substituted with a hydroxyl group.

More specific examples of the —$SO_2$-containing cyclic group include groups represented by general formulas (3-1) to (3-4) shown below.

[Chemical Formula 26]

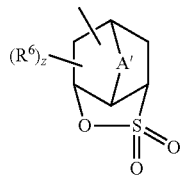
(3-1)

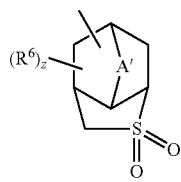
(3-2)

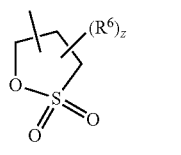
(3-3)

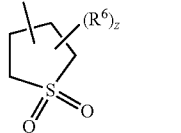
(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^6$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms for A', a linear or branched alkylene group is preferable, and examples thereof include a methylene group, ethylene group, n-propylene group and isopropylene group.

Examples of the alkylene groups which contain an oxygen atom or a sulfur atom include the aforementioned alkylene groups in which —O— or —S— is either bonded to the terminal of the alkylene group or interposed within the alkylene group. Specific examples of such alkylene groups include —O—$CH_2$—, —$CH_2$—O—$CH_2$—, —S—$CH_2$— and —$CH_2$—S—$CH_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^6$ groups may be the same or different from each other.

Examples of the alkyl group, alkoxy group, halogenated alkyl group, —COOR" group, —OC(=O)R" group and hydroxyalkyl group for $R^6$ include the same alkyl groups, alkoxy groups, halogenated alkyl groups, —COOR" groups, —OC(=O)R" groups and hydroxyalkyl groups as those described above for the substituent which the —$SO_2$-containing cyclic group may have.

Specific examples of the cyclic groups represented by general formulas (3-1) to (3-4) are shown below. In the formulas shown below, "Ac" represents an acetyl group.
[Chemical Formula 27]
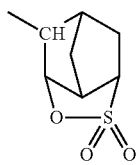
(3-1-1)
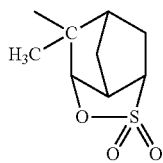
(3-1-2)
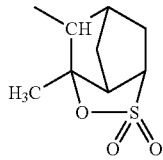
(3-1-3)
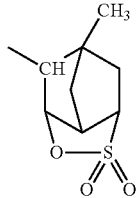
(3-1-4)
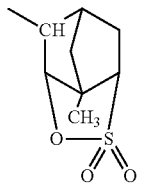
(3-1-5)
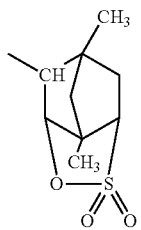
(3-1-6)
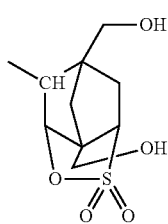
(3-1-7)
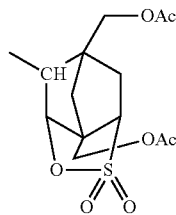
(3-1-8)
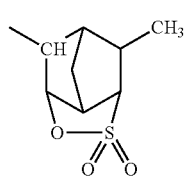
(3-1-9)
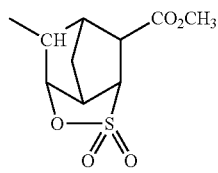
(3-1-10)
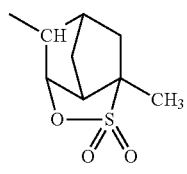
(3-1-11)
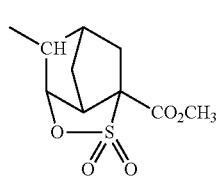
(3-1-12)
[Chemical Formula 28]
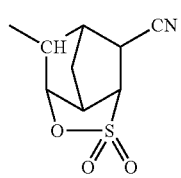
(3-1-13)
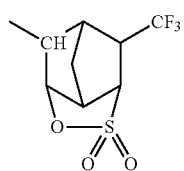
(3-1-14)
(3-1-15)

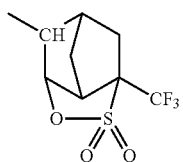
(3-1-16)
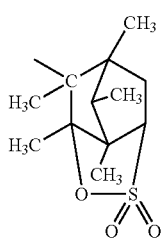
[Chemical Formula 29]
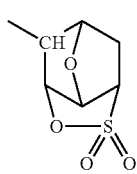
(3-1-18)
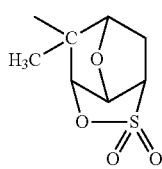
(3-1-19)
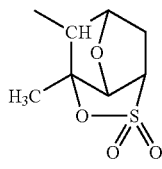
(3-1-20)
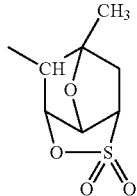
(3-1-21)
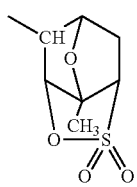
(3-1-22)
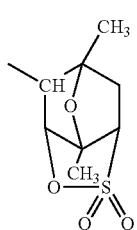
(3-1-23)
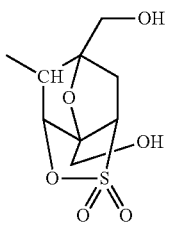
(3-1-24)
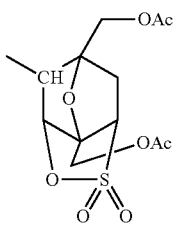
(3-1-25)
[Chemical Formula 30]
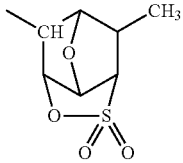
(3-1-26)
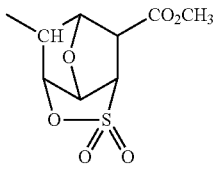
(3-1-27)
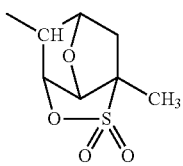
(3-1-28)
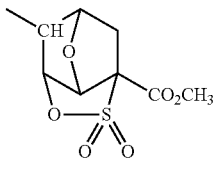
(3-1-29)
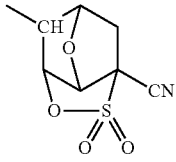
(3-1-30)
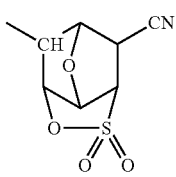
(3-1-31)

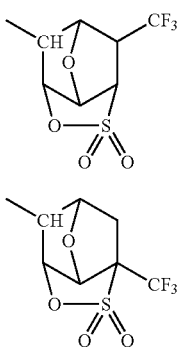

(3-1-32)

(3-1-33)

[Chemical Formula 31]

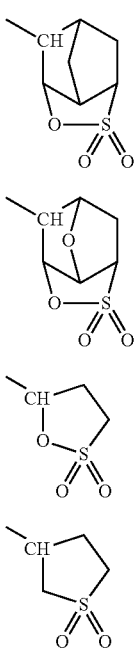

(3-2-1)

(3-2-2)

(3-3-1)

(3-4-1)

Of the groups shown above, the —SO$_2$-containing cyclic group is preferably a group represented by general formula (3-1), more preferably at least one group selected from the group consisting of groups represented by the above chemical formulas (3-1-1), (3-1-18), (3-3-1) and (3-4-1), and most preferably a group represented by chemical formula (3-1-1).

More specific examples of the structural unit (a0) include structural units represented by general formula (a0-0) shown below.

[Chemical Formula 32]

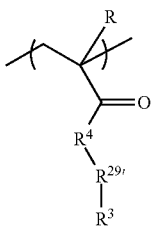

(a0-0)

In the formula, R represents a hydrogen atom, an alkyl group of 1 to 5 carbon atoms or a halogenated alkyl group of 1 to 5 carbon atoms, $R^4$ represents —O— or —NH—, $R^3$ represents an —SO$_2$-containing cyclic group, and $R^{29'}$ represents a single bond or a divalent linking group.

In formula (a0-0), R represents a hydrogen atom, an alkyl group of 1 to 5 carbon atoms or a halogenated alkyl group of 1 to 5 carbon atoms.

The alkyl group of 1 to 5 carbon atoms for R is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for R is a group in which some or all of the hydrogen atoms of an aforementioned alkyl group of 1 to 5 carbon atoms have each been substituted with a halogen atom. Examples of the halogen atom include a fluorine atom, a chlorine atom, a bromine atom and an iodine atom. A fluorine atom is particularly desirable.

As R, a hydrogen atom, an alkyl group of 1 to 5 carbon atoms or a fluorinated alkyl group of 1 to 5 carbon atoms is preferable, and in terms of industrial availability, a hydrogen atom or a methyl group is the most desirable.

In formula (a0-0), $R^4$ represents —O— or —NH—.

In formula (a0-0), $R^3$ is the same as the —SO$_2$-containing cyclic group described above.

$R^{29'}$ may be either a single bond or a divalent linking group. A divalent linking group is preferable in terms of achieving superior effects for the present invention.

Examples of the divalent linking group for $R^{29'}$ include the same divalent linking groups as those described above for $Y^2$ in general formula (a1-0-2) within the description relating to the structural unit (a1).

As the divalent linking group for $R^{29'}$, alkylene groups, divalent alicyclic hydrocarbon groups, and divalent linking groups containing a hetero atom are preferred. Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above for the aliphatic hydrocarbon group for $Y^2$.

As the divalent linking group containing an ester linkage, groups represented by general formula: —$R^2$—C(=O)—O— (wherein $R^2$ represents a divalent linking group) are preferred. In other words, the structural unit (a0) is preferably a structural unit represented by general formula (a0-0-1) shown below.

[Chemical Formula 33]

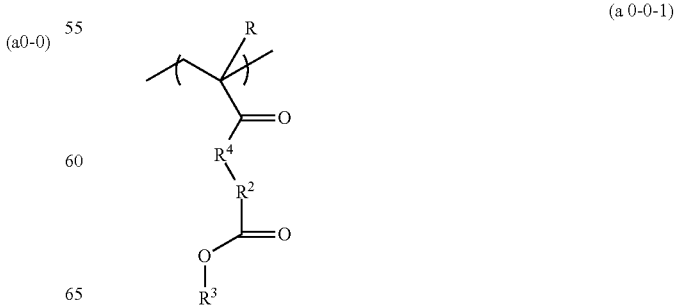

(a0-0-1)

In the formula, R represents a hydrogen atom, an alkyl group of 1 to 5 carbon atoms or a halogenated alkyl group of 1 to 5 carbon atoms, $R^4$ represents —O— or —NH—, $R^2$ represents a divalent linking group, and $R^3$ represents an —SO$_2$-containing cyclic group.

There are no particular limitations on $R^2$, and the same groups as the divalent linking group described above for $R^{29'}$ in general formula (a0-0) may be used.

The divalent linking group for $R^2$ is preferably a linear or branched alkylene group, a divalent alicyclic hydrocarbon group, or a divalent linking group containing a hetero atom.

Examples of the linear or branched alkylene group, divalent alicyclic hydrocarbon group, and divalent linking group containing a hetero atom include the same linear or branched alkylene groups, divalent alicyclic hydrocarbon groups, and divalent linking groups containing a hetero atom as those described above as preferred groups for $R^{29'}$.

Of the above groups, a linear or branched alkylene group, or a divalent linking group containing an oxygen atom as a hetero atom is preferred.

As the linear alkylene group, a methylene group or ethylene group is preferred, and a methylene group is particularly desirable.

As the branched alkylene group, an alkylmethylene group or alkylethylene group is preferred, and —CH(CH$_3$)—, —C(CH$_3$)$_2$— and —C(CH$_3$)$_2$CH$_2$— are particularly desirable.

The divalent linking group containing an oxygen atom is preferably a divalent linking group containing an ether linkage or an ester linkage, and is more preferably a group represented by one of the above formulas —Y$^{21}$—O—Y$^{22}$—, —[Y$^{21}$—C(=O)—O]$_{m'}$—Y$^{22}$—, or —Y$^{21}$—O—C(=O)—Y$^{22}$—. m' is an integer of 0 to 3.

Among these, groups represented by the formula —Y$^{21}$—O—C(=O)—Y$^{22}$— are preferred, and groups represented by —(CH$_2$)$_c$—C(=O)—O—(CH$_2$)$_d$— are particularly desirable. c represents an integer of 1 to 5, and is preferably 1 or 2. d represents an integer of 1 to 5, and is preferably 1 or 2.

As the structural unit (a0), structural units represented by general formula (a0-O-11) or (a0-0-12) shown below are preferred, and structural units represented by formula (a0-0-12) are particularly desirable.

[Chemical Formula 34]

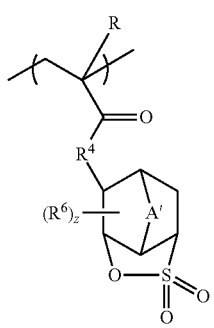

(a0-0-11)

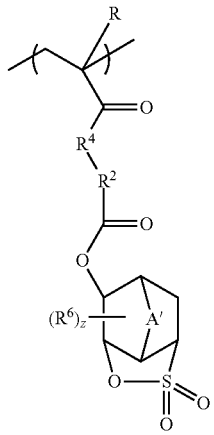

(a0-0-12)

In the formulas, R, $R^4$, A', $R^6$, z and $R^2$ are each the same as defined above.

In formula (a0-0-11), A' is preferably a methylene group, an ethylene group, an oxygen atom (—O—) or a sulfur atom (—S—).

$R^2$ is preferably a linear or branched alkylene group, or a divalent linking group containing an oxygen atom. Examples of the linear or branched alkylene group and the divalent linking group containing an oxygen atom for $R^2$ include the same linear or branched alkylene groups and divalent linking groups containing an oxygen atom described above.

As the structural unit represented by formula (a0-0-12), structural units represented by general formulas (a0-0-12a) and (a0-0-12b) shown below are particularly desirable.

[Chemical Formula 35]

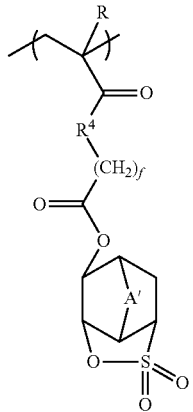

(a0-0-12a)

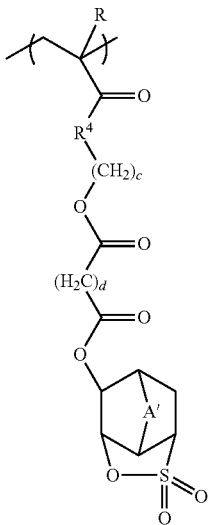

(a0-0-12b)

In the above formulas, R, $R^4$ and A' are each the same as defined above, and c, d and f each represents an integer of 1 to 3.

The structural unit (a0) within the component (A1) may be a single type of structural unit, or may be two or more types of structural units.

The amount of the structural unit (a0) within the component (A1), based on the combined total of all the structural units that constitute the component (A1), is preferably within a range from 1 to 60 mol %, more preferably from 5 to 55 mol %, still more preferably from 10 to 50 mol %, and most preferably from 15 to 50 mol %, as such an amount yields a favorable shape for a resist pattern formed using a resist composition containing the component (A1), and also produces excellent lithography properties such as EL, LWR, and mask reproducibility.

[Structural Unit (a2)]

The structural unit (a2) is a structural unit which is derived from an acrylate ester in which the hydrogen atom bonded to the carbon atom on the α-position may be substituted with a substituent, and contains a lactone-containing cyclic group.

The term "lactone-containing cyclic group" refers to a cyclic group including one ring containing a —O—C(=O)— structure (a lactone ring). This lactone ring is counted as the first ring. A lactone-containing cyclic group in which the only ring structure is the lactone ring is referred to as a monocyclic group, and groups containing other ring structures are described as polycyclic groups, regardless of the structure of the other rings.

When the component (A1) is used for forming a resist film, the lactone-containing cyclic group of the structural unit (a2) is effective in improving the adhesion between the resist film and the substrate, and increasing the compatibility with a developing solution containing water (particularly in the case of an alkali developing process).

As the structural unit (a2), there are no particular limitations, and an arbitrary structural unit may be used.

Specific examples of lactone-containing monocyclic groups include groups in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone.

Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 36]

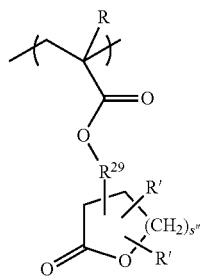

(a2-1)

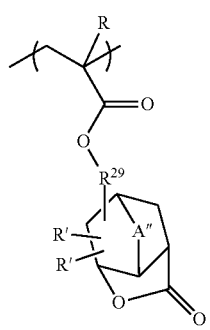

(a2-2)

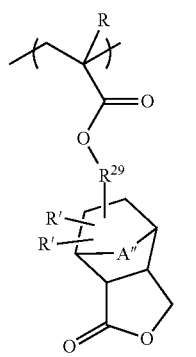

(a2-3)

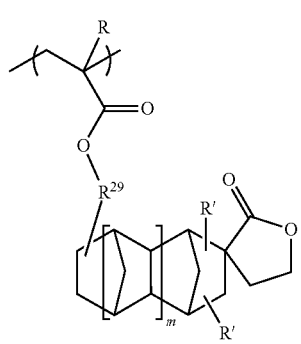

(a2-4)

-continued (a2-5)

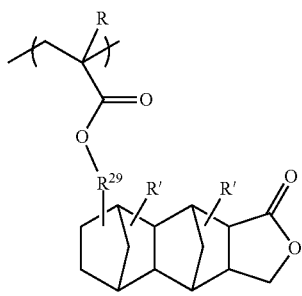

In the formulas, R represents a hydrogen atom, a lower alkyl group or a halogenated lower alkyl group, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents an integer of 0 or 1 to 2, A" represents an oxygen atom, a sulfur atom or an alkylene group of 1 to 5 carbon atoms which may contain an oxygen atom or a sulfur atom, and m represents an integer of 0 or 1.

In general formulas (a2-1) to (a2-5), R is the same as defined above for R in the structural unit (a1).

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of factors such as industrial availability, R' is preferably a hydrogen atom.

R" is preferably a hydrogen atom or a linear, branched or cyclic alkyl group of 1 to 15 carbon atoms.

When R" is a linear or branched alkyl group, the alkyl group preferably contains 1 to 10 carbon atoms, and more preferably 1 to 5 carbon atoms When R" is a cyclic alkyl group, the alkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, more preferably an alkylene group of 1 to 5 carbon atoms, and most preferably a methylene group.

$R^{29}$ represents a single bond or a divalent linking group. Examples of the divalent linking group include the same divalent linking groups as those described above for $Y^2$ in general formula (a1-0-2). Among these groups, an alkylene group, an ester linkage (—C(=O)—O—), or a combination of an alkylene group and an ester linkage is preferred. The alkylene group as the divalent linking group for $R^{29}$ is preferably a linear or branched alkylene group. Specific examples include the same linear alkylene groups and branched alkylene groups as those described above for the aliphatic hydrocarbon group for $Y^2$.

s" is preferably an integer of 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 37]

(a2-1-1)

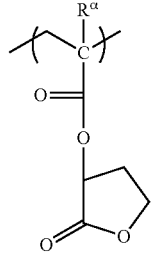

(a2-1-2)

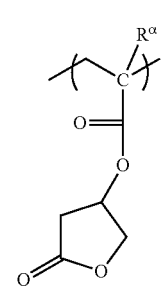

(a2-1-3)

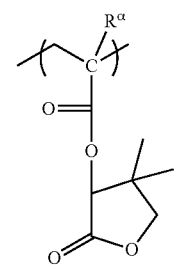

(a2-1-4)

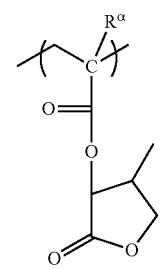

(a2-1-5)

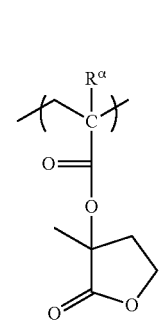

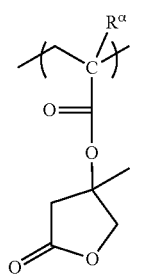 (a2-1-6)
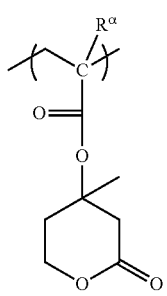 (a2-1-7)
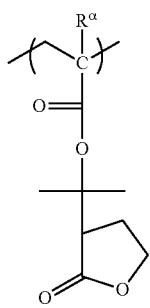 (a2-1-8)
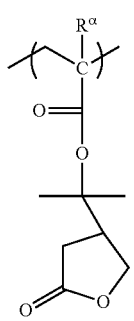 (a2-1-9)
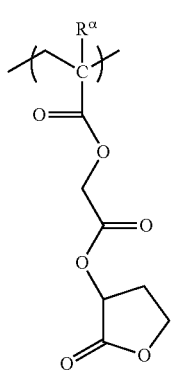 (a2-1-10)
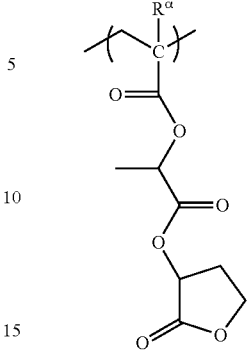 (a2-1-11)
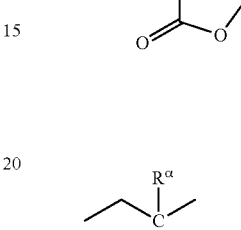 (a2-1-12)
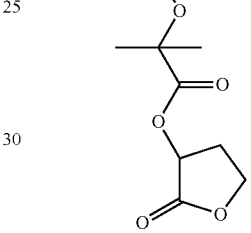 (a2-1-13)
[Chemical Formula 38]
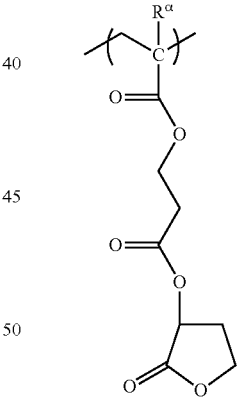 (a2-2-1)

(a2-2-2) 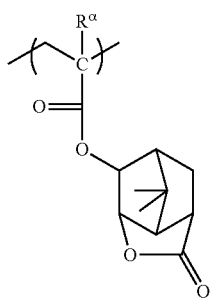
(a2-2-3) 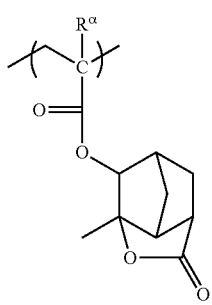
(a2-2-4) 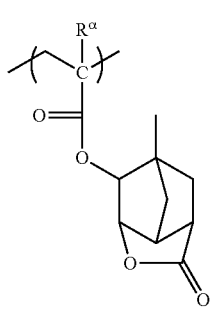
(a2-2-5) 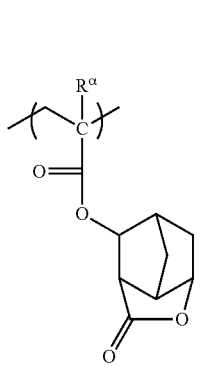
(a2-2-6) 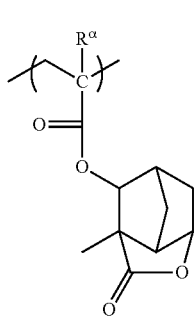
(a2-2-7) 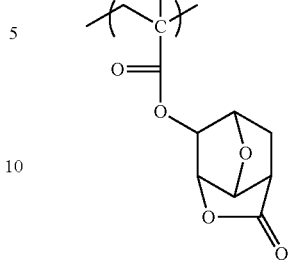
(a2-2-8) 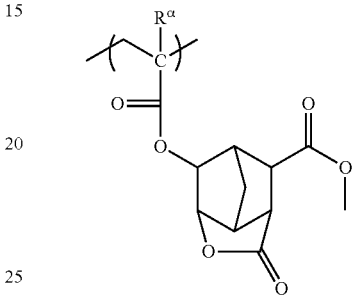
(a2-2-9) 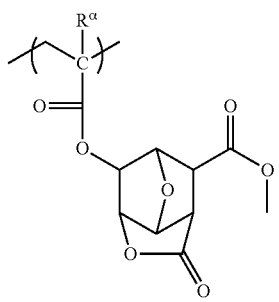
(a2-2-10) 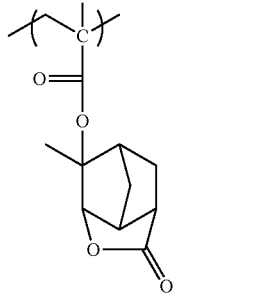
(a2-2-11) 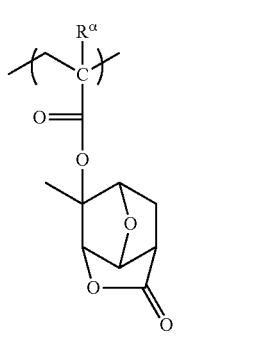

(a2-2-12)
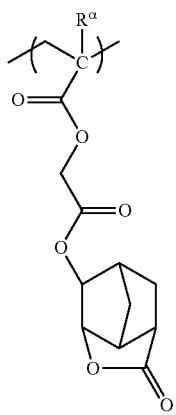
(a2-2-13)
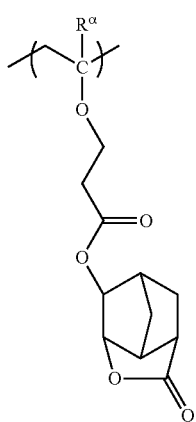
(a2-2-14)
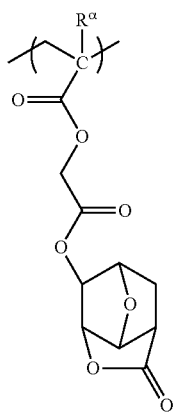
(a2-2-15)
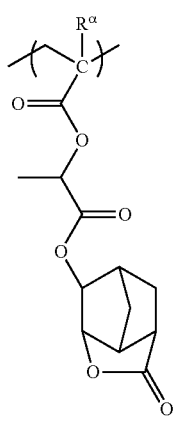
(a2-2-16)
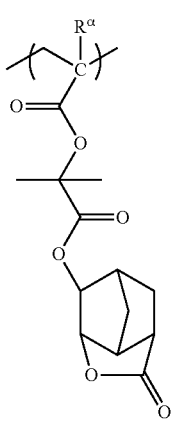
(a2-2-17)
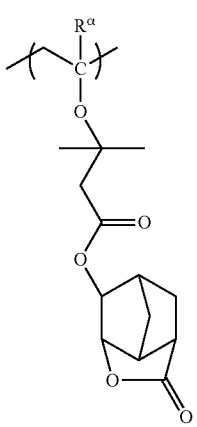
[Chemical Formula 39]
(a2-3-1)
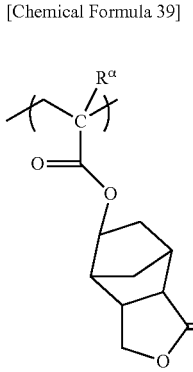
(a2-3-2)
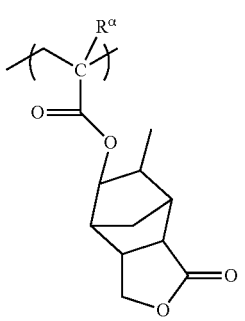

(a2-3-3)
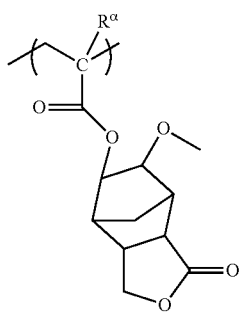
(a2-3-4)
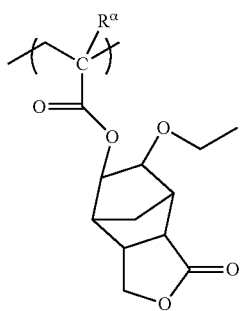
(a2-3-5)
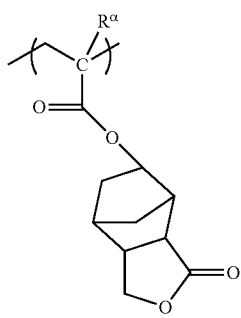
[Chemical Formula 40]
(a2-4-1)
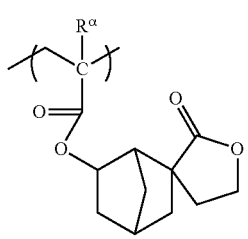
(a2-4-2)
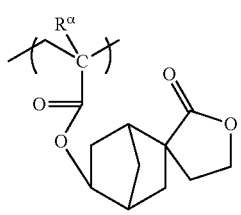
(a2-4-3)
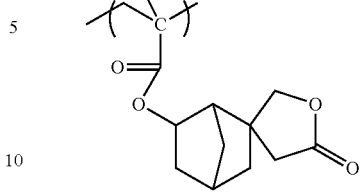
(a2-4-4)
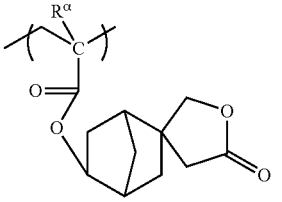
(a2-4-5)
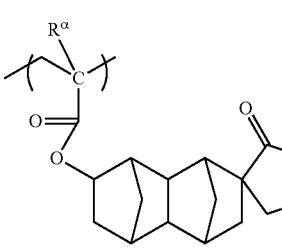
(a2-4-6)
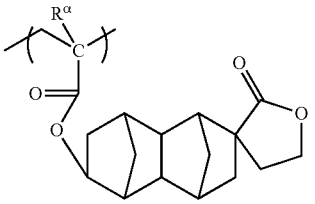
(a2-4-7)
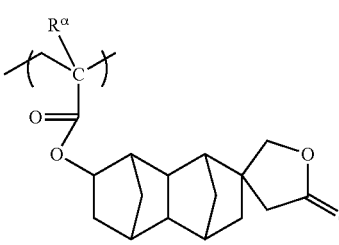
(a2-4-8)
(a2-4-9)
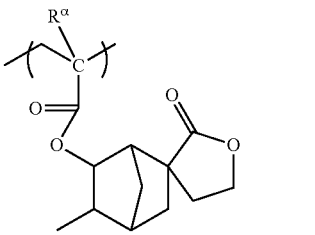

(a2-4-10)
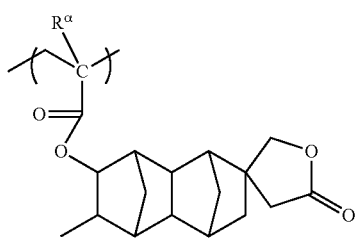
(a2-4-11)
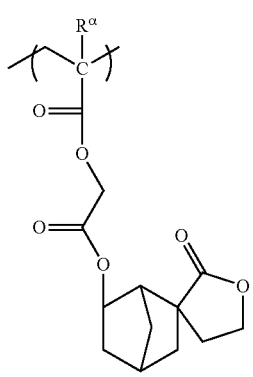
(a2-4-12)
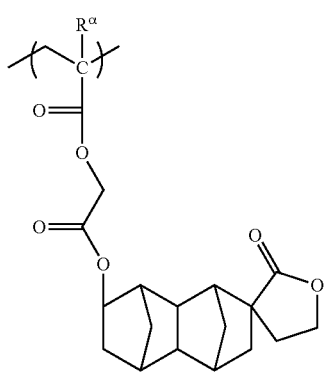
[Chemical Formula 41]
(a2-5-1)
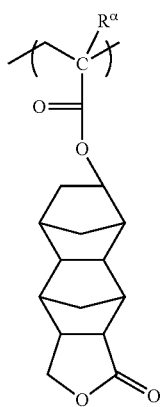
(a2-5-2)
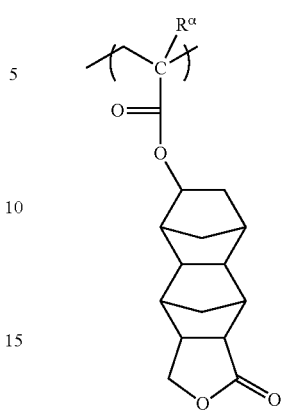
(a2-5-3)
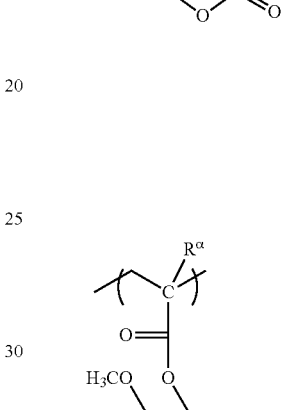
(a2-5-4)
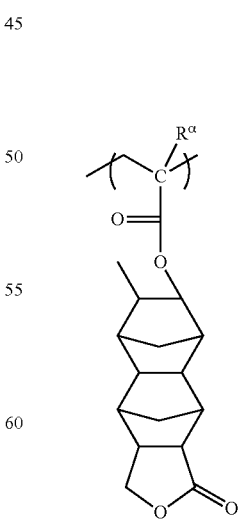

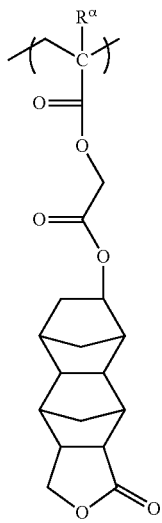

(a2-5-5)

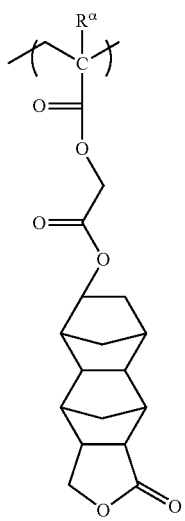

(a2-5-6)

The structural unit (a2) within the component (A1) may be a single type of structural unit, or may be two or more types of structural units.

The structural unit (a2) is preferably at least one structural unit selected from the group consisting of structural units represented by the above general formulas (a2-1) to (a2-5), and is more preferably at least one structural unit selected from the group consisting of structural units represented by the above general formulas (a2-1) to (a2-3). Among these, the use of one or more structural units selected from the group consisting of structural units represented by the chemical formulas (a2-1-1), (a2-1-2), (a2-2-1), (a2-2-7), (a2-3-1) and (a2-3-5) is particularly desirable.

The amount of the structural unit (a2) within the component (A1), based on the combined total of all the structural units that constitute the component (A1), is preferably within a range from 5 to 60 mol %, more preferably from 10 to 50 mol %, and still more preferably from 10 to 45 mol %. Ensuring that the amount of the structural unit (a2) is at least as large as the lower limit of the aforementioned range enables the effects achieved be including the structural unit (a2) to be satisfactorily realized, whereas by ensuring that the amount is not more than the upper limit of the above range, a good balance can be achieved with the other structural units.

[Other Structural Units]

The component (A1) may also include structural units other than the structural unit (a5), the structural unit (a1), the structural unit (a0) and the structural unit (a2) described above, provided that the effects of the present invention are not impaired.

There are no particular limitations on these other structural units, and any other structural unit which cannot be classified as one of the above structural units may be used. For example, any of the multitude of conventional structural units used within resist resins for ArF excimer lasers or KrF excimer lasers (and particularly for ArF excimer lasers) can be used.

Specific examples of these other structural units include a structural unit (a3), which is derived from an acrylate ester in which the hydrogen atom bonded to the carbon atom on the α-position may be substituted with a substituent, and contains a polar group-containing aliphatic hydrocarbon group, and a structural unit (a4), which is derived from an acrylate ester in which the hydrogen atom bonded to the carbon atom on the α-position may be substituted with a substituent, and contains a non-acid-dissociable aliphatic polycyclic group.

(Structural Unit (a3))

The structural unit (a3) is a structural unit which is derived from an acrylate ester in which the hydrogen atom bonded to the carbon atom on the α-position may be substituted with a substituent, and contains a polar group-containing aliphatic hydrocarbon group (but excluding those units that may be classified as any of the above-described structural units).

By including the structural unit (a3) within the component (A1), the hydrophilicity of the component (A1) is improved, which contributes to an improvement in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, and most preferably contains 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid, whereas when the hydrocarbon group is a polycyclic group, structural units represented by formulas (a3-1), (a3-2) and (a3-3) shown below are preferable.

[Chemical Formula 42]

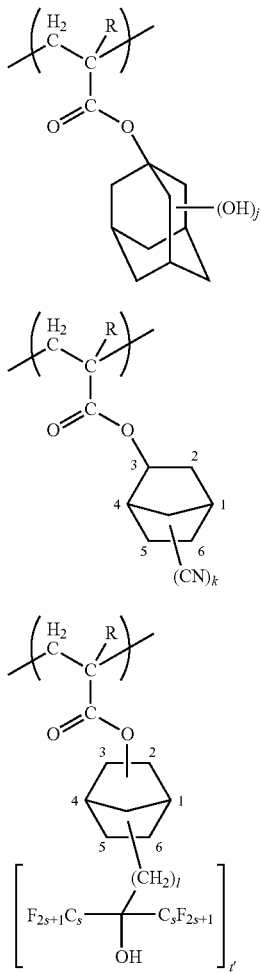

In the formulas, R is the same as defined above, j represents an integer of 1 to 3, k represents an integer of 1 to 3, t' represents an integer of 1 to 3, l represents an integer of 1 to 5, and s represents an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

The structural unit (a3) within the component (A1) may be a single type of structural unit, or may be two or more types of structural units.

The amount of the structural unit (a3) within the component (A1), based on the combined total of all the structural units that constitute the component (A1), is preferably within a range from 5 to 50 mol %, more preferably from 5 to 40 mol %, and still more preferably from 5 to 25 mol %. By ensuring that the amount of the structural unit (a3) is at least as large as the lower limit of the above range, the effects generated by including the structural unit (a3) are obtained satisfactorily, whereas by ensuring that the amount is not more than the upper limit of the above range, a good balance can be achieved with the other structural units.

(Structural Unit (a4))

The structural unit (a4) is a structural unit which is derived from an acrylate ester in which the hydrogen atom bonded to the carbon atom on the α-position may be substituted with a substituent, and contains a non-acid-dissociable aliphatic polycyclic group.

In the structural unit (a4), examples of the above polycyclic group include the same polycyclic groups as those described above in connection with the structural unit (a1), and any of the multitude of conventional polycyclic groups used within the resin component of resist compositions designed for use with ArF excimer lasers or KrF excimer lasers (and particularly for ArF excimer lasers) can be used.

In terms of industrial availability and the like, at least one polycyclic group selected from among a tricyclodecyl group, adamantyl group, tetracyclododecyl group, isobornyl group and norbornyl group is particularly desirable. These polycyclic groups may also include a linear or branched alkyl group of 1 to 5 carbon atoms as a substituent.

Specific examples of the structural unit (a4) include units with structures represented by general formulas (a-4-1) to (a-4-5) shown below.

[Chemical Formula 43]

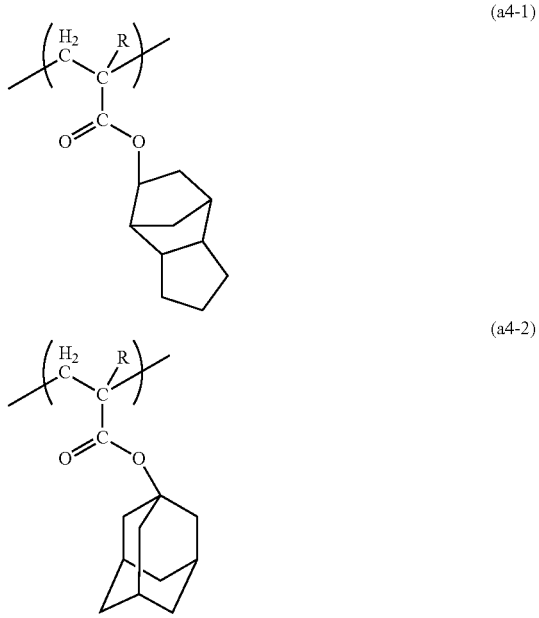

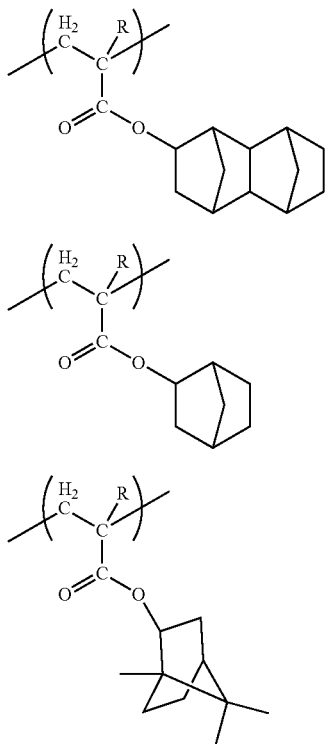

In the formulas, R is the same as defined above.

When the structural unit (a4) is included in the component (A1), the amount of the structural unit (a4), based on the combined total of all the structural units that constitute the component (A1), is preferably within the range from 1 to 30 mol %, and more preferably from 10 to 20 mol %.

In the resist composition of the present invention, the component (A) includes the polymeric compound (A1) that contains the structural unit (a5).

The component (A1) is preferably a polymeric compound containing the structural unit (a5) and the structural unit (a1).

Specific examples of the component (A1) include polymeric compounds consisting of the structural units (a5), (a1) and (a0), polymeric compounds consisting of the structural units (a5), (a1) and (a2), and polymeric compounds consisting of the structural units (a5), (a1), (a0) and (a2).

Among these, polymeric compound consisting of the structural units (a5), (a1) and (a0) are more preferred, and polymeric compounds consisting of the structural unit (a5), the structural unit represented by the above formula (a1-0-11), the structural unit represented by the above formula (a1-0-12), and the structural unit (a0) are particularly desirable.

The component (A) may employ a single component (A1), or a combination of two or more types of the component (A1).

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. By ensuring that the weight average molecular weight is not more than the upper limit of the aforementioned range, the component (A1) exhibits satisfactory solubility in a resist solvent when used as a resist, whereas by ensuring that the weight average molecular weight is at least as large as the lower limit of the aforementioned range, dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn is the number-average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1). Such a copolymer having an introduced hydroxyalkyl group in which some of the hydrogen atoms of the alkyl group have been substituted with fluorine atoms is effective in reducing developing defects and LER (line edge roughness: unevenness in the side walls of a line pattern).

In terms of the monomers used for forming each of the structural units, either commercially available monomers may be used, or the monomers may be synthesized using conventional methods.

In the resist composition of the present invention, the component (A) may also contain another base component which exhibits increased polarity under the action of acid but does not correspond with the above definition for the component (A1).

There are no particular limitations on this other base component which does not correspond with the above definition for the component (A1), and any of the multitude of conventional base components used within chemically amplified resist compositions can be used as appropriate, including polymeric compounds containing the above-mentioned structural unit (a1) as an essential component, and optionally containing any of the above structural units (a2) to (a4) or (a0), other base resins such as novolac resins and polyhydroxystyrene (PHS)-based resins, and low molecular weight compound components.

Examples of the low molecular weight compound components include low molecular weight compounds having a molecular weight of at least 500 but less than 4,000 that include both a hydrophilic group and an acid-dissociable group such as those described above in connection with the component (A1). Specific examples of these low molecular weight compounds include compounds having a plurality of phenol structures in which some of the hydrogen atoms of the hydroxyl groups have each been substituted with an aforementioned acid-dissociable group.

The proportion of the component (A1) within the component (A), based on the total weight of the component (A), is preferably not less than 25% by weight, more preferably 50% by weight or more, and still more preferably 75% by weight or more. The amount of the component (A1) may also represent 100% by weight of the component (A). Provided the amount is not less than 25% by weight, a resist pattern having superior resolution and a favorable shape with a high degree of rectangularity can be more readily formed.

In the resist composition, the amount of the component (A) can be adjusted appropriately depending on factors such as the thickness of the resist film to be formed.

<Component (B)>

In the resist composition of the present invention, there are no particular limitations on the component (B), and any of the known acid generators used in conventional chemically amplified resist compositions can be used.

Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

As an onium salt acid generator, compounds represented by general formula (b-1) or (b-2) shown below may be used.

[Chemical Formula 44]

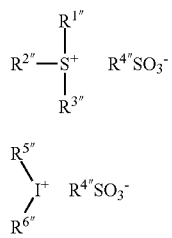

In the formulas, each of $R^{1\prime\prime}$ to $R^{3\prime\prime}$, $R^{5\prime\prime}$ and $R^{6\prime\prime}$ independently represents an aryl group which may have a substituent, an alkyl group or an alkenyl group, wherein two of $R^{1\prime\prime}$ to $R^{3\prime\prime}$ in formula (b-1) may be bonded to each other to form a ring together with the sulfur atom in the formula, and $R^{4\prime\prime}$ represents an alkyl group, halogenated alkyl group, aryl group or alkenyl group, which may have a substituent.

In formula (b-1), each of $R^{1\prime\prime}$ to $R^{3\prime\prime}$ independently represents an aryl group which may have a substituent, an alkyl group or an alkenyl group. Two of $R^{1\prime\prime}$ to $R^{3\prime\prime}$ may be bonded to each other to form a ring together with the sulfur atom in the formula.

Further, in terms of achieving better improvement in the lithography properties and the resist pattern shape, it is preferable that at least one of $R^{1\prime\prime}$ to $R^{3\prime\prime}$ is an aryl group, more preferable that two or more of $R^{1\prime\prime}$ to $R^{3\prime\prime}$ are aryl groups, and most preferable that all of $R^{1\prime\prime}$ to $R^{3\prime\prime}$ are aryl groups.

Examples of the aryl group for $R^{1\prime\prime}$ to $R^{3\prime\prime}$ include unsubstituted aryl groups of 6 to 20 carbon atoms, and substituted aryl groups in which some or all of the hydrogen atoms of an aforementioned unsubstituted aryl group have each been substituted with an alkyl group, alkoxy group, halogen atom, hydroxyl group, oxo group (=O), aryl group, alkoxyalkyloxy group, alkoxycarbonylalkyloxy group, —C—(=O)—O—$R^{6\prime}$, —O—C(=O)—$R^{7\prime}$ or —O—$R^{8\prime}$. Each of $R^{6\prime}$, $R^{7\prime}$ and $R^{8\prime}$ represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The unsubstituted aryl group for $R^{1\prime\prime}$ to $R^{3\prime\prime}$ is preferably an aryl group of 6 to 10 carbon atoms because such groups enable lower cost synthesis. Specific examples include a phenyl group and a naphthyl group.

The alkyl group as the substituent for the substituted aryl group for $R^{1\prime\prime}$ to $R^{3\prime\prime}$ is preferably an alkyl group having 1 to 5 carbon atoms, and most preferably a methyl group, ethyl group, propyl group, n-butyl group, or tert-butyl group.

The alkoxy group as the substituent for the substituted aryl group is preferably an alkoxy group having 1 to 5 carbon atoms, and most preferably a methoxy group, ethoxy group, n-propoxy group, iso-propoxy group, n-butoxy group or tert-butoxy group.

The halogen atom as the substituent for the substituted aryl group is preferably a fluorine atom.

Examples of the aryl group as the substituent for the substituted aryl group include the same aryl groups as those described above for $R^{1\prime\prime}$ to $R^{3\prime\prime}$, and of these, aryl groups of 6 to 20 carbon atoms are preferred, aryl groups of 6 to 10 carbon atoms are more preferred, and a phenyl group or naphthyl group is particularly desirable.

Examples of the alkoxyalkyloxy group as the substituent for the substituted aryl group include groups represented by the general formula shown below.)

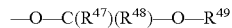

In this formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms and may be either linear or branched, is preferably an ethyl group or a methyl group, and is most preferably a methyl group.

It is preferable that at least one of $R^{47}$ and $R^{48}$ is a hydrogen atom, and it is particularly desirable that either one of $R^{47}$ and $R^{48}$ is a hydrogen atom and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and examples thereof include a methyl group, ethyl group, propyl group, n-butyl group or tert-butyl group.

The cyclic alkyl group for $R^{49}$ preferably has 4 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

Examples of the alkoxycarbonylalkyloxy group as the substituent for the substituted aryl group include groups represented by the general formula shown below.

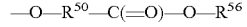

In this formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, ethylene group, trimethylene group, tetramethylene group and 1,1-dimethyl ethylene group.

Examples of the tertiary alkyl group for $R^{56}$ include a 2-methyl-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1- methylbutyl group, 1-(1-cyclohexyl)-1-methylpentyl group, tert-butyl group, tert-pentyl group and tert-hexyl group.

Moreover, groups in which $R^{56}$ in the general formula —O—$R^{50}$—C(=O)—O—$R^{56}$ has been substituted with $R^{56'}$ may also be used. $R^{56'}$ represents a hydrogen atom, an alkyl group, a fluorinated alkyl group, or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which some or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which one or more hydrogen atoms within an aliphatic cyclic group have each been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

For $R^{56'}$, specific examples of the aliphatic cyclic groups containing a hetero atom within the ring structure include groups represented by formulas (L1) to (L6) and (S1) to (S4) shown below.

For $R^{56'}$, specific examples of the groups in which one or more hydrogen atoms within the aliphatic cyclic group have been substituted with a hetero atom include groups in which two hydrogen atoms within an aliphatic cyclic group have been substituted with an oxygen atom (=O).

Each of $R^{6'}$, $R^{7'}$ and $R^{8'}$ in the formulas —C—(=O)—O—$R^{6'}$, —O—C(=O)—$R^{7'}$ or —O—$R^{8'}$ represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The linear or branched saturated hydrocarbon group contains 1 to 25 carbon atoms, preferably 1 to 15 carbon atoms, and more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group, excluding tertiary alkyl groups, include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxygen atom (=O), cyano group or carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom or iodine atom, and a fluorine atom is preferable.

Examples of the halogenated alkyl group as a substituent for the linear or branched saturated hydrocarbon group include groups in which some or all of the hydrogen atoms within an aforementioned linear or branched saturated hydrocarbon group have each been substituted with an aforementioned halogen atom.

The cyclic saturated hydrocarbon group of 3 to 20 carbon atoms for $R^{6'}$, $R^{7'}$ and $R^{8'}$ may be either a polycyclic group or a monocyclic group. Examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, some of the carbon atoms that constitute the ring within the cyclic saturated hydrocarbon group may be substituted with a hetero atom, or a hydrogen atom bonded to the ring within the cyclic saturated hydrocarbon group may be substituted with a substituent.

Examples of the former case include groups in which one or more hydrogen atoms have been removed from a heterocycloalkane in which some of the carbon atoms that constitute the ring(s) of an aforementioned monocycloalkane or a polycycloalkane have been substituted with a hetero atom such as an oxygen atom, sulfur atom or nitrogen atom. Further, the ring structure may include an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a lactone ring-containing bicycloalkane, tricycloalkane or tetracycloalkane.

In the latter case, examples of the substituent include the same substituents as those described above for the linear or branched saturated hydrocarbon group, or a lower alkyl group.

Further, $R^{6'}$, $R^{7'}$ and $R^{8'}$ may be a combination of a linear or branched alkyl group and a cyclic alkyl group.

Examples of combinations of a linear or branched alkyl group and a cyclic alkyl group include groups in which a cyclic alkyl group is bonded as a substituent to a linear or branched alkyl group, and groups in which a linear or branched alkyl group is bonded as a substituent to a cyclic alkyl group.

Examples of the linear aliphatic unsaturated hydrocarbon group for $R^{6'}$, $R^{7'}$ and $R^{8'}$ include a vinyl group, propenyl group (allyl group), and butynyl group.

Examples of the branched aliphatic unsaturated hydrocarbon group for $R^{6'}$, $R^{7'}$ and $R^{8'}$ include a 1-methylpropenyl group and 2-methylpropenyl group.

The linear or branched aliphatic unsaturated hydrocarbon group may have a substituent. Examples of the substituent include the same substituents as those described above for the linear or branched saturated hydrocarbon group.

Of the various possibilities described above, each of $R^{7'}$ and $R^{8'}$ is preferably a linear or branched saturated hydrocarbon group of 1 to 15 carbon atoms, or a cyclic saturated hydrocarbon group of 3 to 20 carbon atoms, as such groups yield superior lithography properties and resist pattern shape.

The aryl group for each of $R^{1''}$ to $R^{3''}$ is preferably a phenyl group or a naphthyl group.

Examples of the alkyl group for $R^{1''}$ to $R^{3''}$ include linear, branched and cyclic alkyl groups having 1 to 10 carbon atoms. In terms of achieving excellent resolution, the alkyl group preferably has 1 to 5 carbon atoms. Specific examples include a methyl group, ethyl group, n-propyl group, isopropyl group, n-butyl group, isobutyl group, n-pentyl group, cyclopentyl group, hexyl group, cyclohexyl group, nonyl group and decyl group. A methyl group is most preferable because it yields excellent resolution and enables synthesis to be conducted at a low cost.

The alkenyl group for $R^{1''}$ to $R^{3''}$ preferably has 2 to 10 carbon atoms, more preferably 2 to 5 carbon atoms, and still more preferably 2 to 4 carbon atoms. Specific examples of the alkenyl group include a vinyl group, propenyl group (allyl group), butenyl group, 1-methylpropenyl group and 2-methylpropenyl group.

In those cases where two of $R^{1''}$ to $R^{3''}$ are bonded to each other to form a ring together with the sulfur atom in the formula, the ring including the sulfur atom is preferably a 3- to 10-membered ring, and more preferably a 5- to 7-membered ring.

When two of $R^{1''}$ to $R^{3''}$ are bonded to each other to form a ring together with the sulfur atom in the formula, the remaining one of $R^{1''}$ to $R^{3''}$ is preferably an aryl group. Examples of this aryl group include the same groups as those described above for the aryl group for $R^{1''}$ to $R^{3''}$.

Specific examples of the cation moiety within the compound represented by formula (b-1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

Furthermore, examples of preferred cation moieties within the compound represented by the above formula (b-1) include the cations shown below.

[Chemical Formula 45]

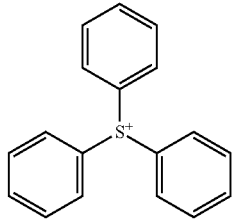

(b-1-1)

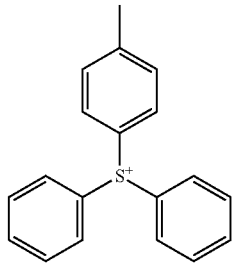

(b-1-2)

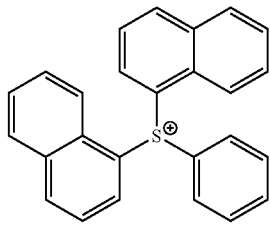

(b-1-3)

[Chemical Formula 46]

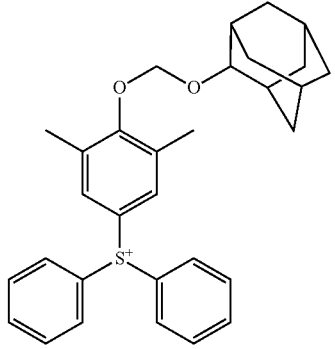

(b-1-4)

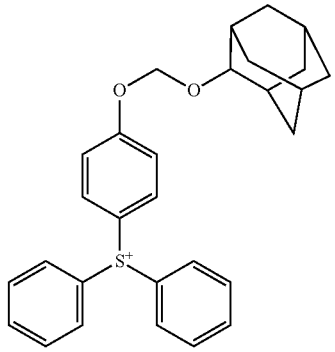

(b-1-5)

(b-1-6) 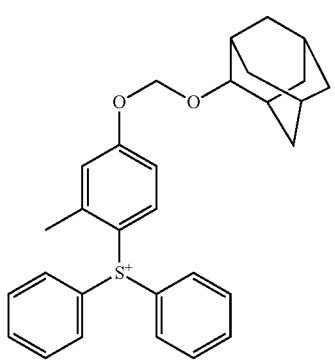
[Chemical Formula 47]
(b-1-7) 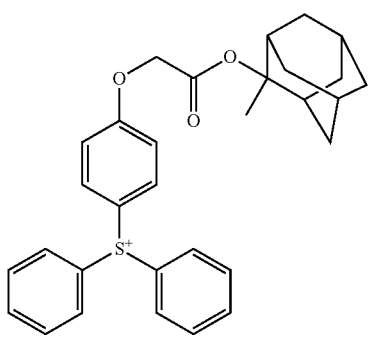
(b-1-8) 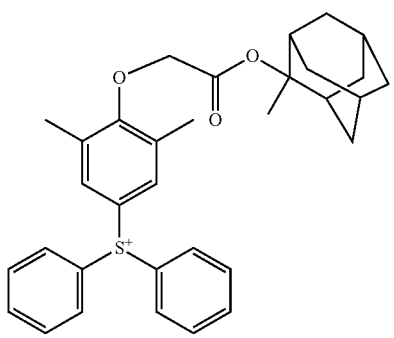
(b-1-9) 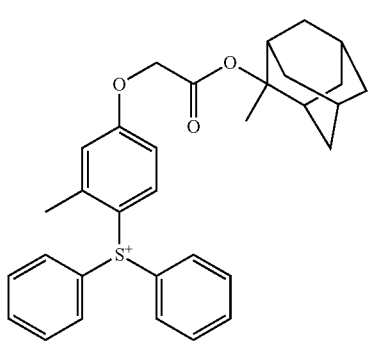
(b-1-10) 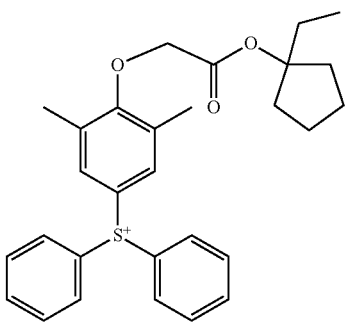
(b-1-11) 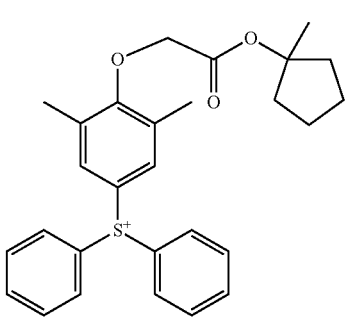
(b-1-12) 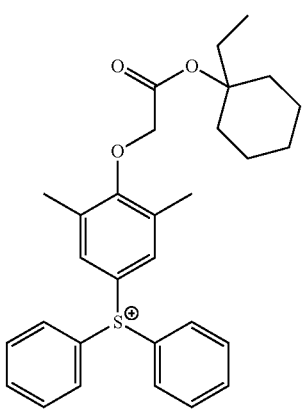
(b-1-13) 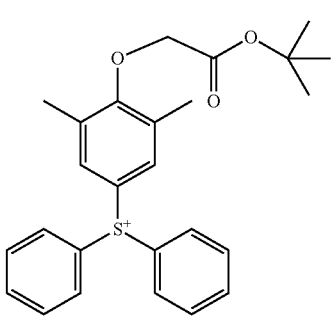

[Chemical Formula 48]
(b-1-14)
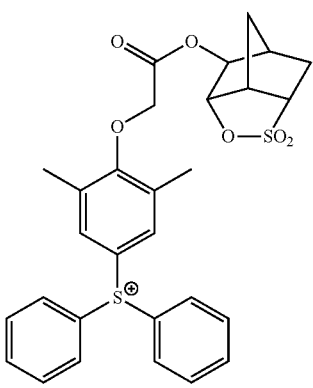
(b-1-15)
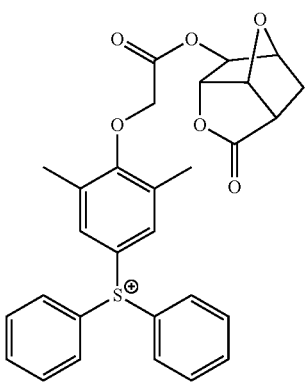
(b-1-16)
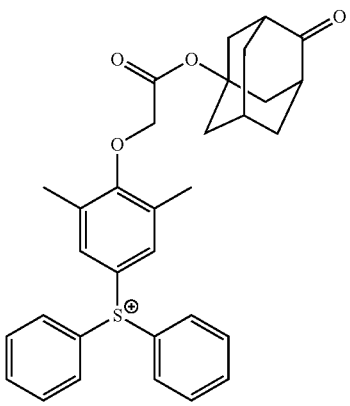
(b-1-17)
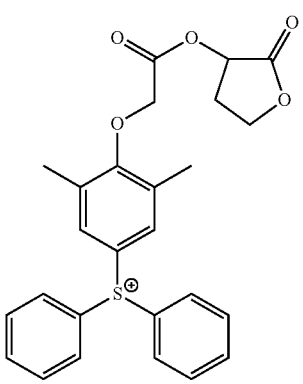
(b-1-18)
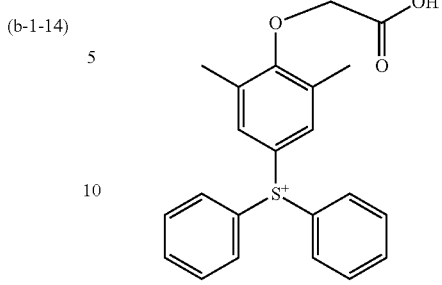
(b-1-19)
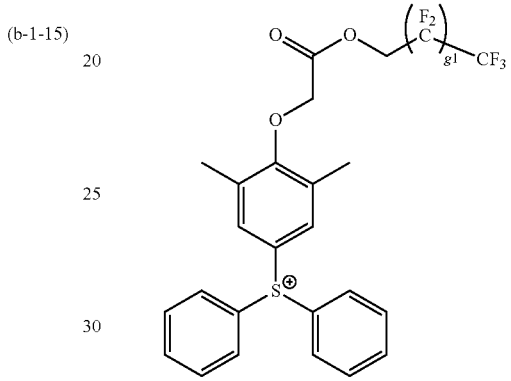
In the above formula, g1 represents the number of repeating units, and is typically an integer of 1 to 5.
[Chemical Formula 49]
(b-1-20)
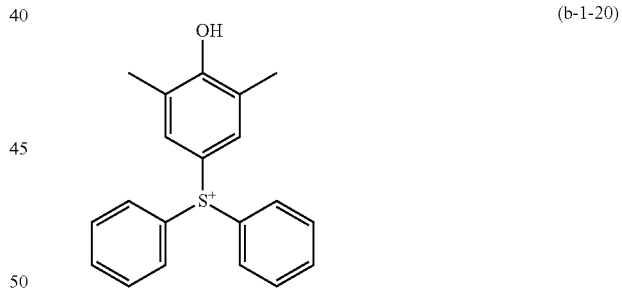
(b-1-21)
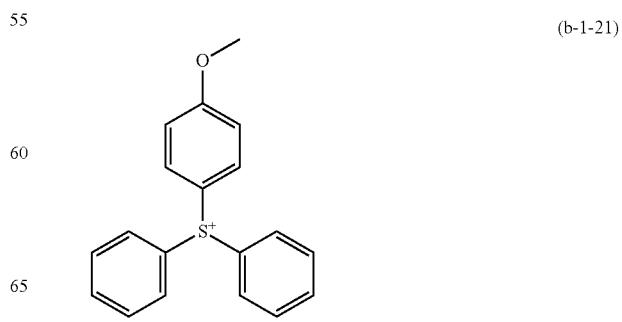

-continued
(b-1-22)
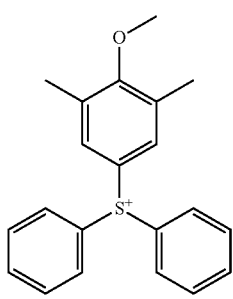
[Chemical Formula 50]
(b-1-23)
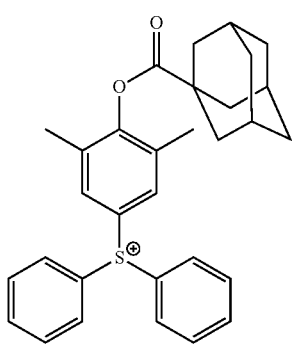
(b-1-24)
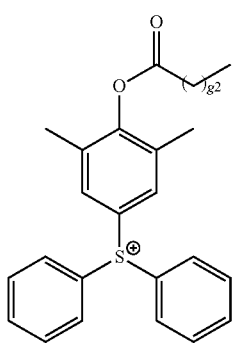
(b-1-25)
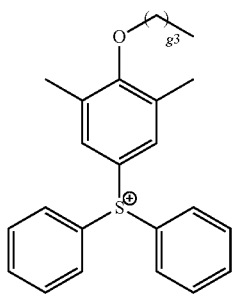
In the above formulas, g2 and g3 represent numbers of repeating units, wherein g2 is an integer of 0 to 20, and g3 is an integer of 0 to 20.
[Chemical Formula 51]
(b-1-26)
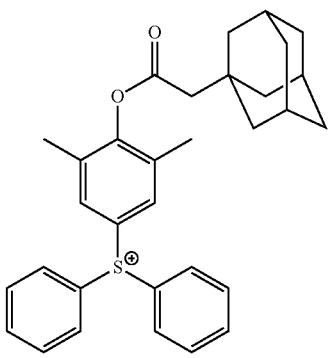
(b-1-27)
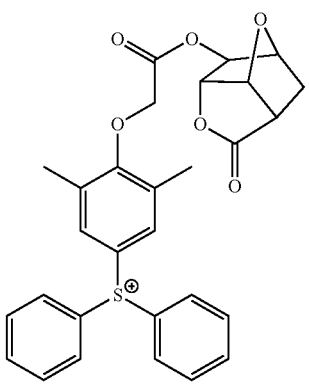
(b-1-28)
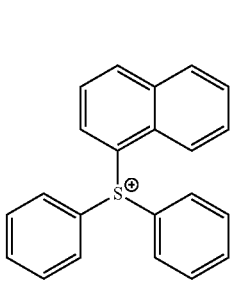
[Chemical Formula 52]
(b-1-29)
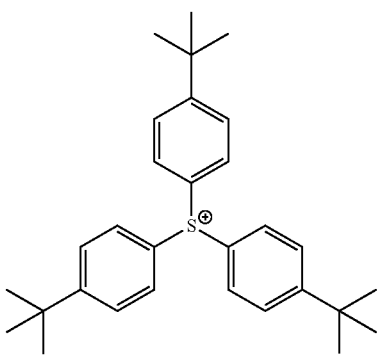

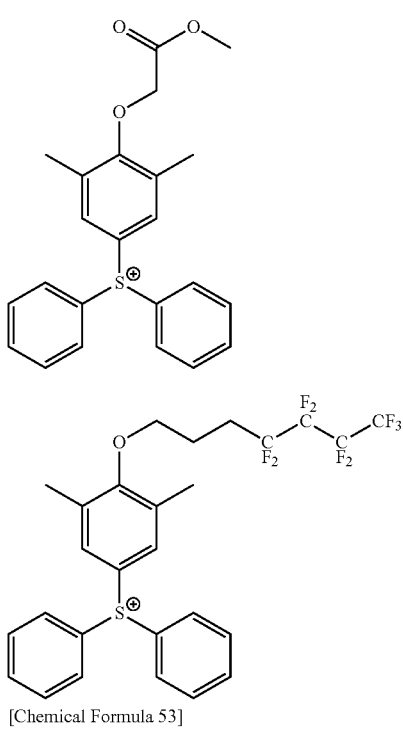

(b-1-30)

(b-1-31)

[Chemical Formula 53]

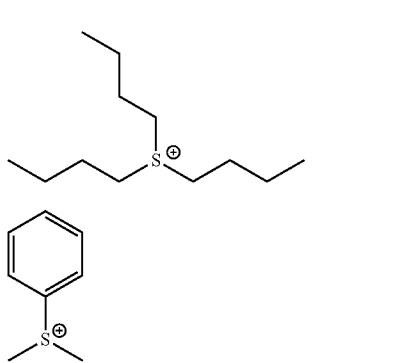

(b-1-32)

(b-1-33)

In the above formula (b-1), $R^{4'''}$ represents an alkyl group, halogenated alkyl group, aryl group or alkenyl group which may have a substituent.

The alkyl group for $R^{4'''}$ may be linear, branched or cyclic.

The linear or branched alkyl group preferably contains 1 to 10 carbon atoms, more preferably 1 to 8 carbon atoms, and most preferably 1 to 4 carbon atoms.

The cyclic alkyl group preferably contains 4 to 15 carbon atoms, more preferably 4 to 10 carbon atoms, and most preferably 6 to 10 carbon atoms.

Examples of the halogenated alkyl group for $R^{4'''}$ include groups in which some or all of the hydrogen atoms within an above-mentioned linear, branched or cyclic alkyl group have each been substituted with a halogen atom. Examples of the halogen atom include a fluorine atom, chlorine atom, bromine atom or iodine atom. A fluorine atom is preferred.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that some or all of the hydrogen atoms within the above-mentioned alkyl group, halogenated alkyl group, aryl group or alkenyl group may each be substituted with a substituent (an atom other than a hydrogen atom, or a group).

$R^{4'''}$ may have one substituent, or two or more substituents.

Examples of the substituent include a halogen atom, a hetero atom, an alkyl group, and a group represented by the formula $X^b$-$Q^1$- (wherein $Q^1$ represents a divalent linking group containing an oxygen atom, and $X^b$ represents a hydrocarbon group of 3 to 30 carbon atoms which may have a substituent).

Examples of the above-mentioned halogen atom and alkyl group include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X^b$-$Q^1$-, $Q^1$ represents a divalent linking group containing an oxygen atom.

$Q^1$ may also contain atoms other than the oxygen atom. Examples of these atoms other than the oxygen atom include a carbon atom, hydrogen atom, oxygen atom, sulfur atom and nitrogen atom.

Examples of the divalent linking group containing an oxygen atom include non-hydrocarbon, oxygen atom-containing linking groups such as an oxygen atom (an ether bond, —O—), an ester linkage (—C(=O)—O—), an amide linkage (—C(=O)—NH—), a carbonyl group (—C(=O)—), a carbonate linkage (—O—C(=O)—O—), and combinations of these non-hydrocarbon, oxygen atom-containing linking groups with an alkylene group.

Specific examples of the combinations of the non-hydrocarbon, oxygen atom-containing linking groups and an alkylene group include —$R^{91}$—O—, —$R^{92}$—O—C(=O)— and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

Specific examples of the alkylene group include a methylene group [—$CH_2$—], alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, an ethylene group [—$CH_2CH_2$—], alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, a trimethylene group (n-propylene group) [—$CH_2CH_2CH_2$—], alkyltrimethylene groups such as —CH($CH_3$)$CH_2CH_2$— and —$CH_2$CH($CH_3$)$CH_2$—, a tetramethylene group [—$CH_2CH_2CH_2CH_2$—], alkyltetramethylene groups such as —CH($CH_3$)$CH_2CH_2CH_2$— and —$CH_2$CH($CH_3$)$CH_2CH_2$—, and a pentamethylene group [—$CH_2CH_2CH_2CH_2CH_2$—].

$Q^1$ is preferably a divalent linking group containing an ester linkage or ether linkage, and is more preferably a group represented by —$R^{91}$—O—, —$R^{92}$—O—C(=O)— or —C(=O)—O—$R^{93}$—O—C(=O)—.

In the group represented by the formula $X^b$-$Q^1$-, the hydrocarbon group for $X^b$ may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within substituents is not included in the number of carbon atoms of the aromatic hydrocarbon group.

Specific examples of the aromatic hydrocarbon group include aryl groups, which are aromatic hydrocarbon rings having one hydrogen atom removed therefrom, such as a phenyl group, biphenylyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, some of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which some of the carbon atoms that constitute the ring within an aforementioned aryl group have been substituted with a hetero atom such as an oxygen atom, a sulfur atom or a nitrogen atom, and heteroarylalkyl groups in which some of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group or oxygen atom (═O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which some or all of the hydrogen atoms within an aforementioned alkyl group have each been substituted with an aforementioned halogen atom.

The aliphatic hydrocarbon group for $X^b$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $X^b$, some of the carbon atoms that constitute the aliphatic hydrocarbon group may be substituted with a substituent containing a hetero atom, and/or some or all of the hydrogen atoms that constitute the aliphatic hydrocarbon group may each be substituted with a substituent containing a hetero atom.

There are no particular limitations on this "hetero atom" within $X^b$, provided it is an atom other than a carbon atom or a hydrogen atom. Examples of the hetero atom include a halogen atom, oxygen atom, sulfur atom and nitrogen atom.

Examples of the halogen atom include a fluorine atom, chlorine atom, iodine atom and bromine atom.

The substituent containing a hetero atom may consist solely of the hetero atom, or may be a group that also contains a group or atom other than the hetero atom.

Specific examples of the substituent for substituting some of the carbon atoms include —O—, —C(═O)—O—, —C(═O)—, —O—C(═O)—O—, —C(═O)—NH—, —NH— (wherein H may be substituted with a substituent such as an alkyl group or an acyl group), —S—, —S(═O)₂— and —S(═O)₂—O—. When the aliphatic hydrocarbon group is cyclic, any of these substituents may be included within the ring structure of the aliphatic hydrocarbon group.

Examples of the substituent for substituting some or all of the hydrogen atoms include an alkoxy group, halogen atom, halogenated alkyl group, hydroxyl group, oxygen atom (═O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which some or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 54]

(L1)
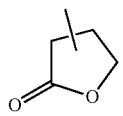

(L2)
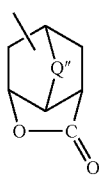

(L3)
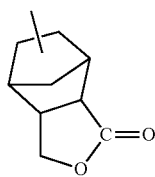

(L4)
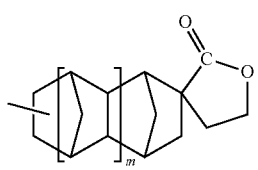

-continued (L5)
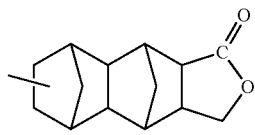

(L6)
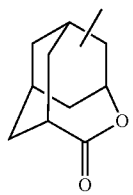

(S1)
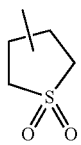

(S2)
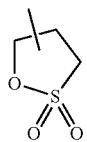

(S3)
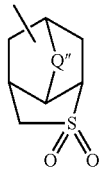

(S4)
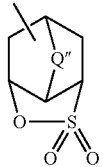

In the formulas, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms), and m represents an integer of 0 or 1.

Examples of the alkylene groups for Q", R$^{94}$ and R$^{95}$ include the same alkylene groups as those described above for R$^{91}$ to R$^{93}$.

In these aliphatic cyclic groups, some of the hydrogen atoms bonded to the carbon atoms that constitute the ring structure may each be substituted with a substituent. Examples of this substituent include an alkyl group, alkoxy group, halogen atom, halogenated alkyl group, hydroxyl group or oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting some or all of the hydrogen atoms of an aliphatic hydrocarbon group when X$^b$ is an aliphatic hydrocarbon group.

Among the various possibilities described above, X$^b$ is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L5), and (S3) and (S4) are preferable.

Further, $X^b$ is preferably a group containing a polar region, as such groups yield improved lithography properties and a superior resist pattern shape.

Examples of these groups containing a polar region include groups in which a portion of the carbon atoms that constitute the aliphatic cyclic group of an above-mentioned group $X^b$ have been substituted with a substituent containing a hetero atom, namely with a substituent such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— or —S(=O)$_2$—O.

Among the above possibilities, $R^{4\prime\prime\prime}$ is preferably a group having $X^b$-$Q^1$- as a substituent. In such cases, $R^{4\prime\prime\prime}$ is preferably a group represented by the formula $X^b$-$Q^1$—$Y^1$— (wherein $Q^1$ and $X^b$ are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula $X^b$-$Q^1$-$Y^1$—, examples of the alkylene group represented by $Y^1$ include those alkylene groups described above for $Q^1$ in which the number of carbon atoms is within a range from 1 to 4.

Examples of the fluorinated alkylene group for $Y^1$ include groups in which some or all of the hydrogen atoms of an above-mentioned alkylene group have each been substituted with fluorine atoms.

Specific examples of $Y^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may each be substituted, either with an atom other than a hydrogen atom or fluorine atom, or with a group.

Examples of substituents with which the alkylene group or fluorinated alkylene group may be substituted include alkyl groups of 1 to 4 carbon atoms, alkoxy groups of 1 to 4 carbon atoms, and a hydroxyl group.

In the above formula (b-2), each of $R^{5\prime\prime\prime}$ and $R^{6\prime\prime\prime}$ independently represents an aryl group which may have a substituent, an alkyl group or an alkenyl group.

Further, in terms of achieving better improvement in the lithography properties and the resist pattern shape, it is preferable that at least one of $R^{5\prime\prime\prime}$ and $R^{6\prime\prime\prime}$ is an aryl group, and more preferable that both of $R^{5\prime\prime\prime}$ and $R^{6\prime\prime\prime}$ are aryl groups.

Examples of the aryl group for $R^{5\prime\prime\prime}$ and $R^{6\prime\prime\prime}$ include the same aryl groups as those described for $R^{1\prime\prime\prime}$ to $R^{3\prime\prime\prime}$.

Examples of the alkyl group for $R^{5\prime\prime\prime}$ and $R^{6\prime\prime\prime}$ include the same alkyl groups as those described for $R^{1\prime\prime\prime}$ to $R^{3\prime\prime\prime}$.

Examples of the alkenyl group for $R^{5\prime\prime\prime}$ and $R^{6\prime\prime\prime}$ include the same alkenyl groups as those described for $R^{1\prime\prime\prime}$ to $R^{3\prime\prime\prime}$.

Among the various possibilities, the case in which $R^{5\prime\prime\prime}$ and $R^{6\prime\prime\prime}$ are both phenyl groups is the most desirable.

Specific examples of the cation moiety within compounds represented by formula (b-2) include diphenyliodonium and bis(4-tert-butylphenyl)iodonium.

Examples of $R^{4\prime\prime\prime}$ within the formula (b-2) include the same groups as those described above for $R^{4\prime\prime\prime}$ within formula (b-1).

Specific examples of the onium salt acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl) tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has either been replaced by an alkylsulfonate such as methanesulfonate, n-propanesulfonate, n-butanesulfonate, n-octanesulfonate, 1-adamantanesulfonate or 2-norbornanesulfonate, or been replaced by a sulfonate such as d-camphor-10-sulfonate, benzenesulfonate, perfluorobenzenesulfonate or p-toluenesulfonate.

Further, onium salts in which the anion moiety of these onium salts has been replaced by an anion moiety represented by any one of formulas (b1) to (b8) shown below can also be used.

[Chemical Formula 55]

(b1)

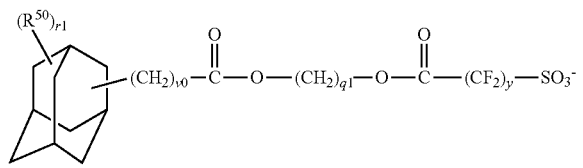

(b2)

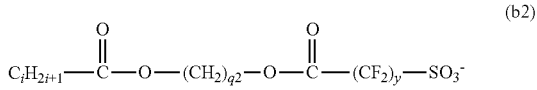

(b3)

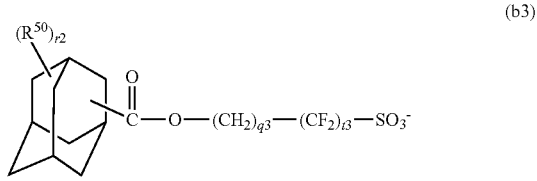

(b4)

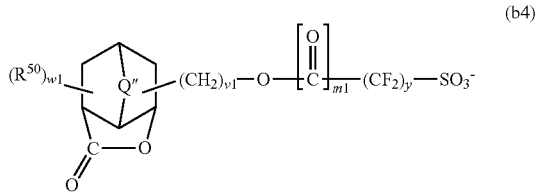

(b5)

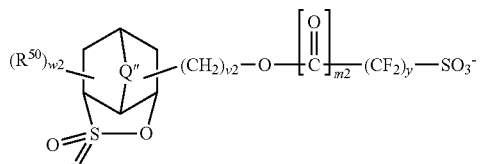

(b6)

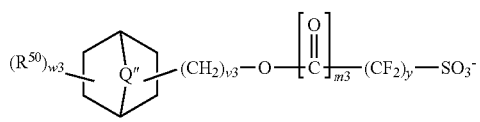

(b7)

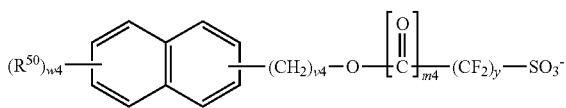

(b8)

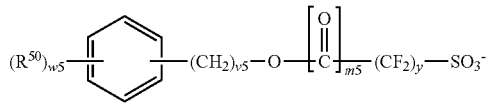

In the formulas, y represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q" is the same as defined above.

Examples of the substituent for $R^{50}$ include the same groups as those which the aforementioned aliphatic hydrocarbon group or aromatic hydrocarbon group for $X^b$ may have as a substituent.

If there are two or more $R^{50}$ groups, as indicated by the values r1, r2, and w1 to w5, then the plurality of $R^{50}$ groups within the compound may be the same or different from each other.

Further, onium salt acid generators in which the anion moiety ($R^{4"}SO_3^-$) in the above general formula (b-1) or (b-2) has been replaced with an anion moiety represented by general formula (b-3) or (b-4) shown below (but in which the cation moiety is the same as the cation shown in formula (b-1) or (b-2)) can also be used favorably as the onium salt acid generator.

[Chemical Formula 56]

(b-3)

(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group contains 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group contains 1 to 10 carbon atoms, preferably 1 to 7 carbon atoms, and more preferably 1 to 3 carbon atoms.

The smaller the number of carbon atoms in the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less and electron beams is improved.

The proportion of fluorine atoms within the alkylene group or alkyl group, namely the fluorination ratio, is preferably within a range from 70 to 100%, and more preferably from 90 to 100%. A perfluoroalkylene or perfluoroalkyl group in which all the hydrogen atoms are substituted with fluorine atoms is the most desirable.

As the onium salt acid generator, onium salts of the above general formula (b-1) or (b-2) in which the anion moiety ($R^{4"}SO_3^-$) has been substituted with $R^a$—COO⁻ (wherein $R^a$ represents an alkyl group or a fluorinated alkyl group) (and in which the cation moiety is the same as that of general formula (b-1) or (b-2)) may also be used.

Examples of $R^a$ in the above formula include the same groups as those listed above for $R^{4"}$.

Specific examples of $R^a$—COO⁻ include a trifluoroacetate ion, an acetate ion, and a 1-adamantanecarboxylate ion.

Furthermore, a sulfonium salt having a cation moiety represented by general formula (b-5) or (b-6) shown below may also be used as an onium salt acid generator.

[Chemical Formula 57]

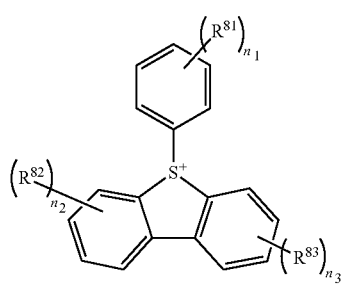

(b-5)

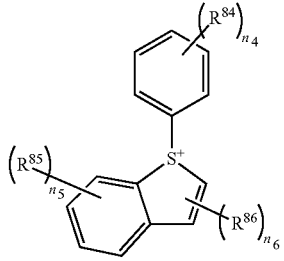

(b-6)

In the above formulas, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{81}$ to $R^{86}$ is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have each been substituted with a hydroxyl group, and examples thereof include a hydroxymethyl group, hydroxyethyl group and hydroxypropyl group.

If there are two or more of any of the $R^{81}$ to $R^{86}$ groups, as indicated by the values of $n_1$ to $n_6$, then the plurality of $R^{81}$ to $R^{86}$ groups within the compound may be the same or different from each other.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Examples of preferred cations represented by the above formula (b-5) or (b-6) include the cations shown below.

[Chemical Formula 58]

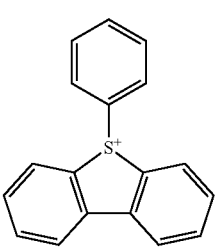

(b-5-1)

-continued

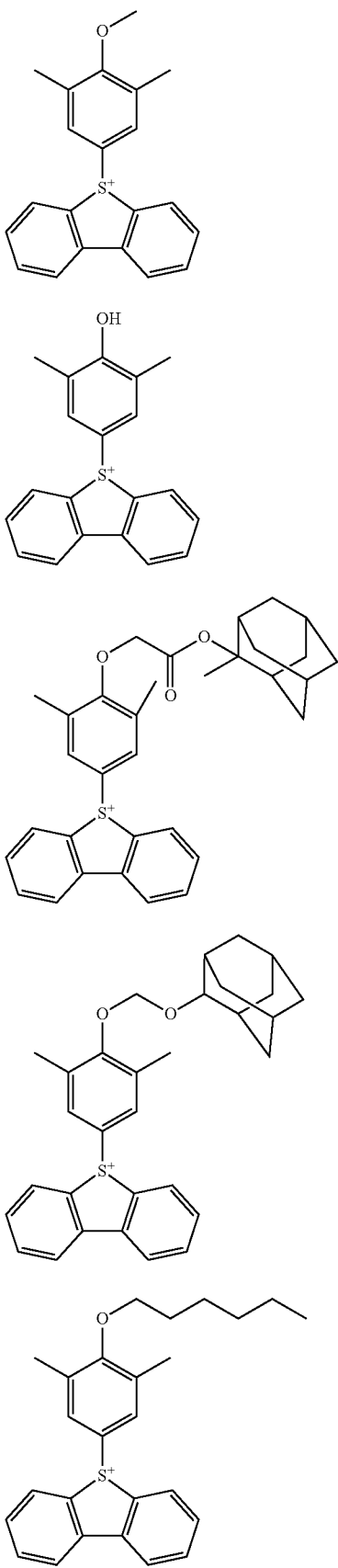

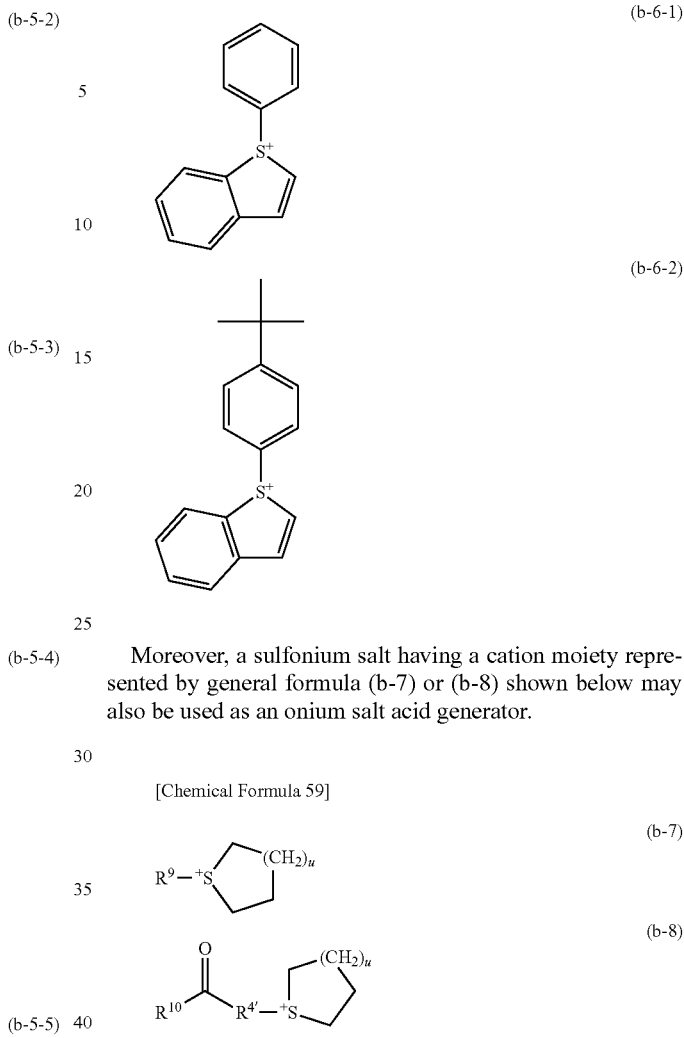

Moreover, a sulfonium salt having a cation moiety represented by general formula (b-7) or (b-8) shown below may also be used as an onium salt acid generator.

[Chemical Formula 59]

In formulas (b-7) and (b-8), each of $R^9$ and $R^{10}$ independently represents a phenyl group or naphthyl group which may have a substituent, an alkyl group of 1 to 5 carbon atoms, an alkoxy group or a hydroxyl group. Examples of the substituent include the same substituents as those described above for the substituted aryl groups mentioned within the description relating to the aryl groups of $R^{1'''}$ to $R^{3'''}$ (such as an alkyl group, alkoxy group, alkoxyalkyloxy group, alkoxycarbonylalkyloxy group, halogen atom, hydroxyl group, oxo group (=O), aryl group, —C—(=O)—O—$R^{6'}$, —O—C(=O)—$R^{7'}$, —O—$R^{8'}$, or a group represented by the above general formula —O—$R^{50}$—C(=O)—O—$R^{56}$ in which $R^{56}$ has been substituted with $R^{56'}$).

$R^{4'}$ represents an alkylene group of 1 to 5 carbon atoms.

u represents an integer of 1 to 3, and is most preferably 1 or 2.

Examples of preferred cations represented by formula (b-7) or (b-8) include the cations shown below. In the formula below, $R^C$ represents a substituent mentioned above within the description relating to the substituted aryl groups (namely, an alkyl group, alkoxy group, alkoxyalkyloxy group, alkoxycarbonylalkyloxy group, halogen atom, hydroxyl group, oxo group (=O), aryl group, —C—(=O)—O—$R^{6'}$ or —O—C(=O)—$R^{7'}$ or —O—$R^{8'}$).

[Chemical Formula 60]

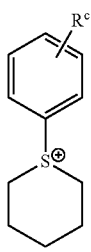 (b-7-1)

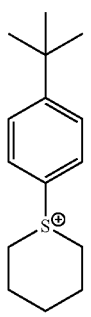 (b-7-2)

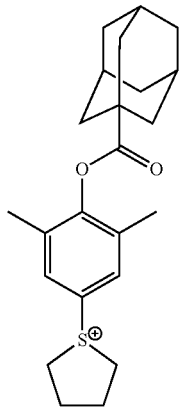 (b-7-3)

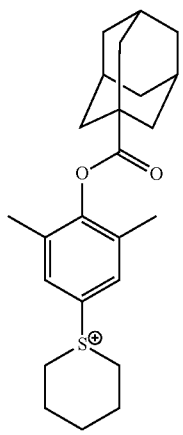 (b-7-4)

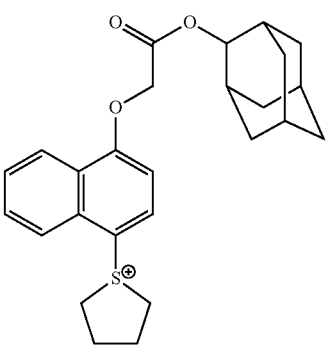 (b-7-5)

[Chemical Formula 61]

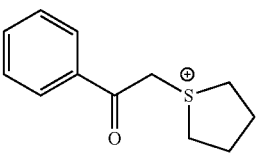 (b-8-1)

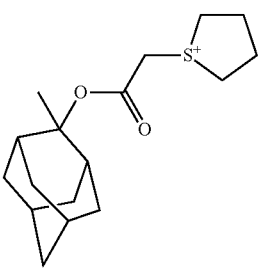 (b-8-2)

There are no particular limitations on the anion moiety of the sulfonium salt having a cation moiety represented by one of formulas (b-5) to (b-8), and the same anion moieties as those used within conventionally proposed onium salt acid generators may be used. Examples of such anion moieties include fluorinated alkylsulfonate ions such as the anion moieties ($R^{4"}SO_3^-$) of the onium salt acid generators represented by general formula (b-1) or (b-2) shown above, anion moieties represented by general formula (b-3) or (b-4) shown above, and anions represented by any of formulas (b1) to (b8) shown above.

In the present description, an oxime sulfonate acid generator is a compound having at least one group represented by general formula (B-1) shown below, and has a feature of generating acid upon irradiation (exposure). Such oxime sulfonate acid generators are widely used for chemically amplified resist compositions, and any of these known compounds may be selected as appropriate.

[Chemical Formula 62]

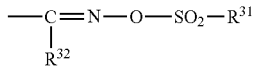 (B-1)

In formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

The organic group for $R^{31}$ is preferably a linear, branched or cyclic alkyl group, or an aryl group. The alkyl group or aryl group may have a substituent. There are no particular limitations on the substituent, and examples include a fluorine atom or a linear, branched or cyclic alkyl group having 1 to 6 carbon atoms. The expression that the alkyl group or aryl group "may have a substituent" means that some or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. A "partially halogenated alkyl group" refers to an alkyl group in which some of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which some of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As the organic group for $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 63]

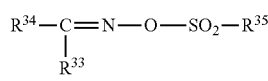

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 64]

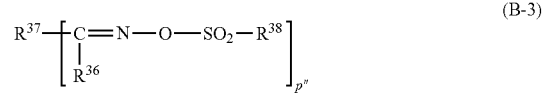

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group or phenanthryl group, and heteroaryl groups in which some of the carbon atoms that constitute the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group, a halogenated alkyl group or an alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group described above for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyl oxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 09-208554 (Chemical Formulas 18 and 19 shown in paragraphs [0012] to [0014]) and oxime sulfonate acid generators disclosed in WO 2004/074242 A2 pamphlet (Examples 1 to 40 described on pages 65 to 85) may also be used favorably.

Furthermore, the following compounds may also be used as preferred examples.

[Chemical Formula 65]

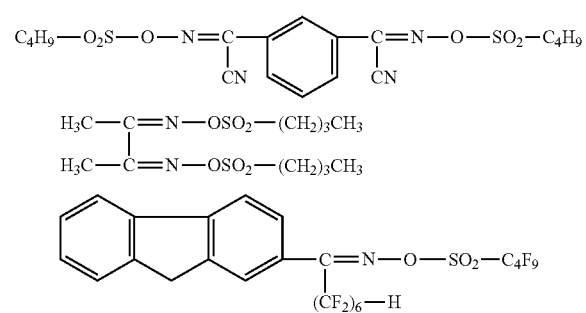

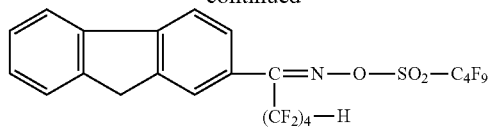

Of the above-mentioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types of acid generators may be used in combination.

The amount of the component (B) within the resist composition of the present invention is preferably within a range from 0.5 to 60 parts by weight, more preferably from 1 to 50 parts by weight, and still more preferably from 1 to 40 parts by weight, relative to 100 parts by weight of the component (A). When the amount of the component (B) is within the above-mentioned range, formation of a resist pattern can be performed satisfactorily. Further, a uniform solution can be obtained when each of the components of the resist composition are dissolved in an organic solvent, and the storage stability of the solution tends to improve.

<Optional Components>

The resist composition of the present invention may also include a nitrogen-containing organic compound (D) (hereinafter referred to as "component (D)") that does not correspond with the above components (A) and (B), provided inclusion of the component (D) does not impair the effects of the present invention.

There are no particular limitations on the component (D) provided it functions as an acid diffusion control agent, namely, a quencher which traps the acid generated from the component (B) upon exposure. A multitude of these components (D) have already been proposed, and any of these known compounds may be used.

Examples of these conventional compounds include amines such as aliphatic amines and aromatic amines, and of these, an aliphatic amine, and particularly a secondary aliphatic amine or tertiary aliphatic amine, is preferable.

An "aliphatic amine" is an amine having one or more aliphatic groups, wherein each of the aliphatic groups preferably contains 1 to 20 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), and cyclic amines.

The alkyl group and the alkyl group within the hydroxyalkyl group may be linear, branched or cyclic groups.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine and tri-n-dodecylamine.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, and tris[2-{2-(2-hydroxyethoxy)ethoxy}ethyl]amine.

Examples of the aromatic amines include aniline, pyridine, 4-dimethylaminopyridine, pyrrole, indole, pyrazole, imidazole and derivatives thereof, diphenylamine, triphenylamine and tribenzylamine.

These compounds may be used alone, or two or more different compounds may be used in combination.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

Furthermore, in the resist composition of the present invention, for the purposes of preventing any deterioration in sensitivity, and improving the resist pattern shape and the post exposure stability of the latent image formed by the pattern-wise exposure of the resist layer, at least one compound (E) (hereinafter referred to as "component (E)") selected from the group consisting of organic carboxylic acids, and phosphorus oxo acids and derivatives thereof may also be added.

Examples of the organic carboxylic acids include acetic acid, malonic acid, citric acid, malic acid, succinic acid, benzoic acid and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenyl phosphonate, diphenyl phosphonate and dibenzyl phosphonate.

Examples of phosphinic acid derivatives include phosphinate esters and phenylphosphinic acid.

As the component (E), one compound may be used alone, or two or more different compounds may be used in combination.

The component (E) is typically used in an amount within a range from 0.01 to 5.0 parts by weight relative to 100 parts by weight of the component (A).

If desired, other miscible additives besides those described above may also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The resist composition of the present invention can be prepared by dissolving the materials for the resist composition in an organic solvent (hereinafter frequently referred to as "component (S)").

The component (S) may be any organic solvent which can dissolve each of the components used to give a uniform solution, and one or more types of organic solvent may be selected appropriately from those solvents that have been conventionally known as solvents for a chemically amplified resists.

Examples include lactones such as γ-butyrolactone, ketones such as acetone, methyl ethyl ketone, cyclohexanone, methyl-n-pentyl ketone, methyl isopentyl ketone and 2-heptanone, polyhydric alcohols, such as ethylene glycol, diethylene glycol, propylene glycol and dipropylene glycol, polyhydric alcohol derivatives, including compounds having an ester bond such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of these polyhydric alcohols or compounds having an ester bond [among these derivatives, propylene glycol monomethyl ether acetate (PGMEA) and propylene glycol monomethyl ether (PGME) are preferred], cyclic ethers such as dioxane, esters such as methyl lactate, ethyl lactate (EL), methyl acetate, ethyl acetate, butyl acetate, methyl pyruvate, ethyl pyruvate, methyl methoxypropionate and ethyl ethoxypropionate, and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or within a mixed solvent containing two or more solvents.

Among the above solvents, propylene glycol monomethyl ether acetate (PGMEA), propylene glycol monomethyl ether (PGME), cyclohexanone and ethyl lactate (EL) are preferred.

Further, among the mixed solvents, a mixed solvent obtained by mixing PGMEA with a polar solvent is preferable. The mixing ratio (weight ratio) of the mixed solvent may be determined as appropriate, with due consideration of the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed in combination as the polar solvent, the PGMEA:(PGME+cyclohexanone) weight ratio is preferably from 1:9 to 9:1, more preferably from 2:8 to 8:2, and still more preferably from 3:7 to 7:3.

Further, as the component (S), a mixed solvent of at least one of PGMEA, EL and an above-mentioned mixed solvent containing PGMEA with γ-butyrolactone is also preferable. The mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

The resist composition of the present invention described above enables the formation of a resist pattern having good shape and excellent lithography properties such as exposure latitude (EL) and line width roughness (LWR).

The reasons that these effects are not entirely clear, but because the component (A1) is a polymeric compound, the structural unit (a5), which constitutes part of the component (A1) and has a structure represented by —W—OC(=O)—NR$^a$R$^b$ as a side chain, is able to be dispersed uniformly throughout the resist film with comparative ease. As a result, during resist pattern formation, the quenching effect that traps the acid generated from the component (B) upon exposure is able to be obtained more evenly throughout the entire resist film. Consequently, it is thought any changes in the solubility within the developing solution of the component (A) in the unexposed portions can be suppressed. Moreover, because a high polarity region (—O(C=O)—NR$^a$R$^b$) exists within the structural unit (a5), the exposed portions of the resist film exhibit superior resistance to the developing solution (organic solvent). It is though that these reasons yield the effects described above.

<<Method of Forming Resist Pattern>>

The method of forming a resist pattern according to the present invention includes: forming a resist film on a substrate using the resist composition of the present invention described above, conducting exposure of the resist film, and developing the resist film to form a resist pattern The method of forming a resist pattern according to the present invention can be performed, for example, as follows.

Firstly, the resist composition of the present invention is applied onto a substrate using a spinner or the like, and a bake (post applied bake (PAB)) treatment is conducted under temperature conditions of 80 to 150° C. for 40 to 120 seconds, and preferably 60 to 90 seconds, to form a resist film.

Subsequently, the resist film is selectively exposed, either by exposure through a mask having a predetermined pattern formed therein (namely, a mask pattern) using an exposure apparatus such as an ArF exposure apparatus, an electron beam lithography apparatus or an EUV exposure apparatus, or by patterning via direct irradiation with an electron beam without using a mask pattern, and another bake (post exposure bake (PEB)) treatment is then conducted under temperature conditions of 80 to 150° C. for 40 to 120 seconds, and preferably 60 to 90 seconds.

The resist film is then subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment and/or rinse treatment may be removed using a supercritical fluid.

Drying is performed following the developing treatment or rinsing treatment. Further, in some cases, a bake treatment (post bake) may be performed following the developing treatment or rinsing treatment. In this manner, a resist pattern can be obtained.

There are no particular limitations on the substrate, and a conventionally known substrate may be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) or an organic film such as the lower organic film in a multilayer resist method can be used.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

There are no particular limitations on the wavelength used for exposure, and the exposure can be conducted using radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective for use with a KrF excimer laser, ArF excimer laser, EB or EUV.

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film that is to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon solvents.

Conventional additives may be added to the organic developing solution as required. Examples of these additives include surfactants. There are no particular limitations on the surfactants, and ionic and nonionic fluorine-based surfactants and/or silicon-based surfactants may be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinsing treatment performed following a solvent developing process include those organic solvents among the solvents described above for the organic solvent of the organic developing solution which exhibit poor dissolution of the resist pattern. Examples of typical solvents that may be used include one or more solvents selected from among hydrocarbon solvents, ketone-based solvents, ester-based solvents, alcohol-based solvents, amide-based solvents and ether-based solvents. Among these, at least one solvent selected from among hydrocarbon solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

EXAMPLES

A more detailed description of the present invention is presented below based on a series of examples, although the present invention is in no way limited by these examples.

In the examples, a compound represented by a chemical formula (1) is designated as "compound (1)", and the same labeling system applies for compounds represented by other formulas.

In the NMR analyses, tetramethylsilane (TMS) was used as an internal standard for the $^1$H-NMR and $^{13}$C-NMR measurements, and hexafluorobenzene was used as an internal stan-

Monomer Synthesis Example 1

Synthesis of Compound (2)

A compound (2) used in the polymer synthesis example described below was synthesized using the procedure described below.

A 500 mL three-necked flask was charged, under a nitrogen atmosphere, with 300 mL of a THF solution containing 20 g (105.14 mmol) of an alcohol (2), 30.23 g (157.71 mmol) of ethyldiisopropylaminocarbodiimide hydrochloride (EDCI) and 0.6 g (5 mmol) of dimethylaminopyridine (DMAP). With the flask cooled in an ice bath (0° C.), 16.67 g (115.66 mmol) of a precursor (2) was added to the flask, and the resulting mixture was then stirred at room temperature for 12 hours.

After conducting thin-layer chromatography (TLC) to confirm that the raw materials had been consumed, 50 ml of water was added to stop the reaction. Subsequently, the reaction solvent was concentrated under reduced pressure, and extraction of the reaction product into ethyl acetate was performed three times. The thus obtained organic phase was washed sequentially with water, a saturated solution of sodium hydrogen carbonate and 1N—HClaq. The solvent was then removed by distillation under reduced pressure, and the resulting product was dried, yielding the compound (2).

The results of NMR analysis of the obtained compound (2) were as follows.

$^1$H-NMR (CDCl$_3$, 400 MHz): δ (ppm)=6.22 (s, 1H, H$^a$), 5.70 (s, 1H, H$^b$), 4.71 to 4.85 (m, 2H, H$^{c,d}$), 4.67 (s, 2H, H$^k$), 3.40 to 3.60 (m, 2H, H$^{e,f}$), 2.58 to 2.70 (m, 1H, H$^g$), 2.11 to 2.21 (m, 2H, H$^h$), 2.00 (s, 3H, H$^i$), 1.76 to 2.09 (m, 2H, H$^j$).

[Chemical Formula 66]

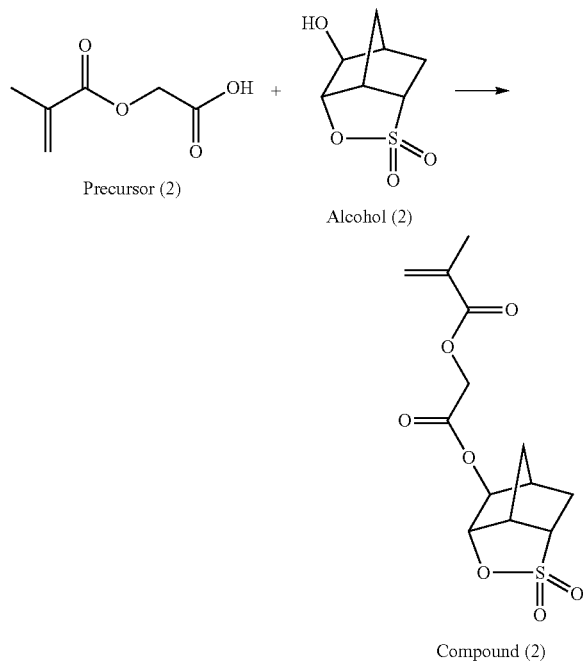

Polymer Synthesis Example 1

Synthesis of Polymeric Compound 1

In a separable flask fitted with a thermometer, a reflux tube and a nitrogen inlet tube, 15.02 g (88.15 mmol) of a compound (1), 16.07 g (50.80 mmol) of the compound (2), 22.36 g (85.16 mmol) of a compound (3), 7.05 g (41.84 mmol) of a compound (4), and 9.18 g (32.87 mmol) of a compound (5) were dissolved in 89.49 g of methyl ethyl ketone (MEK) to obtain a solution. Subsequently, 14.94 mmol of dimethyl azobisisobutyrate (V-601) was added to, and dissolved in, the solution as a polymerization initiator.

The resulting solution was added dropwise, over a period of four hours and under a nitrogen atmosphere, to 48.60 g of MEK that was heated to 80° C. Following completion of the dropwise addition, the reaction solution was heated for one hour under stirring, and was then cooled to room temperature.

The thus obtained reaction polymerization solution was added dropwise to a large amount of n-heptane to precipitate the polymer, and the precipitated white powder was separated by filtration, washed with methanol, and subsequently dried, yielding 41.18 g of a polymeric compound 1 as the target compound.

For this polymeric compound 1, the weight-average molecular weight (Mw) determined by GPC measurement and referenced against standard polystyrenes was 8,300, and the molecular weight dispersity (Mw/Mn) was 1.78.

Further, analysis of the polymeric compound 1 by carbon-13 nuclear magnetic resonance spectroscopy (600 MHz, $^{13}$C-NMR) revealed that the compositional ratio of the copolymer (namely, the ratio (molar ratio) of each of the structural units within the structural formula) was l/m/n/o/p=33.4/20.1/18.8/14.8/12.9.

[Chemical Formula 67]

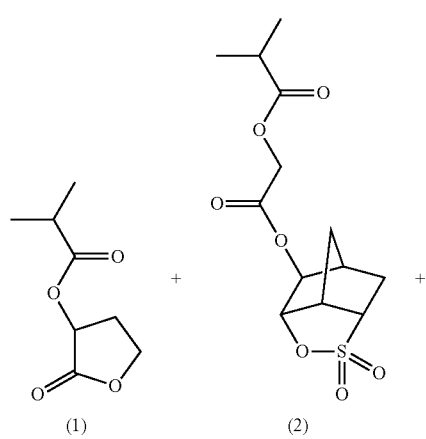

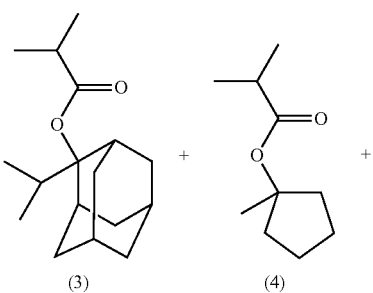

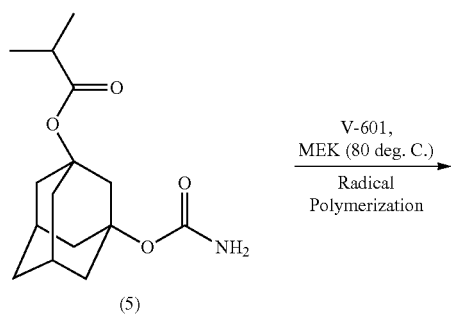

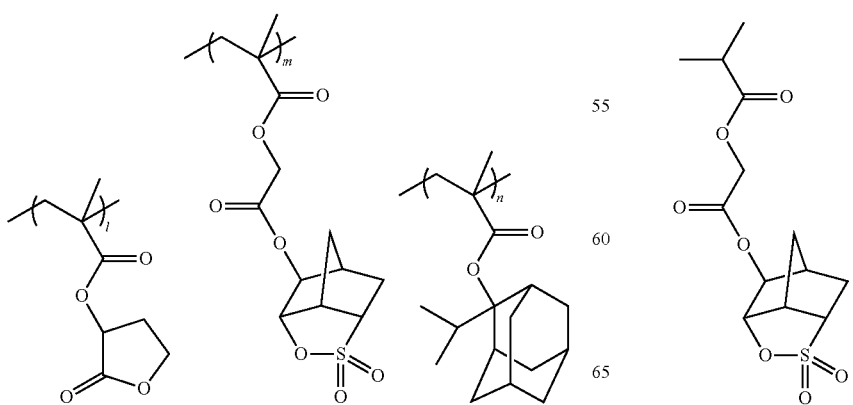

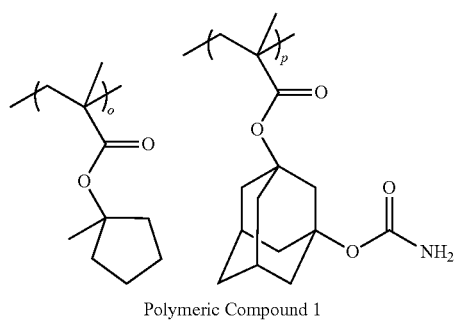

Polymeric Compound 1

Polymer Synthesis Examples 2 to 24

Synthesis of Polymeric Compounds 2 to 24

Polymeric compounds 2 to 24 were synthesized using the same method as that described in the polymer synthesis example 1, with the exception of using a predetermined molar ratio of the compounds (1) to (13) shown below that yield the different structural units that constitute each of the polymeric compounds.

For each polymeric compound, the compounds that yield each of the structural units, the copolymer compositional ratio determined by carbon-13 nuclear magnetic resonance spectroscopy (600 MHz, $^{13}$C-NMR), the polystyrene-equivalent weight-average molecular weight determined by GPC measurement, and the value of the molecular weight dispersity (Mw/Mn) are shown below in Tables 1 to 3.

[Chemical Formula 68]

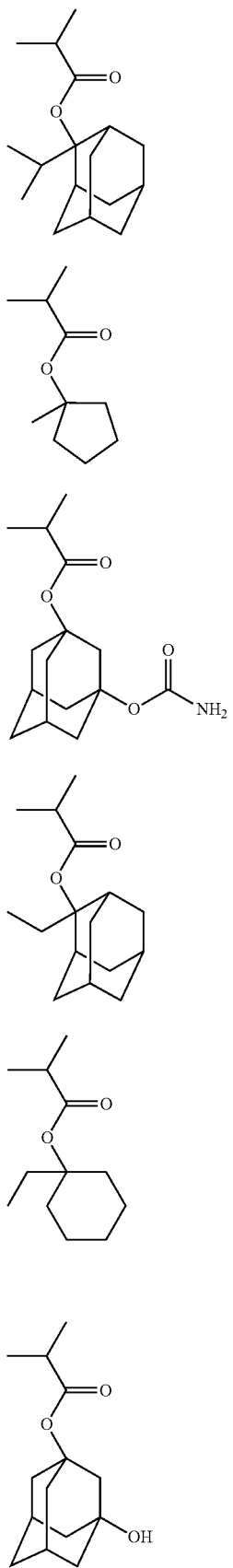
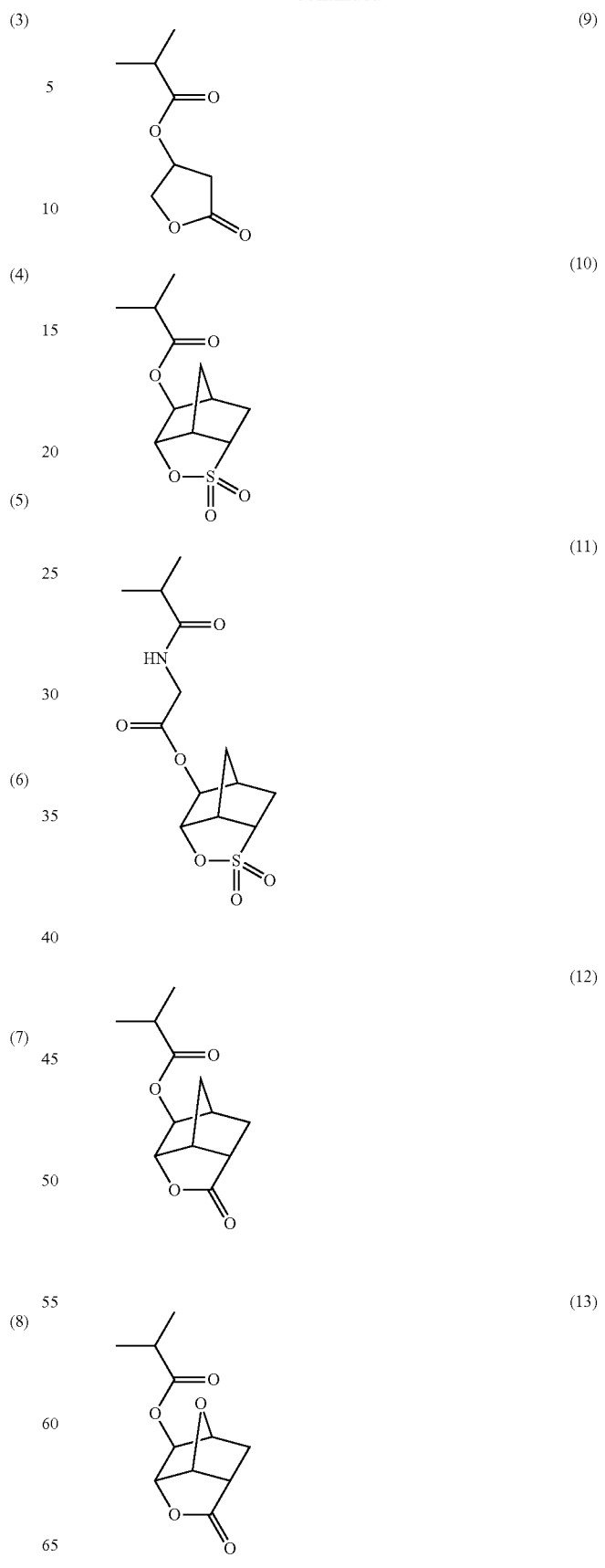

TABLE 1

| | Compounds that yield the structural units | Copolymer compositional ratio | Mw | Mw/Mn |
|---|---|---|---|---|
| Polymeric compound 1 | (1)/(2)/(3)/(4)/(5) | 33.4/20.1/18.8/14.8/12.9 | 8300 | 1.78 |
| Polymeric compound 2 | (2)/(3)/(6)/(5) | 46.0/37.2/5.8/11.0 | 8900 | 1.77 |
| Polymeric compound 3 | (1)/(7)/(5) | 39.9/40.3/19.8 | 9800 | 1.80 |
| Polymeric compound 4 | (1)/(2)/(3)/(4)/(8) | 34.7/21.7/16.3/14.8/12.5 | 7900 | 1.57 |
| Polymeric compound 5 | (2)/(3)/(6)/(8) | 44.5/38.8/6.3/10.4 | 8400 | 1.75 |
| Polymeric compound 6 | (1)/(7)/(8) | 40.5/38.4/21.1 | 10,000 | 1.71 |

TABLE 2

| | Compounds that yield the structural units | Copolymer compositional ratio | Mw | Mw/Mn |
|---|---|---|---|---|
| Polymeric compound 7 | (9)/(7)/(5) | 39/41/20 | 7100 | 1.67 |
| Polymeric compound 8 | (9)/(7)/(8) | 39/41/20 | 7500 | 1.67 |
| Polymeric compound 9 | (10)/(7)/(5) | 40/40/20 | 7200 | 1.67 |
| Polymeric compound 10 | (10)/(7)/(8) | 40/40/20 | 8700 | 1.67 |
| Polymeric compound 11 | (11)/(7)/(5) | 40/40/20 | 7000 | 1.67 |
| Polymeric compound 12 | (11)/(7)/(8) | 40/40/20 | 7100 | 1.67 |
| Polymeric compound 13 | (12)/(7)/(5) | 40/40/20 | 6700 | 1.64 |
| Polymeric compound 14 | (12)/(7)/(8) | 40/40/20 | 8000 | 1.61 |
| Polymeric compound 15 | (13)/(7)/(5) | 40/40/20 | 7400 | 1.62 |
| Polymeric compound 16 | (13)/(7)/(8) | 40/40/20 | 7700 | 1.66 |

TABLE 3

| | Compounds that yield the structural units | Copolymer compositional ratio | Mw | Mw/Mn |
|---|---|---|---|---|
| Polymeric compound 17 | (1)/(3)/(7)/(5) | 45/40/6/9 | 7400 | 1.68 |
| Polymeric compound 18 | (1)/(3)/(7)/(8) | 45/40/6/9 | 7200 | 1.60 |
| Polymeric compound 19 | (9)/(3)/(7)/(5) | 45/40/6/9 | 6600 | 1.68 |
| Polymeric compound 20 | (9)/(3)/(7)/(8) | 45/40/6/9 | 7800 | 1.65 |
| Polymeric compound 21 | (10)/(3)/(7)/(5) | 45/40/6/9 | 7400 | 1.69 |
| Polymeric compound 22 | (10)/(3)/(7)/(8) | 45/40/6/9 | 7300 | 1.62 |
| Polymeric compound 23 | (2)/(3)/(7)/(5) | 45/40/6/9 | 7300 | 1.66 |
| Polymeric compound 24 | (2)/(3)/(7)/(8) | 45/40/6/9 | 7700 | 1.61 |

Preparation of Resist Compositions

Examples 1 to 12, Comparative Examples 1 to 12

The components shown in Tables 4 and 5 were mixed together and dissolved to prepare a series of resist compositions.

TABLE 4

| | Component (A) | Component (B) | | Component (D) | Component (E) | Component (S) |
|---|---|---|---|---|---|---|
| Example 1 | (A)-1 [100] | (B)-1 [8.81] | (B)-2 [3.11] | (D)-1 [0.38] | (E)-1 [0.47] | (S)-1 [2400] |
| Comparative Example 1 | (A)-2 [100] | (B)-1 [8.81] | (B)-2 [3.11] | (D)-1 [0.38] | (E)-1 [0.47] | (S)-1 [2400] |
| Example 2 | (A)-3 [100] | (B)-1 [8.81] | (B)-2 [3.11] | (D)-1 [0.38] | (E)-1 [0.47] | (S)-1 [2400] |
| Comparative Example 2 | (A)-4 [100] | (B)-1 [8.81] | (B)-2 [3.11] | (D)-1 [0.38] | (E)-1 [0.47] | (S)-1 [2400] |
| Example 3 | (A)-5 [100] | (B)-1 [8.81] | (B)-2 [3.11] | (D)-1 [0.38] | (E)-1 [0.47] | (S)-1 [2400] |
| Comparative Example 3 | (A)-6 [100] | (B)-1 [8.81] | (B)-2 [3.11] | (D)-1 [0.38] | (E)-1 [0.47] | (S)-1 [2400] |

TABLE 5

| | Component (A) | Component (B) | | Component (D) | Component (E) | Component (S) |
|---|---|---|---|---|---|---|
| Example 4 | (A)-7 [100] | (B)-1 [8.81] | (B)-2 [3.11] | (D)-1 [0.38] | (E)-1 [0.47] | (S)-1 [2400] |
| Comparative Example 4 | (A)-8 [100] | (B)-1 [8.81] | (B)-2 [3.11] | (D)-1 [0.38] | (E)-1 [0.47] | (S)-1 [2400] |
| Example 5 | (A)-9 [100] | (B)-1 [8.81] | (B)-2 [3.11] | (D)-1 [0.38] | (E)-1 [0.47] | (S)-1 [2400] |
| Comparative Example 5 | (A)-10 [100] | (B)-1 [8.81] | (B)-2 [3.11] | (D)-1 [0.38] | (E)-1 [0.47] | (S)-1 [2400] |
| Example 6 | (A)-11 [100] | (B)-1 [8.81] | (B)-2 [3.11] | (D)-1 [0.38] | (E)-1 [0.47] | (S)-1 [2400] |
| Comparative Example 6 | (A)-12 [100] | (B)-1 [8.81] | (B)-2 [3.11] | (D)-1 [0.38] | (E)-1 [0.47] | (S)-1 [2400] |
| Example 7 | (A)-13 [100] | (B)-1 [8.81] | (B)-2 [3.11] | (D)-1 [0.38] | (E)-1 [0.47] | (S)-1 [2400] |
| Comparative Example 7 | (A)-14 [100] | (B)-1 [8.81] | (B)-2 [3.11] | (D)-1 [0.38] | (E)-1 [0.47] | (S)-1 [2400] |
| Example 8 | (A)-15 [100] | (B)-1 [8.81] | (B)-2 [3.11] | (D)-1 [0.38] | (E)-1 [0.47] | (S)-1 [2400] |
| Comparative Example 8 | (A)-16 [100] | (B)-1 [8.81] | (B)-2 [3.11] | (D)-1 [0.38] | (E)-1 [0.47] | (S)-1 [2400] |
| Example 9 | (A)-17 [100] | (B)-1 [8.81] | (B)-2 [3.11] | (D)-1 [0.38] | (E)-1 [0.47] | (S)-1 [2400] |
| Comparative Example 9 | (A)-18 [100] | (B)-1 [8.81] | (B)-2 [3.11] | (D)-1 [0.38] | (E)-1 [0.47] | (S)-1 [2400] |
| Example 10 | (A)-19 [100] | (B)-1 [8.81] | (B)-2 [3.11] | (D)-1 [0.38] | (E)-1 [0.47] | (S)-1 [2400] |
| Comparative Example 10 | (A)-20 [100] | (B)-1 [8.81] | (B)-2 [3.11] | (D)-1 [0.38] | (E)-1 [0.47] | (S)-1 [2400] |
| Example 11 | (A)-21 [100] | (B)-1 [8.81] | (B)-2 [3.11] | (D)-1 [0.38] | (E)-1 [0.47] | (S)-1 [2400] |
| Comparative Example 11 | (A)-22 [100] | (B)-1 [8.81] | (B)-2 [3.11] | (D)-1 [0.38] | (E)-1 [0.47] | (S)-1 [2400] |

TABLE 5-continued

|  | Compo-nent (A) | Compo-nent (B) |  | Compo-nent (D) | Compo-nent (E) | Compo-nent (S) |
|---|---|---|---|---|---|---|
| Example 12 | (A)-23 [100] | (B)-1 [8.81] | (B)-2 [3.11] | (D)-1 [0.38] | (E)-1 [0.47] | (S)-1 [2400] |
| Comparative Example 12 | (A)-24 [100] | (B)-1 [8.81] | (B)-2 [3.11] | (D)-1 [0.38] | (E)-1 [0.47] | (S)-1 [2400] |

In Tables 4 and 5, the numerical values in brackets [ ] indicate the amount (in terms of parts by weight) of the component added. Further, the reference characters in Table 4 and 5 indicate the following.

(A)-1: the aforementioned polymeric compound 1
(A)-2: the aforementioned polymeric compound 4
(A)-3: the aforementioned polymeric compound 2
(A)-4: the aforementioned polymeric compound 5
(A)-5: the aforementioned polymeric compound 3
(A)-6: the aforementioned polymeric compound 6
(A)-7 to (A)-24: the aforementioned polymeric compounds 7 to 24 respectively
(B)-1: a compound represented by chemical formula (B)-1 shown below
(B)-2: a compound represented by chemical formula (B)-2 shown below

[Chemical Formula 69]

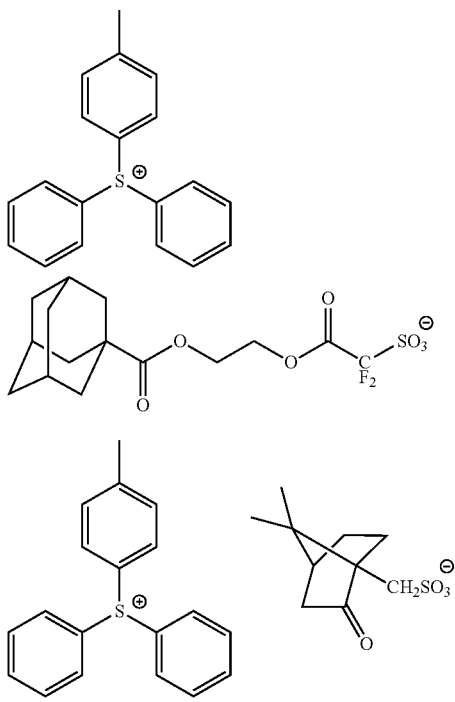

(B)-1

(B)-2

(D)-1: tri-n-pentylamine
(E)-1: salicylic acid
(S)-1: a mixed solvent of PGMEA/PGME (60/40 weight ratio)

<Formation of Resist Pattern>

An organic antireflection film composition ARC29 (a product name, manufactured by Brewer Science Ltd.) was applied onto an 8-inch silicon wafer using a spinner, and the composition was then baked and dried on a hotplate at 205° C. for 60 seconds, thereby forming an organic antireflection film having a film thickness of 77 nm.

Each of the resist compositions prepared above was applied onto a thus formed antireflection film using a spinner, and was then subjected to a prebake (PAB) treatment and dried on a hotplate at a PAB temperature indicated in Table 6 or 7 for 60 seconds, thereby forming a resist film having a film thickness of 120 nm.

Subsequently, using an ArF exposure apparatus NSR-5302 (manufactured by Nikon Corporation, NA (numerical aperture)=0.60, 2/3 annular illumination), the resist film was selectively irradiated with an ArF excimer laser (193 nm) through a mask pattern (6% halftone mask).

Next, a post exposure bake (PEB) treatment was conducted at a PEB temperature indicated in Table 6 or 7 for 60 seconds, followed by alkali development for 30 seconds at 23° C. in a 2.38% by weight aqueous solution of tetramethylammonium hydroxide (TMAH) (product name: NMD-3, manufactured by Tokyo Ohka Kogyo Co., Ltd.). The resist film was then rinsed for 30 seconds with pure water, and subjected to an additional bake treatment (postbake) at 100° C. for 60 seconds.

As a result, in each of the examples, a 1:1 line and space (L/S) pattern having a line width of 130 nm and a pitch of 260 nm was formed in the resist film. For examples 1 to 3 and comparative examples 1 to 3, the optimum exposure dose Eop (mJ/cm$^2$) was also determined. The results are shown in Table 6.

[Evaluation of Exposure Latitude (EL)]

At the above-mentioned Eop, the exposure dose range for which an L/S pattern was formed with a line width within a range specified by: [targeted dimension (line width of 130 nm)±5%] (namely, within a range from 123.5 nm to 136.5 nm) was determined, and the EL (unit: %) was determined using the formula shown below. The results are shown in Tables 6 and 7.

$$EL(\%) = (|E1 - E2|/Eop) \times 100$$

E1 represents the exposure dose (mJ/cm$^2$) for forming an L/S pattern with a line width of 123.5 nm.
E2 represents the exposure dose (mJ/cm$^2$) for forming an L/S pattern with a line width of 136.5 nm.

The larger the value for EL, the smaller the variation in the pattern size caused by fluctuation in the exposure dose.

[Evaluation of Line Width Roughness (LWR)]

For each of the 1:1 L/S patterns having a line width of 130 nm and a pitch of 260 nm formed at the above-mentioned Eop value, the space width was measured at five locations along the lengthwise direction of the space using a measuring scanning electron microscope (SEM) (accelerating voltage: 800 V, product name: S-9220, manufactured by Hitachi, Ltd.), and from these results, the value of 3 times the standard deviation (s) (namely, 3 s) was calculated as an indicator of the LWR. The results are shown in Tables 6 and 7.

The smaller this value of 3 s, the lower the level of roughness in the line width, indicating an L/S pattern of more uniform width.

TABLE 6

|  | PAB (° C.) | PEB (° C.) | Eop (mJ/cm$^2$) | EL (%) | LWR (nm) |
|---|---|---|---|---|---|
| Example 1 | 105 | 95 | 28.63 | 9.59 | 7.58 |
| Comparative example 1 | 105 | 95 | 22.19 | 8.69 | 9.04 |
| Example 2 | 90 | 80 | 33.09 | 8.71 | 8.37 |
| Comparative example 2 | 90 | 80 | 26.44 | 7.80 | 10.09 |

TABLE 6-continued

|  | PAB (° C.) | PEB (° C.) | Eop (mJ/cm²) | EL (%) | LWR (nm) |
|---|---|---|---|---|---|
| Example 3 | 110 | 95 | 48.85 | 8.10 | 7.33 |
| Comparative example 3 | 110 | 95 | 41.81 | 6.55 | 8.50 |

TABLE 7

|  | PAB (° C.) | PEB (° C.) | EL (%) | LWR (nm) |
|---|---|---|---|---|
| Example 4 | 105 | 95 | 9.12 | 7.26 |
| Comparative example 4 | 105 | 95 | 8.00 | 9.04 |
| Example 5 | 110 | 95 | 9.10 | 7.74 |
| Comparative example 5 | 110 | 95 | 7.88 | 9.01 |
| Example 6 | 110 | 95 | 9.13 | 7.22 |
| Comparative example 6 | 110 | 95 | 8.02 | 9.03 |
| Example 7 | 110 | 95 | 9.11 | 7.21 |
| Comparative example 7 | 110 | 95 | 7.95 | 9.21 |
| Example 8 | 110 | 95 | 9.11 | 7.21 |
| Comparative example 8 | 110 | 95 | 8.02 | 9.25 |
| Example 9 | 110 | 95 | 9.32 | 7.34 |
| Comparative example 9 | 110 | 95 | 8.20 | 7.45 |
| Example 10 | 110 | 95 | 9.23 | 7.42 |
| Comparative example 10 | 110 | 95 | 8.24 | 9.02 |
| Example 11 | 110 | 95 | 9.45 | 7.43 |
| Comparative example 11 | 110 | 95 | 8.36 | 8.73 |
| Example 12 | 110 | 95 | 9.56 | 7.35 |
| Comparative example 12 | 110 | 95 | 8.33 | 8.63 |

Based on the results in Tables 6 and 7, it was confirmed that the resist compositions of examples 1 to 12 according to the present invention each exhibited a larger EL value and a smaller LWR value than the resist composition of the corresponding comparative example 1 to 12, meaning a resist pattern having excellent lithography properties and superior shape was able to be formed in each case.

<Formation of Resist Pattern, Evaluation of Residual Film>

Using a spin coater, each of the resist compositions prepared above was applied onto an 8-inch silicon wafer that had been treated with hexamethyldisilazane (HMDS) for 36 seconds at 90° C., and was then subjected to a prebake (PAB) treatment and dried on a hotplate at a PAB temperature indicated in Table 8 for 60 seconds, thereby forming a resist film having an initial film thickness shown in Table 8.

Subsequently, using an ArF exposure apparatus NSR-302A (manufactured by Nikon Corporation, NA (numerical aperture)=0.60/0.75, conventional illumination), the resist film was exposed with an ArF excimer laser (193 nm) (while the exposure dose was changed from 0 to 18 mJ/cm² in steps of 1 mJ/cm²).

Next, for each of the resist films exposed at each of the various exposure doses, a post exposure bake (PEB) treatment was conducted at a PEB temperature indicated in Table 8 for 60 seconds, and development was then performed for 16 seconds using butyl acetate as the developing solution. By subsequently spinning the resist film at high speed to completely remove any residual developing solution and dry the resist film, a negative image contrast in which the resist film undergoes curing in regions of high exposure was obtained for each resist composition.

The residual film ratio (%) following exposure at an exposure dose of 18 mJ/cm² and subsequent development was determined using a formula: [(thickness of the resist film following developing)/(thickness of the resist film upon formation (prior to developing))]×100. The results are shown in Table 8.

A higher residual film ratio indicates superior resistance to the developing solution (organic solvent), and means a resist pattern of high contrast can be more easily formed.

TABLE 8

|  |  |  | Resist film | | |
|---|---|---|---|---|---|
|  | PAB (° C.) | PEB (° C.) | Initial thickness (nm) | Residual film thickness (nm) | Residual film ratio (%) |
| Example 1 | 105 | 95 | 101.2 | 68.8 | 68.0 |
| Comparative example 1 | 105 | 95 | 98.2 | 61.2 | 62.3 |
| Example 2 | 90 | 80 | 102.1 | 72.4 | 70.9 |
| Comparative example 2 | 90 | 80 | 101.8 | 65.8 | 64.6 |
| Example 3 | 110 | 95 | 99.8 | 69.2 | 69.3 |
| Comparative example 3 | 110 | 95 | 99.6 | 63.3 | 63.6 |

Based on the results in Table 8, it was confirmed that the resist compositions of examples 1 to 3 according to the present invention each exhibited a higher residual film ratio than the resist composition of the corresponding comparative example 1 to 3.

It is thought that this effect is due to the existence of the high-polarity region represented by (—O(C=O)—NH₂) within the structural unit (a5), which means that, compared with the case of a resist composition that uses a polymeric compound having a structural unit containing an adamantanol structure, a resist composition that uses a polymeric compound having the structural unit (a5) exhibits greater resistance to the developing solution (organic solvent) within the exposed portions of the resist film.

What is claimed is:

1. A resist composition, comprising a base component (A) which exhibits changed solubility in a developing solution under action of acid, and an acid generator component (B) which generates acid upon exposure, wherein
the base component (A) comprises a polymeric compound (A1) having a structural unit (a5) represented by general formula (a5-1) shown below:

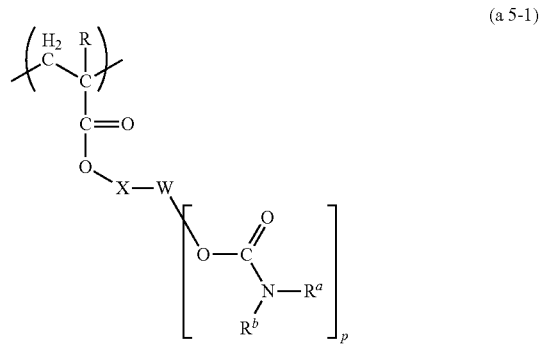

(a5-1)

wherein R represents a hydrogen atom, an alkyl group of 1 to 5 carbon atoms or a halogenated alkyl group of 1 to 5 carbon atoms, X represents a single bond or a divalent linking group, W represents a cyclic alkylene group which may include an oxygen atom at an arbitrary position, each of $R^a$ and $R^b$ independently represents a hydrogen atom, and p represents an integer of 1 to 3.

2. The resist composition according to claim 1, wherein the polymeric compound (A1) further comprises a structural unit (a1), which is derived from an acrylate ester in which a hydrogen atom bonded to a carbon atom on an α-position may be substituted with a substituent, and comprises an acid-degradable group that exhibits increased polarity under action of acid.

3. The resist composition according to claim 2, wherein the polymeric compound (A1) further comprises at least one structural unit selected from the group consisting of a structural unit (a0), which is derived from an acrylate ester in which a hydrogen atom bonded to a carbon atom on an α-position may be substituted with a substituent, and comprises an —SO$_2$-containing cyclic group, and a structural unit (a2), which is derived from an acrylate ester in which a hydrogen atom bonded to a carbon atom on an α-position may be substituted with a substituent, and comprises a lactone-containing cyclic group.

4. A method of forming a resist pattern, the method comprising: forming a resist film on a substrate using the resist composition according to any one of claims 1 to 3, conducting exposure of the resist film, and developing the resist film to form a resist pattern.

5. A resist composition according to claim 1, wherein the acid generator component (B) comprises an acid generator represented by general formula (b-1) shown below:

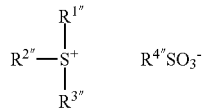

(b-1)

wherein each of $R^{1\prime\prime}$ to $R^{3\prime\prime}$ independently represents an aryl group which may have a substituent, an alkyl group or an alkenyl group, or alternatively, two of $R^{1\prime\prime}$ to $R^{3\prime\prime}$ may be bonded to each other to form a ring together with the sulfur atom in the formula, and $R^{4\prime\prime}$ represents a group represented by the formula $X^b$-$Q^1$-$Y^1$-, wherein $X^b$ represents a hydrocarbon group of 3 to 30 carbon atoms which may have a substituent, $Q^1$ represents a divalent linking group containing an oxygen atom, and $Y^1$ represents an alkylene group of 1 to 4 carbon atoms which may have a substituent, or a fluorinated alkylene group of 1 to 4 carbon atoms which may have a substituent.

6. A resist composition according to claim 2, wherein the polymeric compound (A1) further comprises the structural unit represented by general formula (a0-0) shown below:

(a0-0)

wherein R represents a hydrogen atom, an alkyl group of 1 to 5 carbon atoms or a halogenated alkyl group of 1 to 5 carbon atoms, $R^4$ represents —O— or —NH—, $R^3$ represents an —SO$_2$-containing cyclic group, and $R^{29\prime}$ represents a single bond or a divalent linking group.

* * * * *